US010679994B1

(12) United States Patent
Yang

(10) Patent No.: US 10,679,994 B1
(45) Date of Patent: Jun. 9, 2020

(54) CIRCUITS EMPLOYING ASYMMETRIC DIFFUSION BREAKS IN DIFFERENT TYPE SEMICONDUCTOR DIFFUSION REGIONS, AND RELATED FABRICATION METHODS

(71) Applicant: QUALCOMM Incorporated, San Diego, CA (US)

(72) Inventor: Haining Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/203,205

(22) Filed: Nov. 28, 2018

(51) Int. Cl.
| H01L 27/092 | (2006.01) |
| H01L 29/78 | (2006.01) |
| H01L 29/66 | (2006.01) |
| H01L 29/08 | (2006.01) |
| H01L 21/8238 | (2006.01) |
| H01L 29/06 | (2006.01) |

(52) U.S. Cl.
CPC .. *H01L 27/0924* (2013.01); *H01L 21/823821* (2013.01); *H01L 21/823878* (2013.01); *H01L 29/0649* (2013.01); *H01L 29/0696* (2013.01); *H01L 29/0847* (2013.01); *H01L 29/66545* (2013.01); *H01L 29/66772* (2013.01); *H01L 29/785* (2013.01); *H01L 2029/7858* (2013.01)

(58) Field of Classification Search
CPC ......... H01L 27/0924; H01L 21/823878; H01L 21/823821; H01L 29/0847; H01L 29/0649; H01L 29/0696; H01L 29/785; H01L 29/66772; H01L 29/66545
USPC ............... 257/368, 345, 365, 390, 401, 202, 257/E27.07, E27.112, E21.602; 438/128, 438/283, 598
See application file for complete search history.

(56) References Cited

U.S. PATENT DOCUMENTS

| 9,209,179 | B2 * | 12/2015 | Lee | ...................... H01L 27/0886 |
| 9,412,616 | B1 * | 8/2016 | Xie | .................... H01L 21/76224 |
| 9,887,210 | B2 * | 2/2018 | Song | .................. H01L 27/11807 |
| 10,128,243 | B2 * | 11/2018 | Yoo | ..................... H01L 27/0924 |

(Continued)

OTHER PUBLICATIONS

Marella, Sravan K. et al., "The Impact of Shallow Trench Isolation Effects on Circuit Performance," Proceedings of the International Conference on Computer-Aided Design, IEEE, Nov. 18, 2013, pp. 289-294.

*Primary Examiner* — Dao H Nguyen
(74) *Attorney, Agent, or Firm* — W&T/Qualcomm

(57) ABSTRACT

Circuits employing asymmetric diffusion breaks in different type semiconductor diffusion regions are disclosed. In examples herein, diffusion breaks having dimensions asymmetric to each other are provided in different types of diffusion regions in a circuit to increase carrier mobility in semiconductor channels of a semiconductor device formed in different diffusion regions. In examples herein, the circuit includes a P-type and N-type semiconductor device(s) formed in a P-type and an N-type diffusion region(s), respectively, formed in the substrate. Complementary metal oxide semiconductor (CMOS) circuits can be realized from the P-type and N-type semiconductor devices. Diffusion breaks can induce strain in the diffusion regions with a magnitude of the induced strain related to a dimension of the diffusion breaks. As one example, an induced tensile strain may increase carrier mobility in N-type devices and decrease carrier mobility in P-type devices, with induced compressive strain having the opposite effect.

29 Claims, 28 Drawing Sheets

(56) References Cited

U.S. PATENT DOCUMENTS

| | | | |
|---|---|---|---|
| 10,366,927 B2 * | 7/2019 | Lee | H01L 21/823418 |
| 2014/0264572 A1 * | 9/2014 | Kim | H01L 21/3083 257/331 |
| 2014/0264610 A1 * | 9/2014 | Yang | H01L 29/6681 257/368 |
| 2015/0054089 A1 * | 2/2015 | Hong | H01L 21/762 257/401 |

* cited by examiner

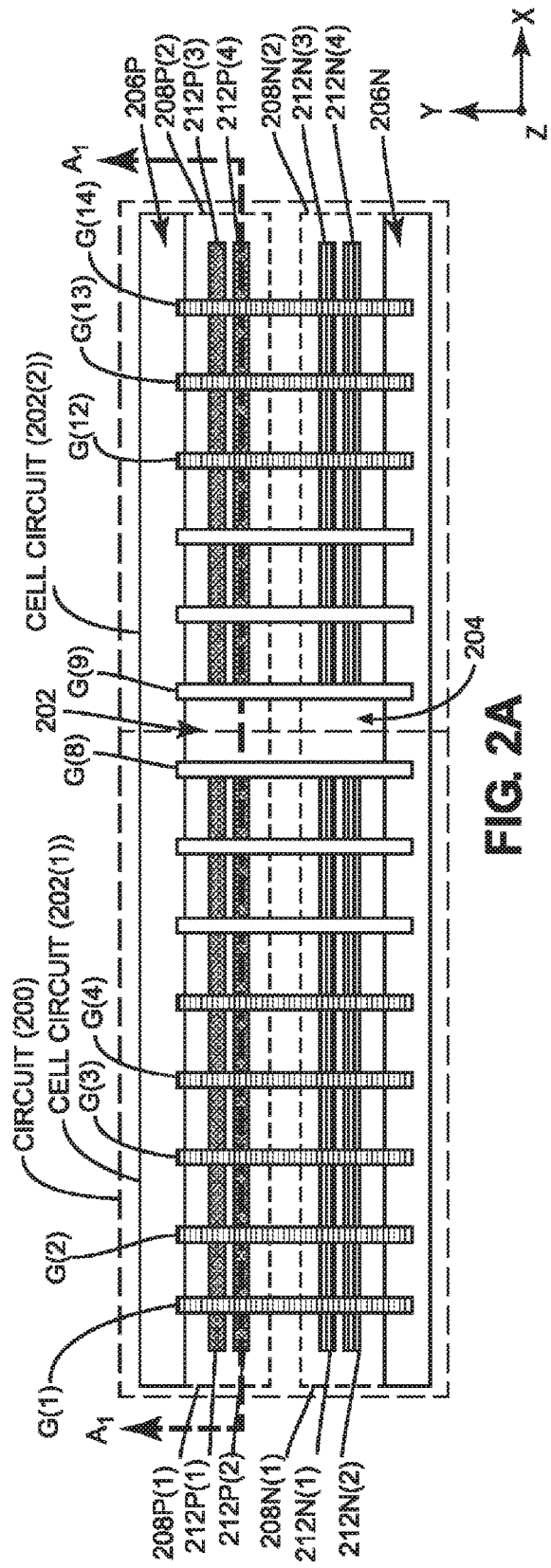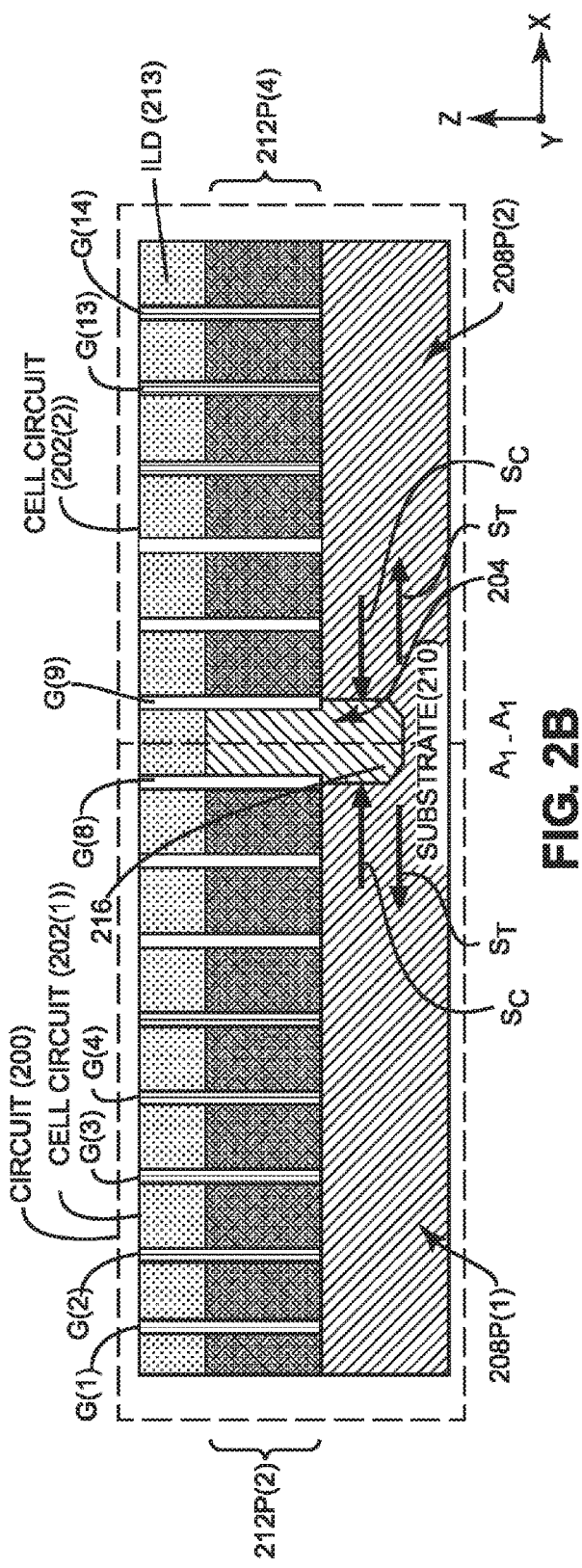
FIG. 2A
FIG. 2B

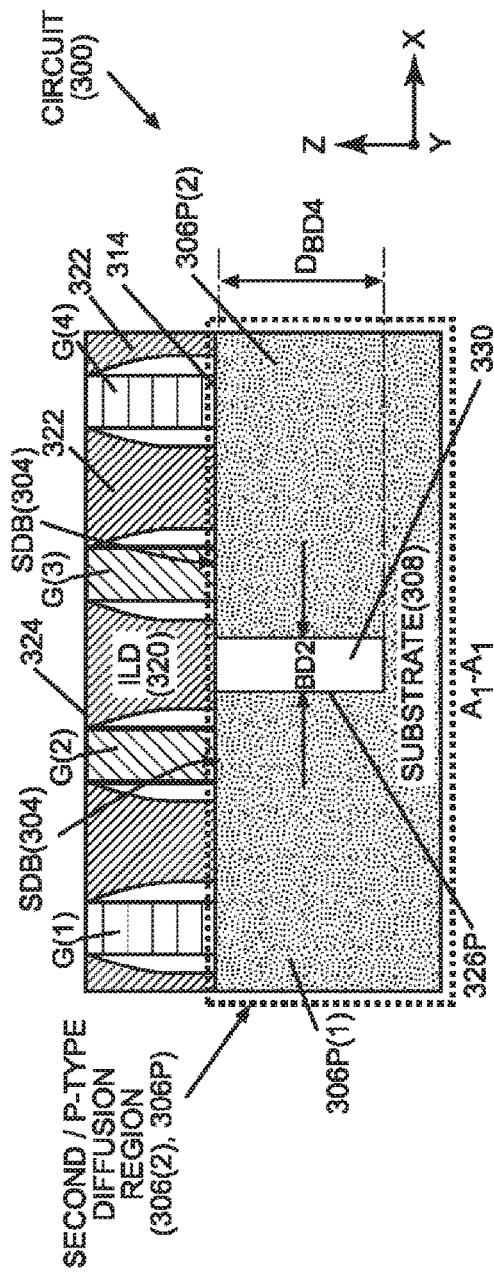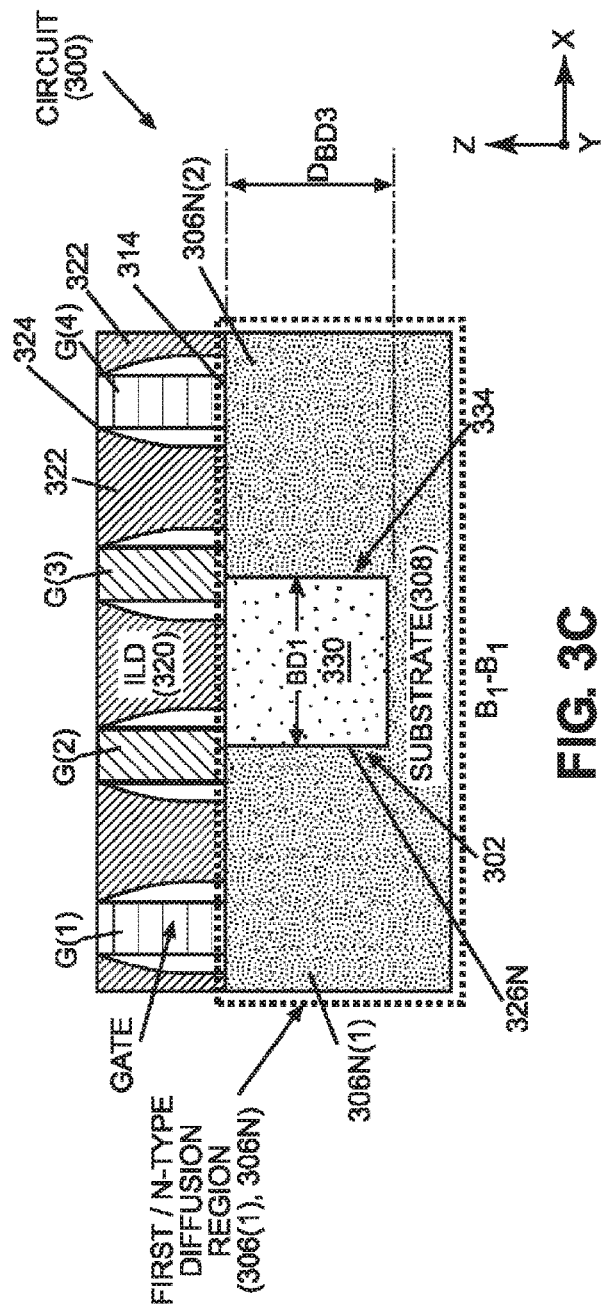

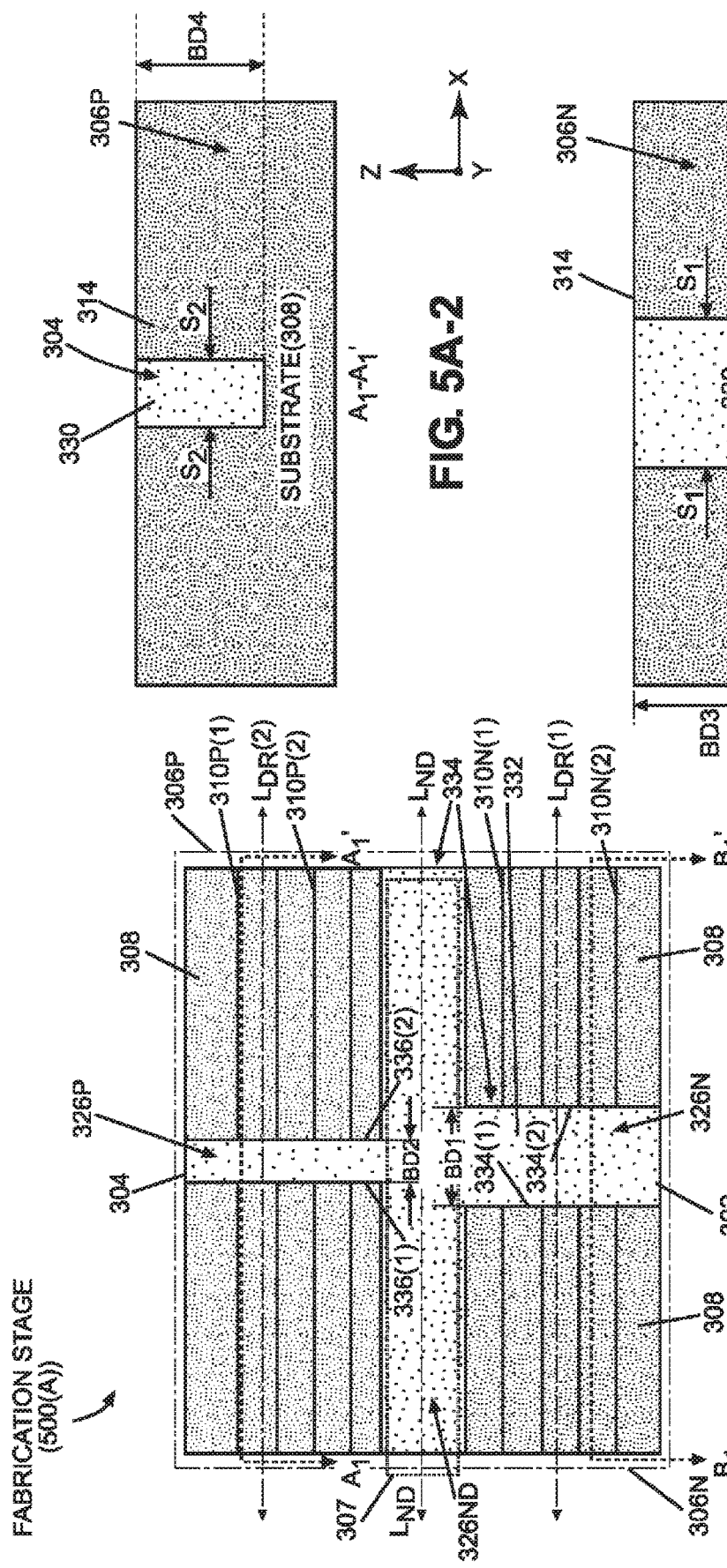

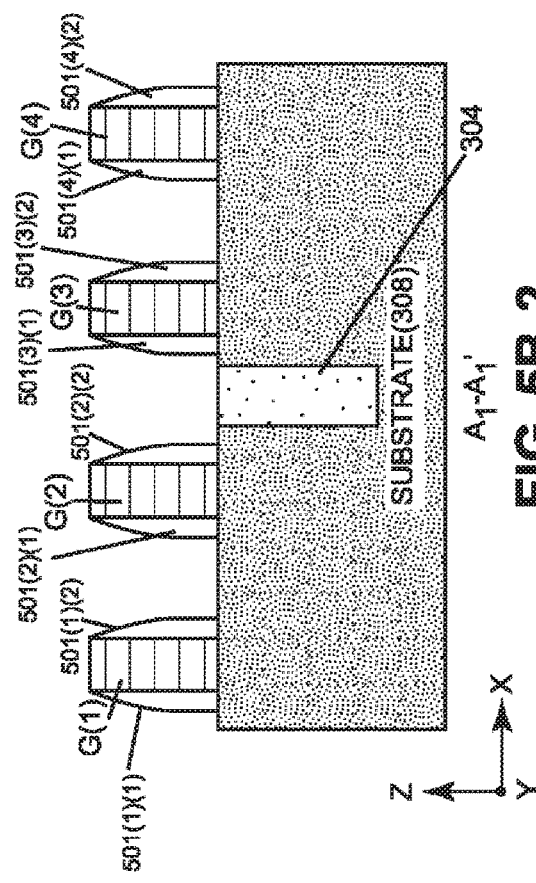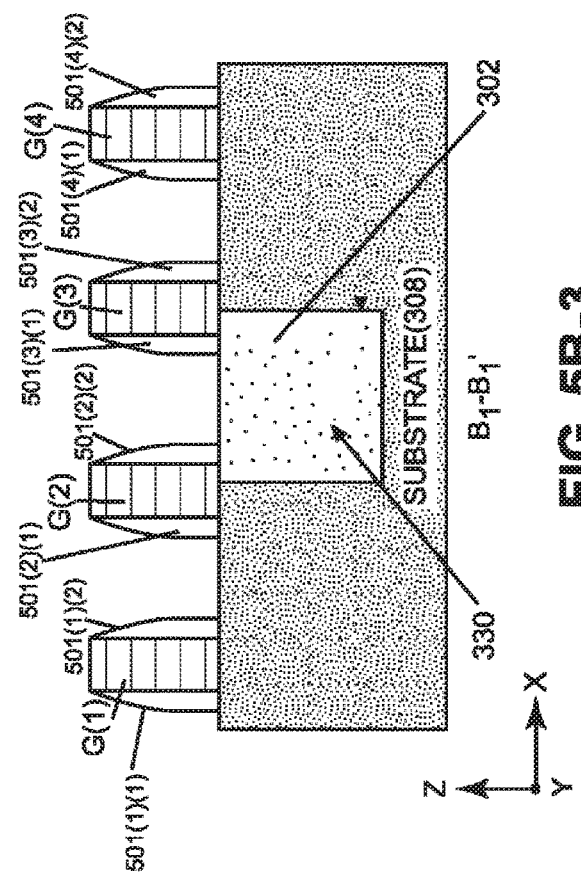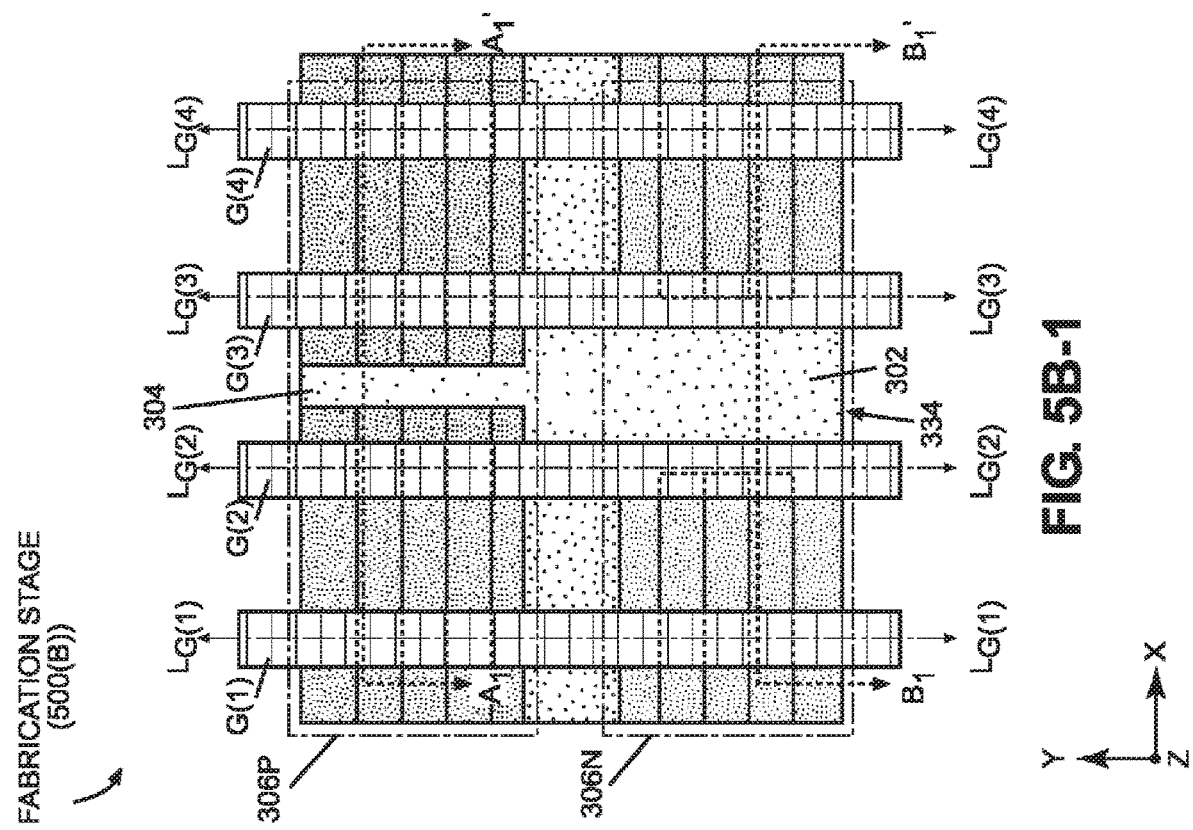

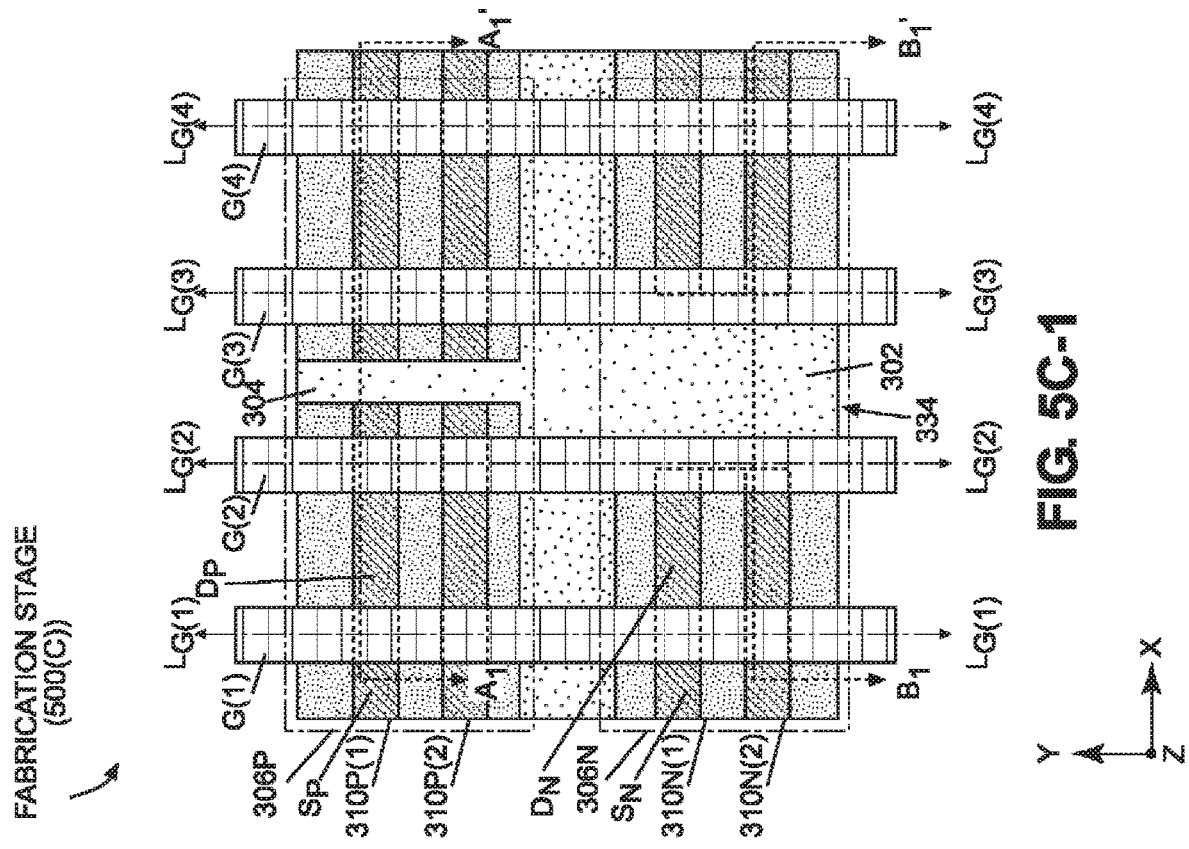
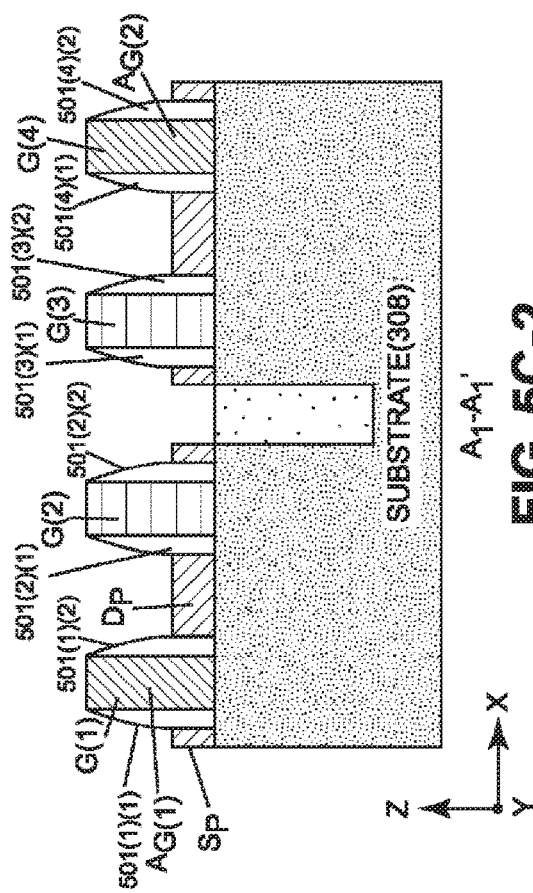
FIG. 5C-2
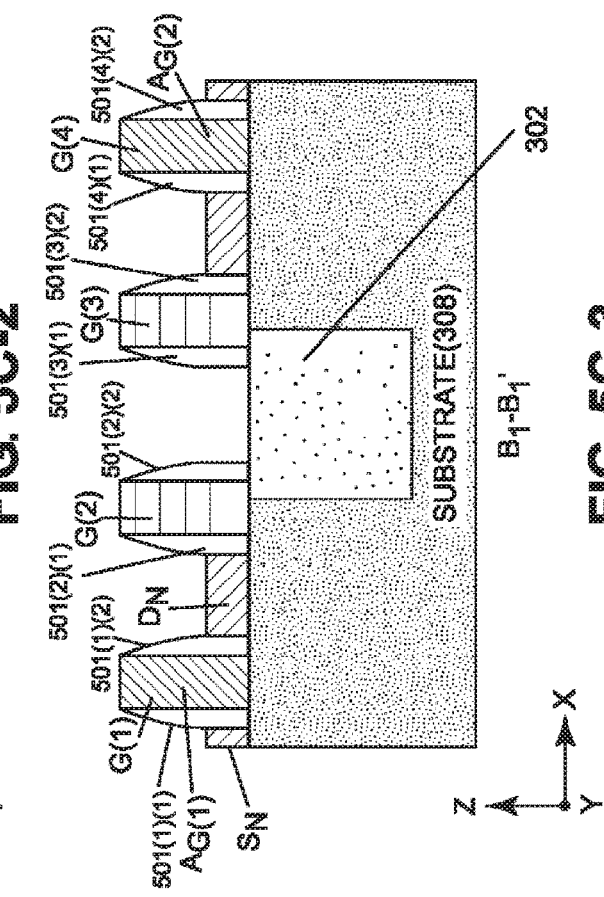
FIG. 5C-3
FIG. 5C-1

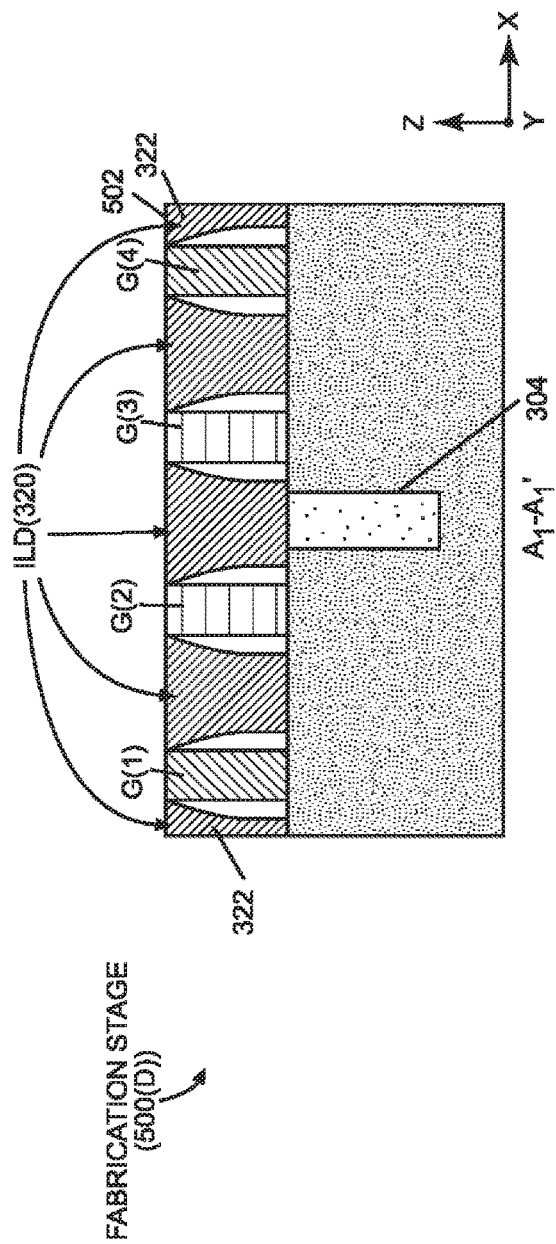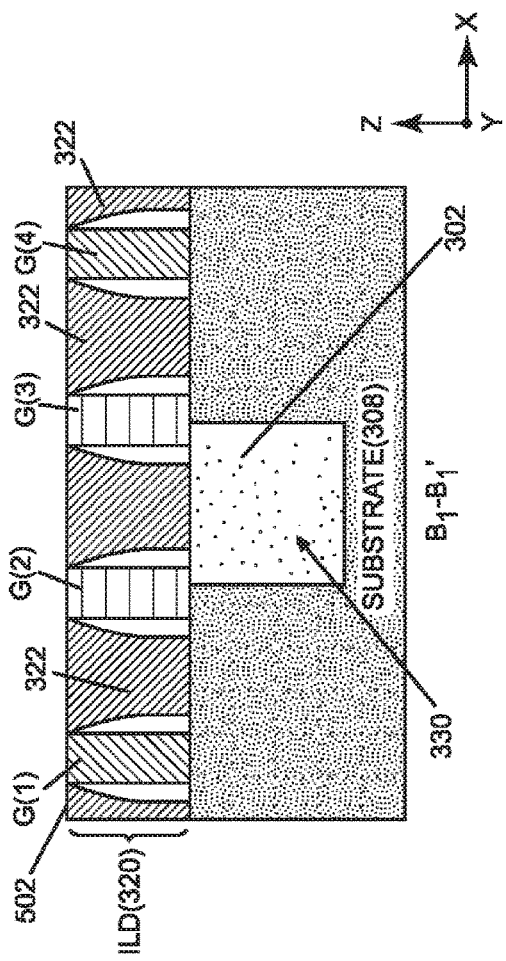
FIG. 5D-1
FIG. 5D-2

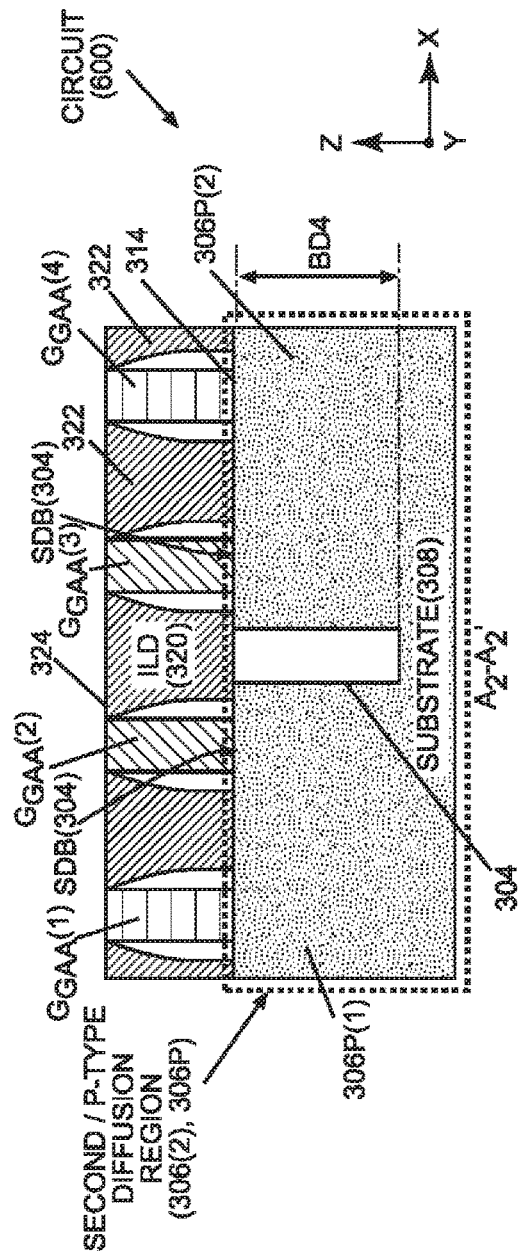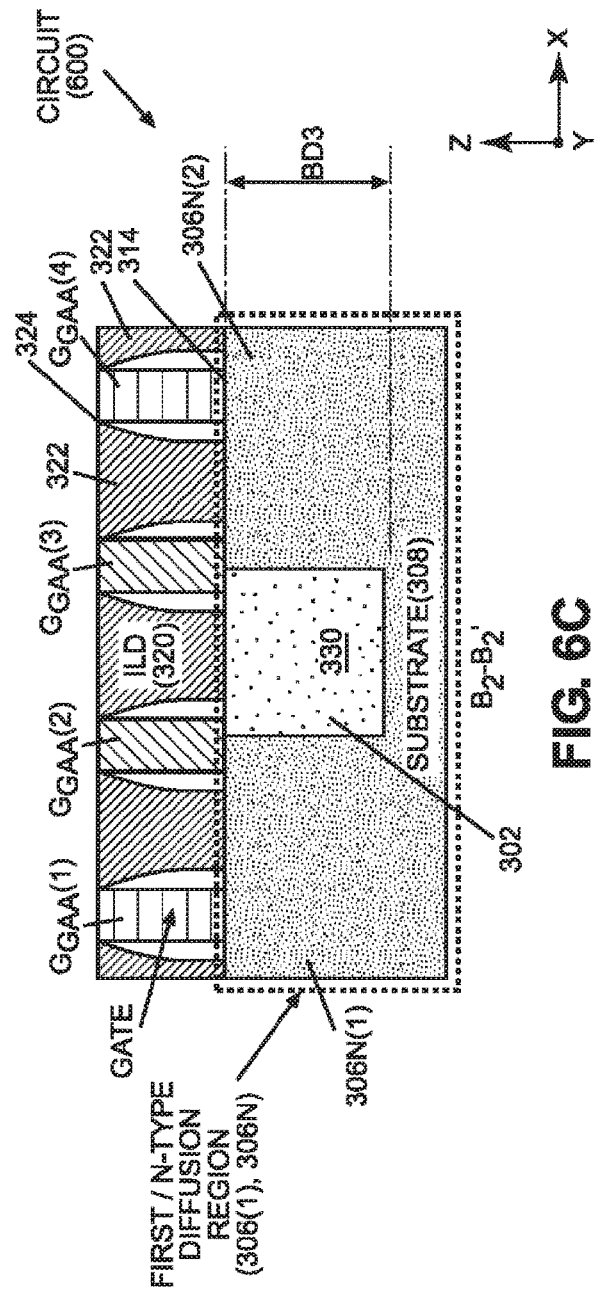

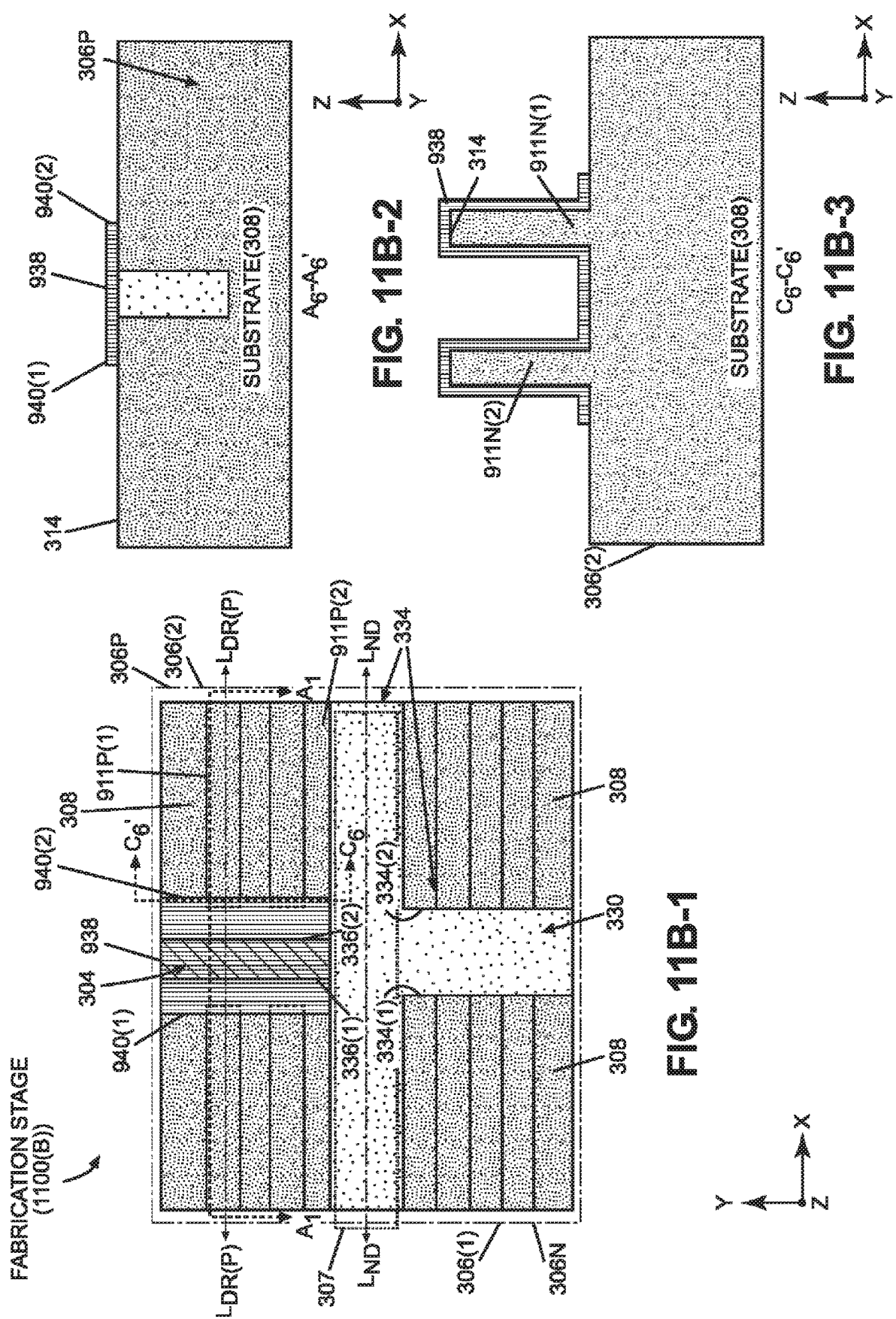

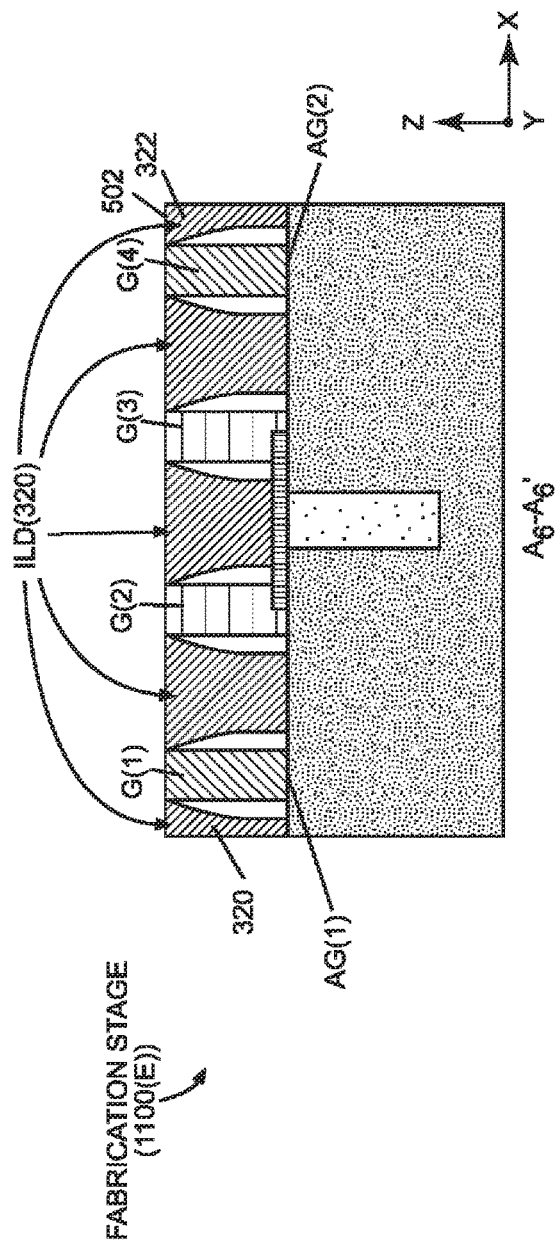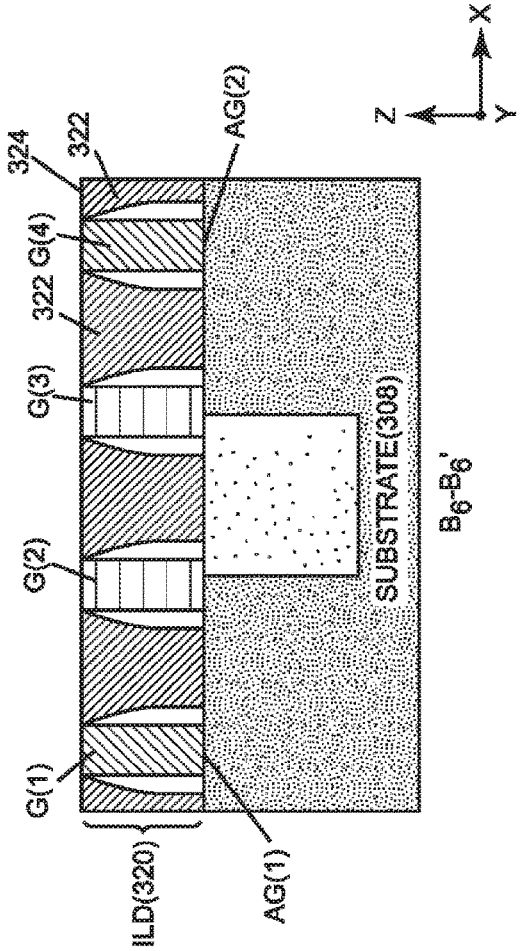
FIG. 11E-1
FIG. 11E-2

CIRCUITS EMPLOYING ASYMMETRIC DIFFUSION BREAKS IN DIFFERENT TYPE SEMICONDUCTOR DIFFUSION REGIONS, AND RELATED FABRICATION METHODS

BACKGROUND

I. Field of the Disclosure

The field of the disclosure relates to complementary metal oxide semiconductor (CMOS) integrated circuits that include both P-type and N-type diffusion regions for forming CMOS circuits, and more particularly to use of diffusion breaks between circuits to provide isolation between circuits.

II. Background

Transistors are essential components in modern electronic devices. Large numbers of transistors are employed in integrated circuits (ICs) in many modern electronic devices. For example, components such as central processing units (CPUs), digital signal processors (DSPs), and memory systems each employ a large quantity of transistors for logic circuits and memory devices.

For example, one type of transistor is a Fin Field-Effect Transistor (FET) (FinFET) that provides a conducting channel via a "Fin" formed from a substrate. FIG. 1 illustrates an exemplary FinFET 100. The FinFET 100 includes a substrate 102 and a fin 104 formed from the substrate 102. The fin 104 is formed from a semiconductor material. The fin 104 may be formed from the semiconductor substrate 102 by lithography and etching processes to form raised fins 104 from the material of the substrate 102. An oxide layer 106 is included on either side of the fin 104. The FinFET 100 includes a source 108 and a drain 110 interconnected by the fin 104 such that an interior portion of the fin 104 serves as a semiconductor channel 112 between the source 108 and drain 110. The fin 104 is surrounded by a "wrap-around" gate 114. The wrap-around structure of the gate 114 provides better electrostatic control over the semiconductor channel 112, and thus helps reduce the leakage current and overcome other short channel effects (SCEs).

Transistors, such as FinFETs, can be used to form complementary metal oxide semiconductor (CMOS) circuits in integrated circuits (ICs). For example, FIG. 2A below is a top view of a circuit 200 that includes adjacent cell circuits 202(1), 202(2), which are each an IC, that are formed of semiconductor devices, such as the FinFET 100 in FIG. 1. FIG. 2B is a cross-sectional side view of the cell circuits 202(1), 202(2) across an $A_1$-$A_1$ break line. The individual cell circuits 202(1), 202(2) are isolated from each other by a diffusion break 204. As shown in FIG. 2A, the cell circuits 202(1), 202(2) include a layout on X-axis and Y-axis dimensions that includes a shared top power rail 206P and a shared bottom power rail 206N elongated in a direction of the X-axis. The cell circuits 202(1), 202(2) include respective P-type semiconductor diffusion regions ("P-type diffusion regions") 208P(1), 208P(2) and N-type semiconductor diffusion regions ("N-type diffusion regions") 208N(1), 208N(2) formed in a semiconductor substrate 210 ("substrate"), as shown in cross-section in FIG. 2B, to provide active areas for forming semiconductor devices, such as transistors. The P-type diffusion regions 208P(1), 208P(2) and N-type diffusion regions 208N(1), 208N(2) may be formed by doping P-type and N-type materials in the substrate 210. The diffusion break 204 is needed to provide electrical isolation between the respective P-type or N-type diffusion regions 208P(1), 208P(2) and/or 208N(1), 208N(2). The P-type diffusion regions 208P(1), 208P(2) are formed as one diffusion region, but are electrically isolated from each other by the diffusion break 204. Likewise, the N-type diffusion regions 208N(1), 208N(2) are formed as one diffusion region, but are electrically isolated from each other by the diffusion break 204. The cell circuits 202(1), 202(2) also include respective P-type semiconductor channel structures 212P(1)-212P(4) and N-type semiconductor channel structures 212N(1)-212N(4) formed from semiconductor materials between the top and bottom power rails 206P, 206N as shown in FIG. 2A. For example, the P-type and N-type semiconductor channel structures 212P(1)-212P(4), 212N(1)-212N(4) may be semiconductor Fins, also known as "Fins" for forming three-dimensional (3D) channel structures like fin 104 in FIG. 1. The P-type semiconductor channel structures 212P(1) and 212P(3) were originally formed as a single semiconductor channel structure, but are electrically isolated from each other by formation of the diffusion break 204. Similarly, the N-type semiconductor channel structures 212N(1) and 212N(3) were originally formed as a single semiconductor channel structure, but are electrically isolated from each other by formation of the diffusion break 204.

Gates G(1)-G(14) of a metal material are formed in the cell circuits 202(1), 202(2) extending in the direction of the Y-axis and wrapping around at least a portion of the P-type and N-type semiconductor channel structures 212P(1)-212P(4), 212N(1)-212N(4). In this manner, active gates for semiconductor devices such as transistors can be formed in areas of the gates G(1)-G(14) that surround the P-type and N-type semiconductor channel structures 212P(1)-212P(4), 212N(1)-212N(4) to form semiconductor channels. An interlayer dielectric (ILD) 213 is disposed above the gates G(1)-G(14) and the P-type and N-type semiconductor channel structures 212P(1)-212P(4), 212N(1)-212N(4) to provide further electrical isolation.

In this example, the diffusion break 204 in the circuit 200 occupies the space between the gate G(8) and the gate G(9). The diffusion break 204 is formed by an insulating material 216, such as an oxide material, disposed in an etched shallow trench isolation (STI) area between the gates G(8), G(9). The dielectric material 216 is deposited during fabrication of the circuit 200 and undergoes high temperature processing. If the material of the substrate 210 and the dielectric material 216 contract at different rates upon cooling, the dielectric material 216 will apply either a compressive stress $S_C$ or a tensile stress $S_T$ to the substrate 210. The compressive stress $S_C$ will induce a compressive strain in the P-type semiconductor channel structures 212P(1)-212P(4) and N-type semiconductor channel structures 210N(1)-210N(4). Compressive strain may improve carrier mobility in the N-type semiconductor channel structures 212N(1)-212N(4), but reduce carrier mobility in the P-type semiconductor channel structures 212P(1)-212P(4). However, a tensile stress $S_T$ applied to the substrate 210 will be induce a tensile strain in the P-type semiconductor channel structures 212P(1)-212P(4) and N-type semiconductor channel structures 212N(1)-212N(4). Tensile strain may improve carrier mobility in the P-type semiconductor channel structures 212P(1)-212P(4), but reduce carrier mobility in the N-type semiconductor channel structures 212N(1)-212N(4).

Thus, as a result of the diffusion break 204, either the P-type semiconductor channel structures 212P(1)-212P(4) or the N-type semiconductor channel structures 212N(1)-212N(4) may have an improved carrier mobility and the other may have a reduced carrier mobility. In this regard, a diffusion break that provides a beneficial effect on the carrier mobility of semiconductor channel structures of a first type (P-type or N-type), without causing a detrimental effect on the carrier mobility of semiconductor channel structures of the opposite type, is needed.

SUMMARY OF THE DISCLOSURE

Aspects disclosed herein include circuits employing asymmetric diffusion breaks in different type semiconductor diffusion regions ("diffusion regions"). Related fabrication methods are also disclosed. In exemplary aspects disclosed herein, diffusion breaks (e.g., shallow trench isolation (STI) structures) having dimensions asymmetric to each other are provided in respective different types of diffusion regions in a circuit to increase carrier mobility in semiconductor channels of a semiconductor device formed in different diffusion regions. In exemplary aspects disclosed herein, the circuit includes a P-type semiconductor device(s) formed in a P-type diffusion region(s) in a substrate and an N-type semiconductor device(s) formed in an N-type diffusion region(s) formed in the substrate. Complementary metal oxide semiconductor (CMOS) circuits can be realized from the P-type and N-type semiconductor devices. Diffusion breaks, which are formed in diffusion regions to electrically isolate respective portions thereof, can induce strain in the diffusion regions with a magnitude of the induced strain related to a dimension of the diffusion breaks. As one example, an induced tensile strain may increase carrier mobility in N-type devices and decrease carrier mobility in P-type devices, with induced compressive strain having the opposite effect. Thus, in certain exemplary aspects disclosed herein, a first diffusion break having either a first dimension (e.g., a wider or narrower dimension) is formed in the N-type diffusion region(s) of the circuit, and a second diffusion break having a second dimension asymmetric narrower or wider than the first diffusion break, is formed in the P-type diffusion region(s) of the circuit. As another example, in other exemplary aspects disclosed herein, a first diffusion break having either a wider or narrower dimension is formed in the P-type diffusion region(s) of the circuit, and a second diffusion break asymmetrically narrower or wider than the first diffusion break, is formed in the N-type diffusion region(s) of the circuit. In this regard, the diffusion breaks having dimensions asymmetric to each other can be provided in the circuit to increase carrier mobility in respective P- or N-type diffusion region(s), while reducing or avoiding a decrease in carrier mobility in either N- or P-type diffusion region(s), as desired.

In one exemplary aspect, a circuit is provided, the circuit comprising a substrate comprising a top surface. The circuit also comprises a first diffusion region comprising either an N-type diffusion region or a P-type diffusion region disposed in the substrate. The first diffusion region comprises at least one first semiconductor channel each having a first longitudinal axis in a first direction. The circuit comprises a second diffusion region comprising either a P-type diffusion region or an N-type diffusion region opposite of the diffusion type of the first diffusion region. The second diffusion region is disposed in the substrate and comprises at least one second semiconductor channel each having a second longitudinal axis parallel to the first longitudinal axis. The circuit also comprises a first dummy gate extending along a third longitudinal axis in a second direction orthogonal to the first longitudinal axis, the first dummy gate disposed above the first diffusion region and the second diffusion region. The circuit also comprises a second dummy gate extending along a fourth longitudinal axis parallel to the third longitudinal axis, the second dummy gate disposed above the first diffusion region and the second diffusion region, the second dummy gate adjacent to the first dummy gate by a gate pitch. The circuit also comprises a first diffusion break in the first diffusion region between the first dummy gate and the second dummy gate, the first diffusion break having a first dimension in the first direction from a first side to a second side of the first diffusion break. The circuit also comprises a second diffusion break in the second diffusion region between the first dummy gate and the second dummy gate, the second diffusion break having a second dimension in the first direction from a first side to a second side of the second diffusion break, the second dimension different in magnitude from the first dimension.

In another aspect, a circuit is provided, the circuit comprising a substrate comprising a top surface. The circuit also comprises a means for providing a first diffusion in the substrate, the means for providing the first diffusion comprising either a means for providing a P-type diffusion in the substrate or a means for providing an N-type diffusion in the substrate. The means for providing the first diffusion comprises at least one first means for providing a semiconducting channel. The circuit also comprises a means for providing a second diffusion in the substrate, and the means for providing the second diffusion comprises either a means for providing a P-type diffusion in the substrate or a means for providing an N-type diffusion in the substrate. The means for providing the second diffusion comprises at least one second means for providing a semiconducting channel. The circuit also comprises a means for controlling conduction in at least one of the at least one first means for providing a semiconducting channel, and the at least one second means for providing a semiconducting channel. The circuit also comprises a means for providing a first diffusion break in the first diffusion region, wherein the means for providing the first diffusion break is provided between a first portion of the means for providing the first diffusion in the substrate and a second portion of the means for providing the first diffusion in the substrate. The means for providing a first diffusion break has a first dimension in the first direction from a first side to a second side of the means for providing the first diffusion break. The circuit also comprises a means for providing a second diffusion break in the second diffusion region, wherein the means for providing the second diffusion break is provided between a first portion of the means for providing the second diffusion in the substrate and a second portion of the means for providing the second diffusion in the substrate. The means for providing the second diffusion break has a second dimension in the first direction from a first side to a second side of the means for providing the second diffusion break, the second dimension different from the first dimension.

In another exemplary aspect, a method of fabricating a circuit is provided, the method comprising forming a substrate, the substrate comprising a top surface. The method also comprises forming a first diffusion region having a first longitudinal axis in a first direction in the substrate, the first diffusion region comprising either an N-type diffusion region or a P-type diffusion region in the substrate. The method also comprises forming a second diffusion region separated by a non-diffusion region from the first diffusion region and having a second longitudinal axis parallel to the first longitudinal axis, the second diffusion region comprising either a P-type diffusion region or an N-type diffusion region opposite of the diffusion type of the first diffusion region in the substrate. The method also comprises forming a first diffusion break in the substrate in the first diffusion region, the first diffusion break having a first dimension in the first direction from a first side to a second side of the first diffusion break. The method also comprises forming a second diffusion break in the substrate in the second diffusion region, the second diffusion break having a second dimension in the first direction from a first side to a second side of the second diffusion break, the second dimension different from the first dimension. The method also comprises forming a plurality of dummy gates each extending along longitudinal axes parallel to each other and orthogonal to the first longitudinal axis above the first diffusion region and the second diffusion region, the plurality of dummy gates each spaced apart from each other by a gate pitch, the plurality of dummy gates including a first dummy gate adjacent to first sides of the first and second diffusion breaks and a second dummy gate adjacent to second sides of the first and second diffusion breaks. The method also comprises forming source/drain regions in the first and second diffusion regions. The method also comprises forming a first active gate spaced apart from the first dummy gate by the gate pitch and a second active gate spaced apart from the second dummy gate by the gate pitch, the first and second active gates formed above the first diffusion region and the second diffusion region.

BRIEF DESCRIPTION OF THE FIGURES

FIGS. 2A and 2B are respective top and cross-sectional side views of P-type and N-type diffusion regions of a circuit isolated by a diffusion break comprising a shallow trench isolation (STI) structure that induces strain in areas of the P-type and N-type diffusion regions;

FIGS. 3B and 3C are cross-sectional views taken in respective, different cross-sections of P-type diffusion and N-type diffusion regions in the circuit in FIG. 3A to further illustrate the STI structure having a first dimension in the N-type diffusion region and the STI structure having a second dimension in the P-type diffusion region;

FIG. 5A-1 is a top view of an exemplary fabrication stage of forming a substrate and forming a patterned trench to provide a first diffusion break in the N-type diffusion region, a second diffusion break in the P-type diffusion region, and a non-diffusion region between the N-type diffusion region and the P-type diffusion region, in the fabrication of the circuit in FIGS. 3A-3C;

FIGS. 5A-2 and 5A-3 are cross-sectional views taken in respective, different cross-sections of the substrate in the fabrication stage of FIG. 5A-1;

FIG. 5B-1 is a top view of another exemplary fabrication stage of forming dummy gates that extend in the N-type diffusion region and the P-type diffusion region and forming spacers adjacent to the dummy gates in the fabrication of the circuit in FIGS. 3A-3C;

FIGS. 5B-2 and 5B-3 are cross-sectional views taken in respective, different cross-sections of the P-type and N-type diffusion regions in the fabrication stage in FIG. 5B-1;

FIG. 5C-1 is a top view of another exemplary fabrication stage of forming source and drain regions, and replacing the dummy gates not immediately adjacent to the diffusion breaks with metal gates to form N-type and P-type semiconductor devices;

FIGS. 5C-2 and 5C-3 are cross-sectional views taken in respective, different cross-sections of the P-type and N-type diffusion regions in the fabrication stage in FIG. 5C-1;

FIGS. 5D-1 and 5D-2 are cross-sectional views taken in respective, different cross-sections of the P-type diffusion and N-type diffusion regions in the fabrication stage of FIG. 5C-1, to illustrate the deposition of an interlayer dielectric (ILD) over the dummy gates, the metal gates, the source and drain regions, and the P-type and N-type diffusion regions formed therein in the fabrication stages in FIGS. 5B-1 and 5C-1 for isolation and planarizing a top surface of the ILD in the fabrication of the circuit in FIGS. 3A-3C;

FIGS. 6B and 6C are cross-sectional views taken in respective, different cross-sections of P-type and N-type diffusion regions in the circuit in FIG. 6A to further illustrate a diffusion break having a first dimension in the N-type diffusion region and a diffusion break having a second dimension in the P-type diffusion region;

FIG. 11A-1 is a top view of an exemplary fabrication stage of forming a substrate and forming a patterned trench to provide a diffusion break having a first dimension in the N-type diffusion region, a diffusion break having a second dimension in the P-type diffusion region, and a non-diffusion region between the N-type diffusion region and the P-type diffusion region in the fabrication of the circuit in FIGS. 9A-9C;

FIGS. 11A-2 and 11A-3 are cross-sectional views taken in respective, different cross-sections of the substrate in the fabrication stage of FIG. 11A-1;

FIG. 11B-1 is a top view of an exemplary fabrication stage of forming an insulator on a top surface of the substrate to cover the diffusion break with the second dimension in the P-type diffusion region in the fabrication of the circuit in FIGS. 9A-9C;

FIGS. 11B-2 and 11B-3 are cross-sectional views taken in respective, different cross-sections of the substrate in the fabrication stage of FIG. 11B-1;

FIG. 11C-1 is a top view of another exemplary fabrication stage of forming dummy gates that extend in the N-type diffusion region and the P-type diffusion region and forming spacers adjacent to the dummy gates in the fabrication of the circuit in FIGS. 9A-9C;

FIGS. 11C-2 and 11C-3 are cross-sectional views taken in respective, different cross-sections of the P-type and N-type diffusion regions in the fabrication stage in FIG. 11C-1;

FIG. 11D-1 is a top view of another exemplary fabrication stage of forming source and drain regions and replacing the dummy gates not immediately adjacent to the diffusion breaks with metal gates to form N-type and P-type semiconductor devices;

FIGS. 11D-2 and 11D-3 are cross-sectional views taken in respective, different cross-sections of the P-type and N-type diffusion regions in the fabrication stage in FIG. 11D-1;

FIGS. 11E-1 and 11E-2 are cross-sectional views taken in respective, different cross-sections of the P-type diffusion and N-type diffusion regions in the fabrication stage of FIG. 11D-1, to illustrate the deposition of an interlayer dielectric (ILD) over the dummy gates, the metal gates, and the P-type and N-type diffusion regions formed therein in the fabrication stages in FIGS. 11C-1 and 11D-1 for isolation and planarizing a top surface of the ILD in the fabrication of the circuit in FIGS. 9A-9C;

DETAILED DESCRIPTION

Figure 1:
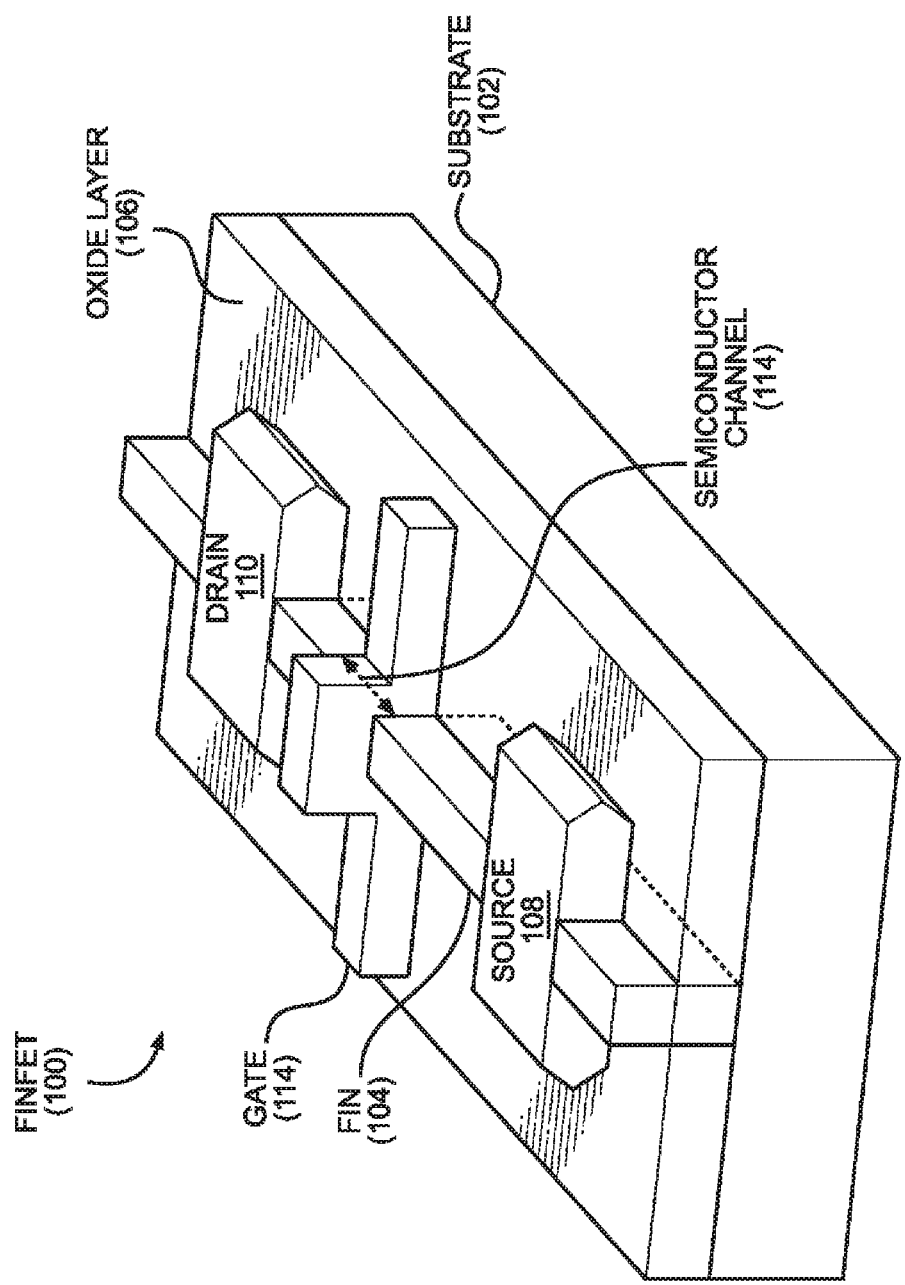
FIG. 1 is a perspective view of an exemplary Fin Field-Effect Transistor (FET) (FinFET)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include circuits employing asymmetric diffusion breaks in different type semiconductor diffusion regions ("diffusion regions"). Related fabrication methods are also disclosed. In exemplary aspects disclosed herein, diffusion breaks (e.g., shallow trench isolation (STI) structures) having dimensions asymmetric to each other are provided in respective different types of diffusion regions in a circuit to increase carrier mobility in semiconductor channels of a semiconductor device formed in different diffusion regions. In exemplary aspects disclosed herein, the circuit includes a P-type semiconductor device(s) formed in a P-type diffusion region(s) in a substrate and an N-type semiconductor device(s) formed in an N-type diffusion region(s) formed in the substrate. Complementary metal oxide semiconductor (CMOS) circuits can be realized from the P-type and N-type semiconductor devices. Diffusion breaks, which are formed in diffusion regions to electrically isolate respective portions thereof, can induce strain in the diffusion regions with a magnitude of the induced strain related to a dimension of the diffusion breaks. As one example, an induced tensile strain may increase carrier mobility in N-type devices and decrease carrier mobility in P-type devices, with induced compressive strain having the opposite effect. Thus, in certain exemplary aspects disclosed herein, a first diffusion break having either a first dimension (e.g., a wider or narrower dimension) is formed in the N-type diffusion region(s) of the circuit, and a second diffusion break having a second dimension asymmetric narrower or wider than the first diffusion break, is formed in the P-type diffusion region(s) of the circuit. As another example, in other exemplary aspects disclosed herein, a first diffusion break having either a wider or narrower dimension is formed in the P-type diffusion region(s) of the circuit, and a second diffusion break asymmetrically narrower or wider than the first diffusion break, is formed in the N-type diffusion region(s) of the circuit. In this regard, the diffusion breaks having dimensions asymmetric to each other can be provided in the circuit to increase carrier mobility in respective P- or N-type diffusion region(s), while reducing or avoiding a decrease in carrier mobility in either N- or P-type diffusion region(s), as desired.

Figure 3A:
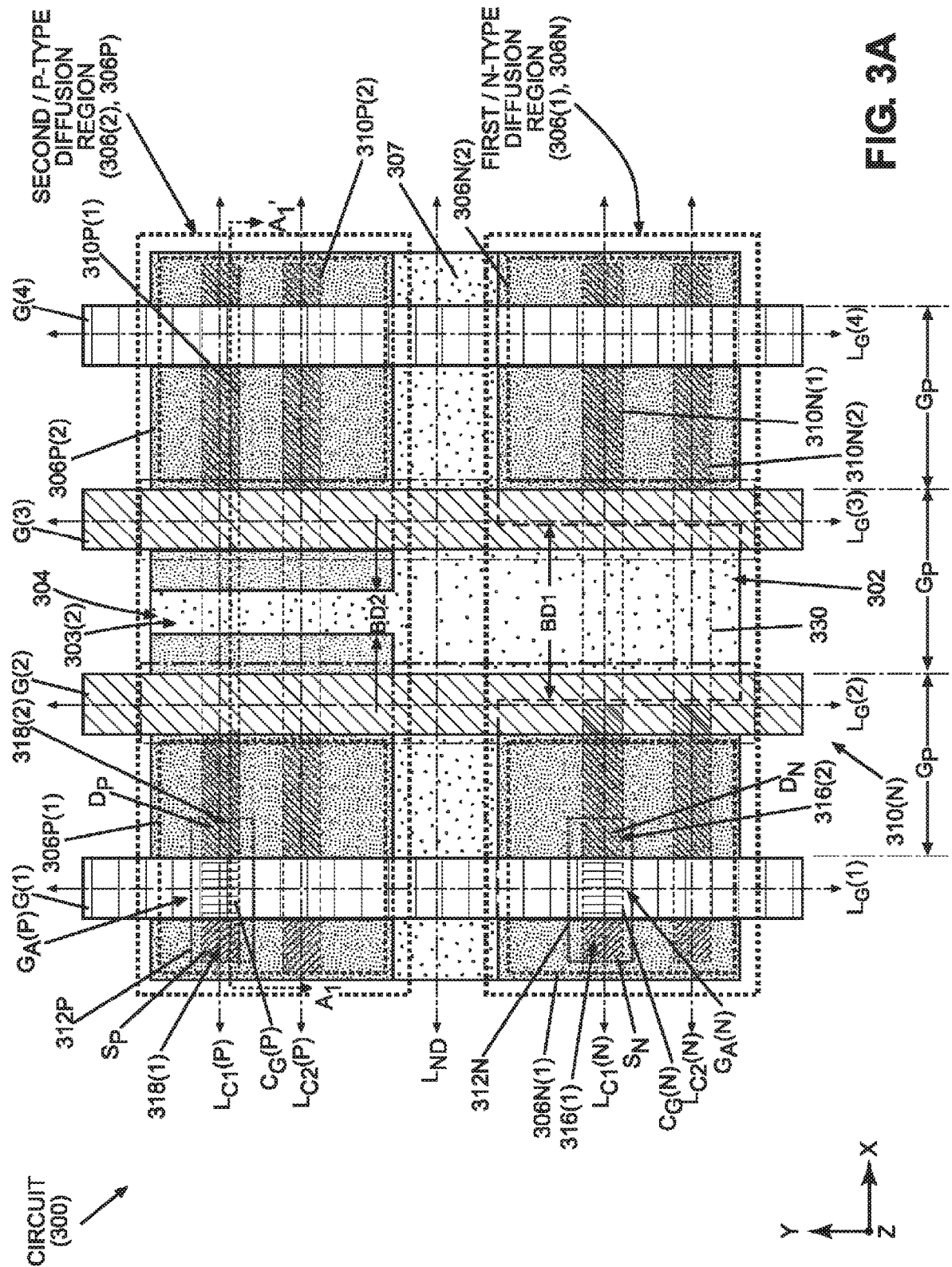
FIG. 3A is a top view of an exemplary circuit employing diffusion breaks having asymmetric dimensions, including a first dimension and/or a second dimension, in different types of diffusion regions to increase carrier mobility in a FinFET(s) formed in one type of diffusion region(s), while reducing or avoiding the degradation of carrier mobility in a FinFET(s) formed in the other type of diffusion region.

In this regard, FIGS. 3A-3C illustrate an exemplary circuit 300 employing a first diffusion break (DB) ("first DB") 302 having a first dimension BD1 asymmetric to second DB ("second DB") 304 having a second dimension BD2 in different types of respective first and second diffusion regions 306(1), 306(2) to increase carrier mobility in a FET(s) formed in the circuit 300. The circuit 300 may be an integrated circuit (IC) that can be fabricated in an IC chip. FIG. 3A is a top view of the circuit 300. FIGS. 3B and 3C are cross-sectional views taken in respective cross-sections $A_1$-$A_1'$, $B_1$-$B_1'$ of the circuit 300 in FIG. 3A to further illustrate the first DB 302 in the first diffusion region 306(1) asymmetric to the second DB 304 in the second diffusion region 306(2). In this example, the first DB 302 may be formed of a first shallow trench isolation (STI) structure 303(1), and the second DB 304 may be formed of a second STI structure 303(2). In exemplary aspects disclosed herein, the first DB 302 and the second DB 304 are diffusion breaks having dimensions asymmetric to each other and are provided in respective different types of diffusion regions in a circuit to increase carrier mobility in semiconductor channels of a semiconductor device formed in first type diffusion regions while reducing or avoiding a decrease in carrier mobility in second type diffusion region(s).

In this example, as shown in FIG. 3A, the first diffusion region 306(1) is an N-type diffusion region 306(1) (also labeled "306N"), and the second diffusion region is a P-type diffusion region 306(2) (also labeled "306P"). For example, the N-type diffusion region 306N may be formed by doping a portion of a semiconductor substrate 308 (e.g., Silicon (Si)) with a pentavalent impurity material as a donor material that is able to give up free electrons in the substrate 308. Likewise, as an example, the P-type diffusion region 306P may be formed by doping a portion of the semiconductor substrate 308 with a trivalent impurity material that is able to provide additional holes in the substrate 308. Note that the N-type diffusion region 306N is initially formed in the circuit 300 according to a circuit cell as one diffusion region, but is separated into two portions as N-type diffusion sub-regions 306N(1), 306N(2) by the first DB 302. Likewise, note that the P-type diffusion region 306P is initially formed in the circuit 300 according to a circuit cell as one diffusion region, but is separated into two portions as P-type diffusion sub-regions 306P(1), 306P(2) by the second DB 304. Also note that there is a non-diffusion region 307 having a longitudinal axis $L_{ND}$ in the X-axis direction between the P-type diffusion region 306P and the N-type diffusion region 306N in the circuit 300. As shown in FIG. 3A, N-type semiconductor channels 310N(1), 310N(2) and P-type semiconductor channels 310P(1), 310P(2) in the form of "Fins" are formed in the circuit 300 above the substrate 308 and extend along longitudinal axes $L_{C1}(N)$, $L_{C2}(N)$ and $L_{C1}(P)$, $L_{C2}(P)$ in the X-axis direction.

In this example, the first DB 302 is formed in the N-type diffusion region 306N, and the second DB 304 is formed in the P-type diffusion region 306P. The first DB 302 and second DB 304 may be STI structures that are formed in their respective N-type and P-type diffusion regions 306N, 306P to provide electrical isolation to impede the flow of electrons or holes between different semiconductor channels of FETs or other semiconductor devices formed in different portions of a diffusion region on opposite sides of the respective first DB 302 and second DB 304 in the X-axis direction. For example, the first DB 302 or second DB 304 may be included in the circuit 300 to provide electrical isolation if a circuit design calls for different bias voltages to be applied to different semiconductor devices formed in the different portions of the diffusion region. In the example, the first DB 302 has a first dimension BD1 in the first direction (e.g., the X-axis direction) that may be different in magnitude from the second dimension BD2 of the second DB 304 in the first direction. In an example, the first dimension BD1 of the first DB 302 may be greater in magnitude than the second dimension BD2 of the second DB 304 in the first direction. For example, the first dimension BD1 may be wider than the second dimension BD2 in the first direction. In another example, the second dimension BD2 may be narrower than the first dimension BD1 in the first direction, and may have a magnitude in a range of 50% to 85% of a magnitude of the first dimension BD1 of the first DB 302. In another example, a magnitude of the first dimension BD1 of the first DB 302 may be in a range of 40 nanometers (nm) to 100 nm and a magnitude of the second dimension BD2 of the second DB 304 may be in a range of 20 nm to 85 nm.

In one exemplary aspect, the first DB 302 and the second DB 304 may be STI structures each formed in a respective diffusion region and filled with insulating material, such as an STI material. The first DB 302 in a first diffusion region may be wider in a first dimension than the second DB in the second diffusion region. The first DB 302 and the second DB may each extend across the diffusion regions orthogonal to the first direction (e.g., in the Y-direction in FIG. 3A). In this regard, the first dimension of each STI structure in the first direction is a width dimension of the STI structure that is related to a magnitude of strain induced in channel regions of semiconductor devices formed in the respective diffusion sub-regions 306N(1), 306N(2) and 306P(1), 306P(2). Thus, the magnitude of the strain induced by the first DB having the first dimension BD1 in the N-type diffusion sub-regions 306N(1), 306N(2) is greater than the magnitude of the strain induced by the second DB having the second dimension BD2 in the P-type diffusion sub-regions 306P(1), 306P(2).

Gates G(1)-G(4) are formed in the circuit 300 along longitudinal axes $L_G(1)$-$L_G(4)$ in the Y-axis direction, orthogonal to the longitudinal axes $L_{C1}(N)$, $L_{C2}(N)$ and $L_{C1}(P)$, $L_{C2}(P)$ of the N-type and P-type semiconductor channels 310N(1), 310N(2) and 310P(1), 310P(2) in the X-axis direction. Gates G(1)-G(4) extend above and around at least a portion of the P-type and N-type semiconductor channels 310N(1), 310N(2) and 310P(1), 310P(2). Gates G(1) and G(4) are active gates of a conductive material, such as metal, (referred to herein as "active gates" G(1) or G(4)), and gates G(2) and G(3), which are each immediately adjacent to the first DB 302 and the second DB 304, are dummy gates of a dielectric material (referred to herein as "dummy gates" G(2) or G(3)). As shown in FIG. 3A, a three dimensional (3D)N-type FET (NFET) 312N in the form of a FinFET in this example is formed in the N-type semiconductor channel 310N(1) in the N-type diffusion region 306N by forming a source $S_N$ and drain $D_N$ on opposites sides of the active gate G(1) in the N-type diffusion region 306N. Similarly, as shown in FIG. 3A, a 3D P-type FET (PFET) 312P also in the form of a FinFET in this example is formed in the P-type semiconductor channel 310P(1) in the P-type diffusion region 306P by forming a source $S_P$ and drain $D_P$ on opposites sides of the active gate G(1) in the P-type diffusion region 306P. Corresponding FinFETs (not shown) are also formed in each of the N-type semiconductor channel 310N(2) and the P-type semiconductor channel 310P(2). The gates G(1)-G(4) are located adjacent to each other and have a gate pitch $P_G$ according to the layout of a circuit cell. In an example, a magnitude of the first dimension BD1 of the first DB and the magnitude of the second dimension BD2 of the second DB may each depend on the gate pitch. For example, the magnitude of the first dimension BD1 of the first DB may be equal to the gate pitch $G_P$. A magnitude of the second dimension BD2 of the second DB may be equal to a fraction, such as ¾ or ½, of the gate pitch $G_P$. Alternatively, the magnitude of the first dimension BD1 may be in a range of 90% to 110% of the gate pitch $G_P$ and the magnitude of the second dimension BD2 of the second DB may be in a range of 50% to 85% of the gate pitch.

With continuing reference to FIGS. 3A-3C, the first DB 302 is formed in the N-type diffusion region 306N of the circuit 300, because the first DB 302 induces a tensile strain in the N-type diffusion region 306N during fabrication of the circuit 300. Inducing tensile strain in the N-type diffusion region 306N can increase carrier mobility of the N-type semiconductor channels 310N(1), 310N(2) formed in the N-type diffusion region 306N. Thus for example, the tensile strain induced in the N-type semiconductor channel 310N(1) formed in the N-type diffusion region 306N used to form the semiconductor channel of the NFET 312N can increase the drive strength of the NFET 312N. For example, the tensile strain induced by the first DB 302 in the N-type semiconductor channels 310N(1), 310N(2) in the N-type diffusion region 306N may increase the N-type device drive current between approximately five percent (5%) and twenty percent (20%). However, inducing tensile strain in the P-type diffusion region 306P that induces such tensile strain in the P-type semiconductor channels 310P(1), 310P(2) formed in the P-type diffusion region 306P may degrade carrier mobility in the P-type semiconductor channel 310P(1), 310P(2). This would, for example, have the effect of reducing drive strength of the PFET 312P employing the P-type semiconductor channel 310P(1) in the circuit 300, which may not be desired. Thus, in this example, as will be discussed in more detail below, the second DB 304 is formed in the P-type diffusion region 306P of the circuit 300. Although the second DB 304 may induce some tensile strain the P-type diffusion region 306P, a magnitude of the strain induced in the P-type diffusion region 306P may be less than a magnitude of the strain induced by the first DB 302 in the N-type diffusion region 306N due to the asymmetry of the first DB 302 and the second DB 304 with respect to the first dimension BD1 and the second dimension BD2. The second DB 304 having the second dimension BD2 is preferable over a diffusion break having the first dimension BD1 formed in both of the N-type diffusion region 306N and the P-type diffusion region 306P. This can avoid and/or reduce a magnitude of tensile stress applied to the P-type diffusion region 306P and the P-type semiconductor channels 310P(1), 310P(2) formed therein so as to avoid and/or reduce a decrease in carrier mobility in the P-type semiconductor channel 310P(1) and the PFET 312P.

In this manner, the first DB 302 can be formed in the circuit 300 in FIGS. 3A-3C to purposefully induce tensile strain in the N-type diffusion region 306N and the N-type semiconductor channels 310N(1), 310N(2) formed therein to increase drive strength of NFETs formed in the N-type diffusion region 306N, such as NFET 312N. However, reducing carrier mobility of the P-type semiconductor channel 310P(1), 310P(2) in the P-type diffusion region 306P may be avoided to avoid decreasing the drive strength of PFETs, such as PFET 312P, formed in the P-type diffusion region 306P. Additional aspects of the circuit 300 in FIGS. 3A-3C will now be discussed in more detail below.

With reference to FIGS. 3B and 3C, the N-type and P-type semiconductor channels 310N(1), 310N(2) and 310P(1), 310P(2) are disposed on a top surface 314 of the substrate 308 in this example. For example, gate G(1) is located adjacent to dummy gate G(2). Dummy gate G(2) is disposed between and adjacent to active gate G(1) and dummy gate G(3). In this example, the active gates G(1), G(4) extend around at least a portion of the N-type and P-type semiconductor channel 310N(1), 310N(2) and 310P(1), 310P(2) providing active gates to form 3D FETs, such as FinFETs or Gate-All-Around (GAA) FETs. Note however, that the active gates G(1), G(4) may only extend above the N-type and P-type semiconductor channels 310N(1), 310N(2) and 310P(1), 310P(2) for providing active gates G(1)-G(4) to form planar FETs. As shown in FIG. 3A, a gate contact $C_G(N)$ is formed over a portion of the active gate G(1) to form an active gate $G_A(N)$ for the NFET 312N. Similarly, a gate contact $C_G(P)$ is formed over a portion of the active gate G(1) to form an active gate $G_A(P)$ for the PFET 312P. The source $S_N$ and drain $D_N$ of the NFET 312N are formed in first and second portions 316(1), 316(2) in the N-type semiconductor channel 310N(1) on opposite sides of the active gate G(1) where the gate contact $C_G(N)$ is formed over the active gate G(1). The source $S_P$ and drain $D_P$ of the PFET 312P are formed in first and second portions 318(1), 318(2) in the P-type semiconductor channel 310P(1) on opposite sides of the active gate G(1) where the gate contact $C_G(P)$ is formed over the active gate G(1).

As shown in FIGS. 3B and 3C, an interlayer dielectric (ILD) 320 of a dielectric material 322 is disposed above the N-type and P-type semiconductor channels 310N(1), 310N(2) and 310P(1), 310P(2) and the gates G(1)-G(4) to provide electrical isolation between these structures and adjacently formed conductive structures and/or interconnect layers formed in metal layers of the circuit 300. As shown in FIG. 3B, the second DB 304 in the P-type diffusion region 306P is formed between the dummy gates G(2), G(3) in the P-type diffusion region 306P. The dummy gates G(2), G(3) extend from a top surface 324 of the ILD 320, through the ILD 320 to the top surface 314 of the substrate 308. The first DB 302 may be formed of insulating material such as a trench isolation material 330 in a first shallow trench 326N having a depth BD3 in the substrate, and the second DB 304 may be formed of the trench isolation material 330 in a second shallow trench 326P having a depth BD4 in the substrate, such that the depth BD3 may be the same as or different than the depth BD4 in the substrate 308. Exemplary detail on how the first DB 302, the second DB 304, and dummy gates G(2), G(3) are formed is discussed below in regard to an exemplary process to fabricate the circuit 300.

Figure 4A:
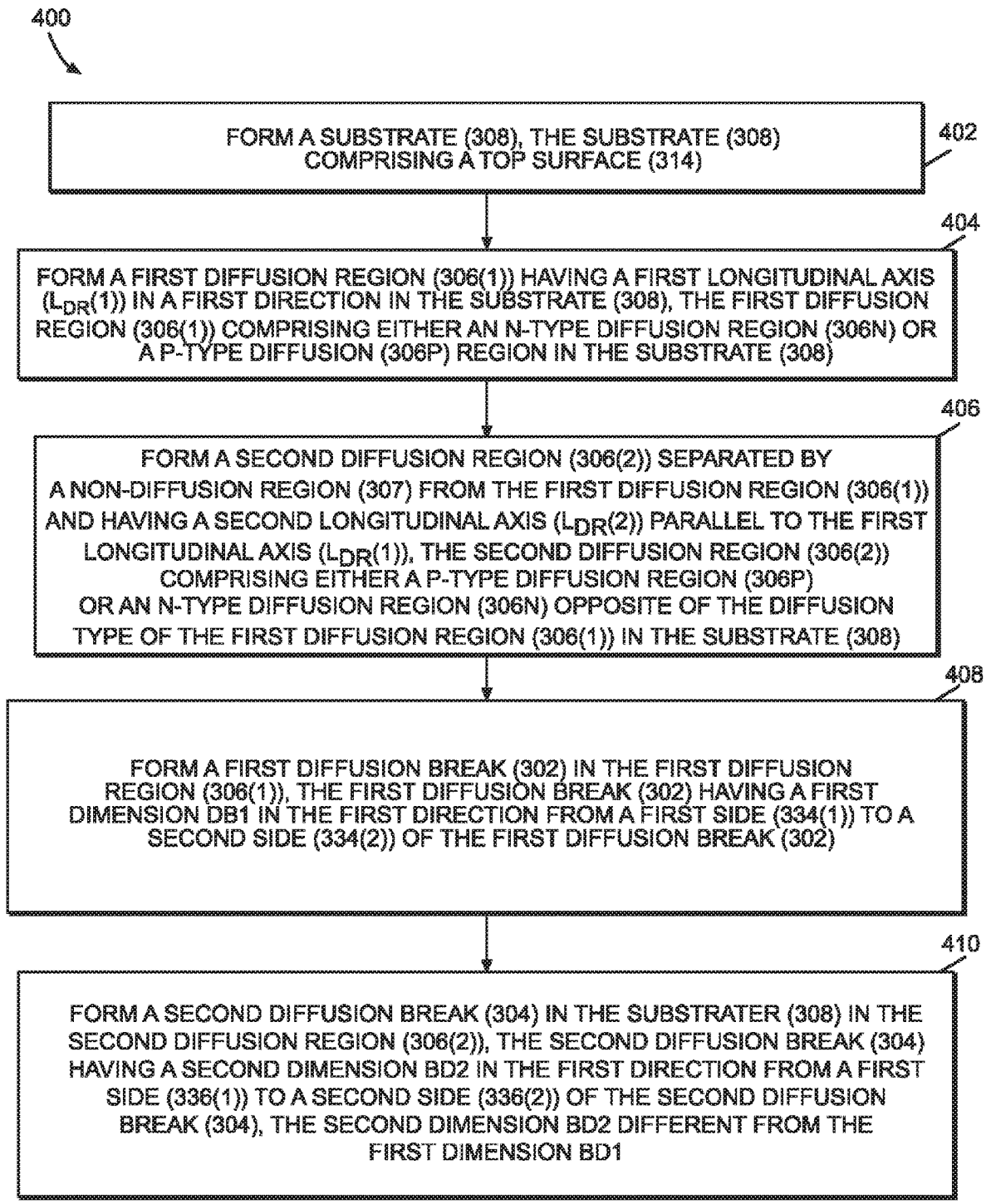
FIGS. 4A and 4B are a flowchart illustrating an exemplary process of fabricating the circuit in FIGS. 3A-3C employing a first diffusion break having a first dimension in the N-type diffusion region and/or a second diffusion break having a second dimension in the P-type diffusion region.
Figure 4B:
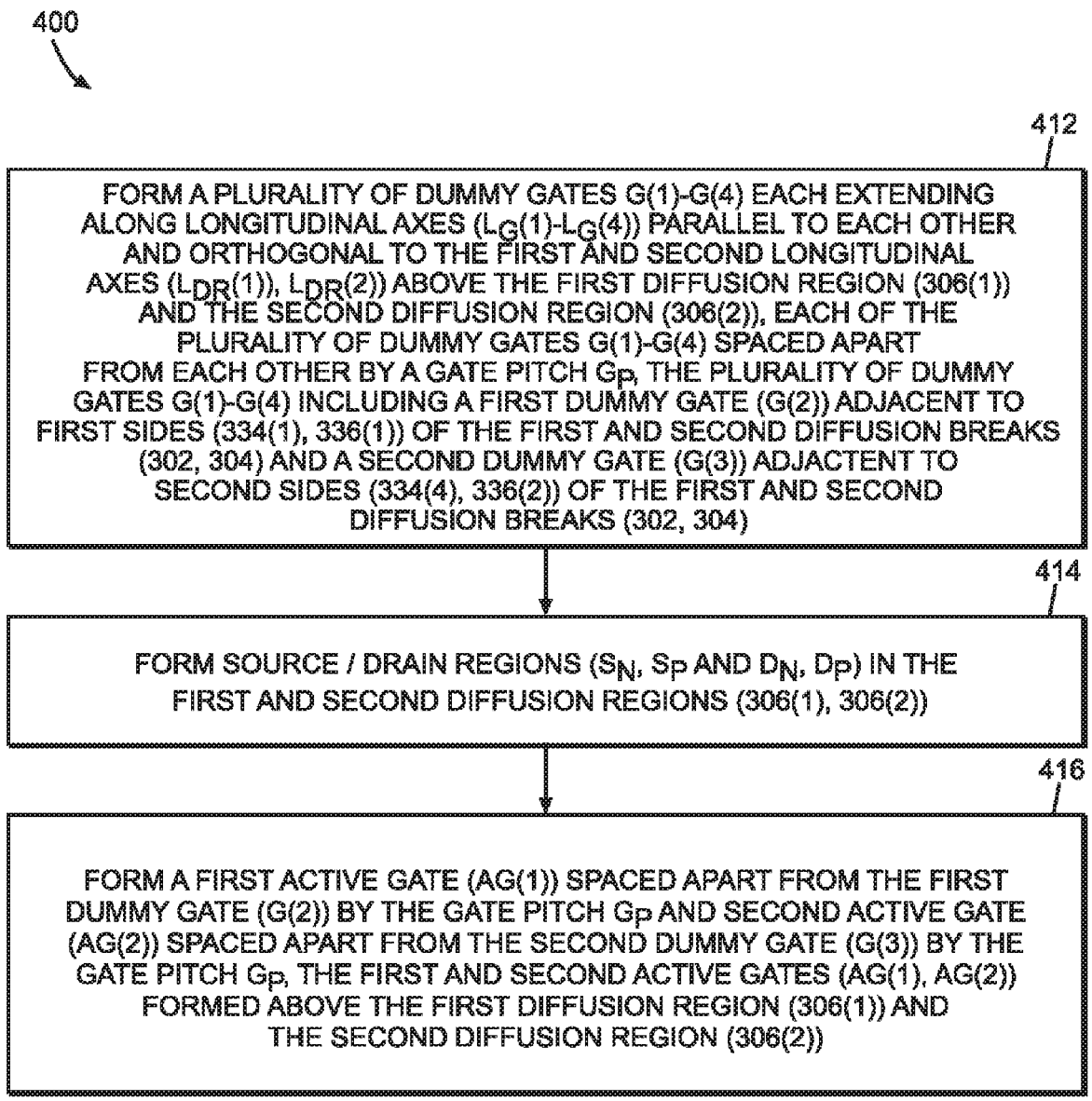

The circuit 300 can be fabricated according to a variety of methods and processes. For example, the circuit 300 can be fabricated according to CMOS fabrication methods. In this regard, FIGS. 4A and 4B are a flowchart illustrating an exemplary process 400 of fabricating the circuit 300 in FIGS. 3A-3C employing the first DB 302 in the N-type diffusion region 306N and the second DB 304 in the P-type diffusion region 306P. FIGS. 5A-1-5D-2 illustrate exemplary fabrication stages of the circuit 300 as it is fabricated according to the exemplary fabrication process 400. In this regard, the exemplary fabrication process 400 in FIGS. 4A and 4B and the exemplary fabrication stages of the circuit 300 in FIGS. 5A-1-5D-2 will be discussed in conjunction with each other below.

Figures 2, 11A:
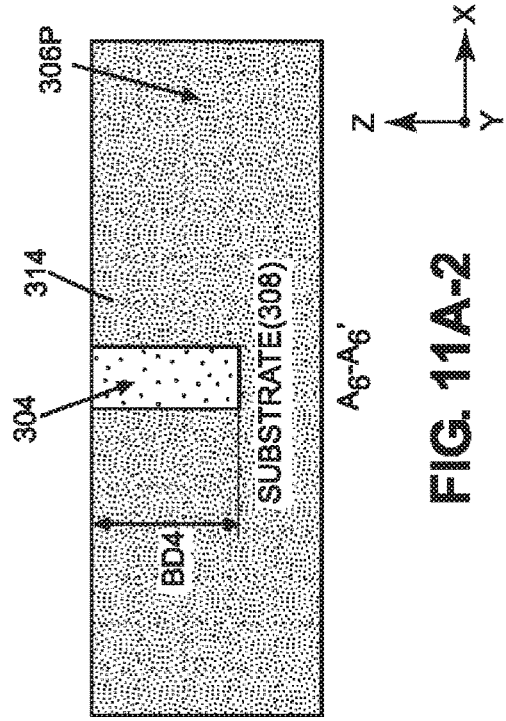
Figures 3, 11A:
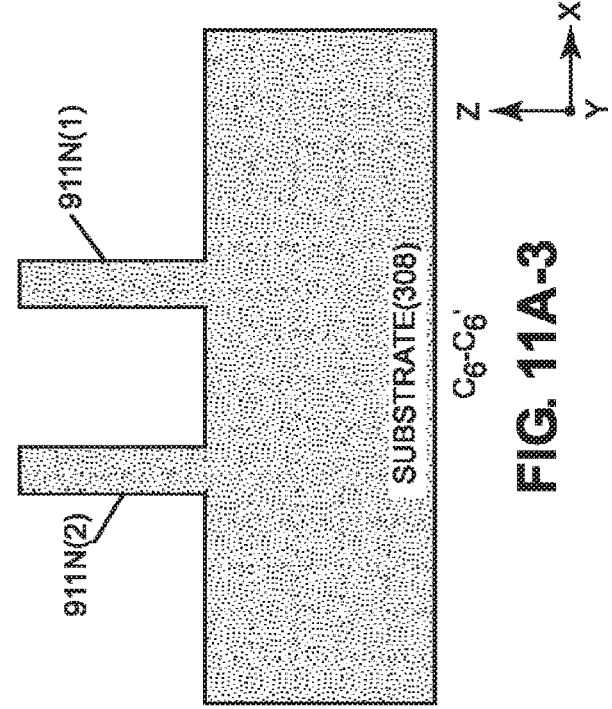
Figures 1, 11A:
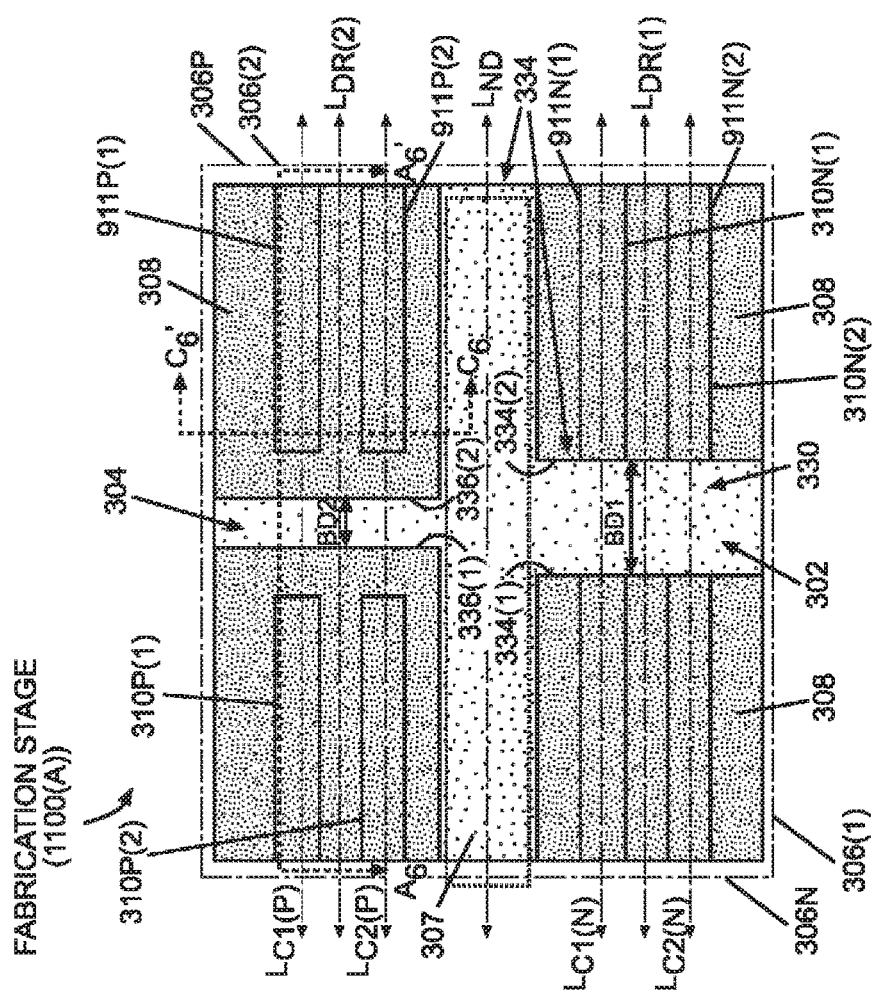

In this regard, with reference to FIG. 4A, a first exemplary step in the process 400 of fabricating the circuit 300 in FIGS. 3A-3C is to form the substrate 308 from a semiconductor material, such as Silicon (Si) for example, the substrate 308 comprising a top surface 314 (block 402 in FIG. 4A). This is shown by example in the fabrication stage 500(A) in FIGS. 5A-1-5A-3. FIG. 5A-1 is a top view of the exemplary fabrication stage 500(A). FIGS. 5A-2 and 5A-3 are cross-sectional views taken in the respective $A_1$-$A_1$' and $B_1$-$B_1$' cross-sections of the substrate 308 in FIG. 5A-1. As shown in FIGS. 5A-1-5A-3, the first diffusion region 306(1) as the N-type diffusion region 306N is formed in the substrate 308, the first diffusion region 306(1) having a first longitudinal axis $L_{DR}(1)$ in a first direction and comprising either an N-type or P-type diffusion region 306N or 306P in the substrate 308 (block 404 in FIG. 4A).

A next exemplary step in the process 400 of fabricating the circuit 300 in FIGS. 3A-3C can be to form the second diffusion region 306(2) as the P-type diffusion region 306P in the substrate 308, such that the second diffusion region 306(2) is separated from the first diffusion region 306(1) by a non-diffusion region 307, the second diffusion region 306(2) having a second longitudinal axis $L_{DR}(2)$ parallel to the first longitudinal axis $L_{DR}(1)$, and the second diffusion region 306(2) comprising either a P-type diffusion region 306P or an N-type diffusion region 306N opposite of the diffusion type of the first diffusion region 306(1) in the substrate 308 (block 406 in FIG. 4A). The N-type semiconductor channels 310N(1), 310N(2) are formed in the N-type diffusion region 306N and the P-type semiconductor channels 310P(1), 310P(2) are formed in the P-type diffusion region 306P. In the circuit 300, the N-type and P-type semiconductor channels 310N(1), 310N(2) and 310P(1), 310P(2) may be formed as fins in the N-type and P-type diffusion regions 306N and 306P. The N-type semiconductor channels 310N(1), 310N(2) each have a longitudinal axis in the first direction in the first diffusion region 306N and the P-type semiconductor channels 310P(1), 310P(2) each have a longitudinal axis in the first direction in the second diffusion region 306P. The N-type and P-type diffusion regions 306N, 306P are separated by the non-diffusion region 307 that is not doped with a P-type or N-type impurity material. The N-type and P-type diffusion regions 306N, 306P have longitudinal axes $L_{DR}(1)$, $L_{DR}(2)$ that are parallel to each other, extending in a first direction.

In a next exemplary step in the process 400 of fabricating the circuit 300 in FIGS. 3A-3C, the first DB 302 is formed in the substrate in the first diffusion region 306(1), the first DB 302 having a first width dimension BD1 in a first direction (e.g., X-axis direction parallel to the longitudinal axis $L_{DR}(N)$ of the N-type diffusion region 306N) from a first side 334(1) to a second side 334(2) of the first DB 302 (block 408 in FIG. 4A). The second DB 304 is formed in the substrate 308 in the second diffusion region 306(2), the second DB 304 having a width dimension BD2 in the first direction (e.g., X-axis direction) from a first side 336(1) to a second side 336(2) of the second DB 304 (block 410 in FIG. 4A). Forming the first DB 302 exerts a first stress S1 in the first direction (e.g., X-axis direction) in at least one of the N-type semiconductor channel structures 310N(1), 310N(2), and forming the second DB 304 exerts a second stress S2 in the first direction (e.g., X-axis direction) in at least one of the P-type semiconductor channel structures 310P(1), 310P(2). Since the second DB 304 is narrower in the X-axis direction than the first DB 302, the second stress S2 exerted by the second DB 304 has a different (e.g., lower) magnitude than the first stress S1 exerted by the first DB 302. In some examples, the first and second stresses S1, S2 in the first direction are each a compressive stress and, in other examples, the first and second stresses S1, S2 in the first direction are each a tensile stress. The first stress S1 induces a first strain in the first direction in at least one of the N-type semiconductor channel structures 310N(1), 310N(2) and the second stress S2 in the first direction induces a second strain in the first direction in at least one of the P-type semiconductor channel structures 310P(1), 310P(2), with the second strain having a different (e.g., lower) magnitude than the first strain. The first and second strains may each be due to compression in one example and may each be due to tension in another example.

Note that in this example, the first DB 302 and the second DB 304 are formed before a replacement metal gate (RMG) process, such that the first DB 302 and the second DB 304 may be subject to higher temperatures that may well exceed 400 degrees Celsius for example. This can cause the first and second DBs 302, 304 to contract at a different rate than the substrate 308 upon cooling, thus causing a tensile stress to occur in the substrate 308 in the N-type diffusion region 306N, which induces a tensile strain in the substrate 308 in the N-type diffusion region 306N. This may be desired to increase carrier mobility of NFETs having semiconductor channels formed from the substrate 308, such as NFET 312N in the circuit 300 in FIGS. 3A-3C.

As an example, the shallow trenches 326N and 326P that form the first and second DBs 302, 304 may be etched into the substrate 308 into the pattern that is illustrated in FIG. 5A-1 after transfer using a lithography process of transferring a photoresist layer above the substrate 308, forming a patterned mask above the photoresist layer, and exposing the substrate 308 through openings in the mask to form openings in the photoresist layer for controlling the areas of the shallow trenches 326N and 326P to be etched. The shallow trenches 326N and 326P may then be filled with insulating material such as the trench isolation material 330 to form the first and second DBs 302, 304. Note that it is not required for the shallow trenches 326N and 326P to extend into the non-diffusion region 307, but doing such may be efficient from a processing standpoint so that the non-diffusion region 307 and the first and second DBs 302, 304 in the N-type diffusion region 306N and the P-type diffusion region 306P, respectively, can be patterned and formed in the same process.

A next exemplary step in the process 400 of fabricating the circuit 300 in FIGS. 3A-3C can be to form a plurality of dummy gates G(1)-G(4) each extending along respective longitudinal axes $L_G(1)$-$L_G(4)$ parallel to each other and orthogonal to the longitudinal axes $L_{DR}(1)$-$L_{DR}(2)$ of the N-type diffusion region 306N and the P-type diffusion region 306P. Each of the plurality of dummy gates G(11)-G(4) is spaced apart from each other by the gate pitch $G_P$, and the plurality of dummy gates G(1)-G(4) includes a first dummy gate G(2) and a second dummy gate G(3) adjacent to opposite sides 334(1), 334(2) and 336(1), 336(2) of the first and second DBs 302, 304 (block 412 in FIG. 4B). The dummy gates G(1)-G(4) may be formed as Polysilicon gates. This is shown by example in the fabrication stage 500(B) in FIGS. 5B-1-5B-3. FIG. 5B-1 is a top view of the exemplary fabrication stage 500(B). FIGS. 5B-2 and 5B-3 are cross-sectional views taken in the respective $A_1$-$A_1$' and $B_1$-$B_1$' cross-sections of the substrate 308 in FIG. 5B-1. As shown in FIGS. 5B-2 and 5B-3, spacers 501(1)(1)-501(4)(2)

are formed on sides of the respective dummy gates G(1)-G (4) to facilitate removal (e.g., by lithography and etching process) of dummy gate material and replacement with a metal material as a part of an RMG process.

A next exemplary step in the process 400 of fabricating the circuit 300 in FIGS. 3A-3C includes forming source and drain regions in the first and second diffusions regions 306(1) and 306(2) (block 414 in FIG. 4B). For example, the source regions $S_N$, $S_P$ and the drain regions $D_N$, $D_P$ may be formed by epitaxial growth or ion implantation on portions of the N-type and P-type diffusion regions 306N and 306P. In the circuit 300 in FIG. 3A, the source and drain regions may be grown on the semiconductor channel structures 310N(1), 310N(2) and 310P(1), 310P(2). This is shown by example in the fabrication stage 500(C) in FIGS. 5C-1-5C-3. FIG. 5C-1 is a top view of the exemplary fabrication stage 500(C). FIGS. 5C-2 and 5C-3 are cross-sectional views taken in the respective $A_1$-$A_1'$ and $B_1$-$B_1'$ cross-sections of the substrate 308 in FIG. 5C-1.

In a next exemplary step in the process 400 of fabricating the circuit 300 in FIGS. 3A-3C, as shown in FIGS. 5C-2 and 5C-3, a first active gate AG(1) is formed spaced apart from the first dummy gate G(2) by the gate pitch $G_P$ and above the first diffusion region 306(1) and the second diffusion region 306(2), and a second active gate AG(2) is formed spaced apart from the second dummy gate G(3) by the gate pitch $G_P$ and above the first diffusion region 306(1) and the second diffusion region 306(2) (block 416 in FIG. 4B). The first and second active gates AG(1) and AG(2) are formed by replacing the dummy gate material in dummy gates G(1) and G(4) with a conductive material, such as a metal material. This is shown by example in the fabrication stage 500(C) in FIGS. 5C-1-5C-3. The description of the active gates AG(1), AG(2) and dummy gates G(2), G(3) have been previously described for the circuit 300 in FIGS. 3A and 3B, and thus are not re-described here.

A next exemplary step in the process 400 of fabricating the circuit 300 in FIGS. 3A-3C can be to deposit the ILD 320 above the gates G(1)-G(4) and the N-type and P-type diffusion regions 306N, 306P to provide isolation as previously discussed for the circuit 300 in FIGS. 3A-3C. A top surface 502 of the ILD 320 can be planarized, such as through a chemical mechanical planarization (CMP) process. This is shown by example in the fabrication stage 500(D) in FIGS. 5D-1 and 5D-2. FIGS. 5D-1 and 5D-2 are cross-sectional views taken in the respective $A_1$-$A_1'$ and $B_1$-$B_1'$ cross-sections of the fabrication stage 500(D), which corresponds to the example in fabrication stage 500(C) of FIGS. 5C-1-5C-3 with the ILD 320 formed thereon, as discussed above.

Figure 6A:
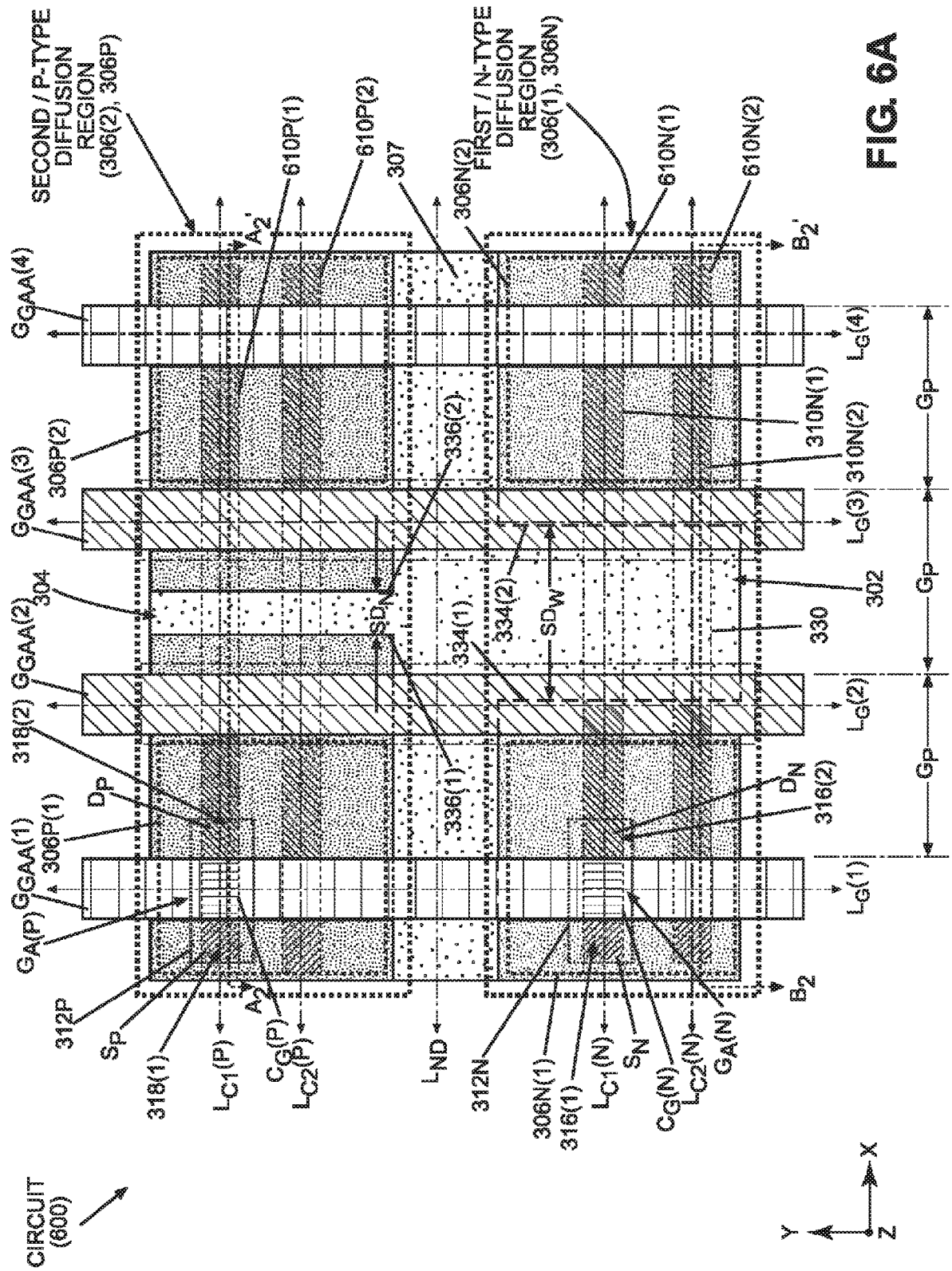
FIG. 6A is a top view of another exemplary circuit employing asymmetric diffusion breaks in different types of diffusion regions to increase carrier mobility in a gate-all-around (GAA) FET(s) formed in one type of diffusion region(s), while reducing or avoiding the degradation of carrier mobility in a GAA FET(s) formed in the other type of diffusion region.

Other types of FETs other than FinFETs can be formed in the circuit 300 in FIGS. 3A-3C. For example, FIGS. 6A-6C illustrate an exemplary circuit 600 that includes a GAA NFET(s) 612N and a GAA PFET(s) 612P and that employs the first DB 302 and the second DB 304 in respective, different types of first and second diffusion regions 306(1), 306(2) to increase carrier mobility in a FET(s) formed in a circuit 600. In this regard, FIG. 6A is a top view of the circuit 600. FIGS. 6B and 6C are cross-sectional views taken in respective cross-sections $A_2$-$A_2'$, $B_2$-$B_2'$ of the circuit 600 in FIG. 6A to further illustrate the first DB 302 in the first diffusion region 306(1) and the second DB 304 in the second diffusion region 306(2). Common elements and components between the circuit 300 in FIGS. 3A-3C and the circuit 600 in FIGS. 6A-6C are illustrated with common element labeling and numbers and thus will not be re-described.

As shown in FIG. 6A, N-type and P-type semiconductor channels 610N(1), 610N(2) and 610P(1), 610P(2) in the form of nano structures (e.g., nanowires, nanoslabs, and nanotubes) are formed in the circuit 600 above the substrate 308 and extend along longitudinal axes $L_{C1}(N)$, $L_{C2}(N)$ and $L_{C1}(P)$, $L_{C2}(P)$ in the X-axis direction. Gates $G_{GAA}(1)$-$G_{GAA}(4)$ are formed in the circuit 600 along respective longitudinal axes $L_G(1)$-$L_G(4)$ in the Y-axis direction, orthogonal to the longitudinal axes $L_{C1}(N)$, $L_{C2}(N)$ and $L_{C1}(P)$, $L_{C2}(P)$ of the N-type and P-type semiconductor channels 610N(1), 610N(2) and 610P(1), 610P(2) in the X-axis direction. The gates $G_{GAA}(1)$-$G_{GAA}(4)$ extend above and around at least a portion of the P-type and N-type semiconductor channels 610P(1), 610P(2) and 610N(1), 610N(2). In one example the gates $G_{GAA}(1)$-$G_{GAA}(4)$ extend all the way around the N-type and P-type semiconductor channels 610N(1), 610N(2) and 610P(1), 610P(2). Gates $G_{GAA}(1)$ and $G_{GAA}(4)$ in the circuit 600 are active gates of a conductive material, such as metal, (referred to herein as "active gates" $G_{GAA}(1)$ or $G_{GAA}(4)$). Gates $G_{GAA}(2)$ and $G_{GAA}(3)$ in the circuit 600 are dummy gates of a dielectric material (referred to herein as "dummy gates" $G_GAA(2)$ or $G_{GAA}(3)$). As shown in FIG. 6A, a 3D NFET 612N in the form of a GAA NFET in this example is formed in the N-type diffusion region 306N by forming a source $S_N$ and drain $D_N$ on opposites sides of the active gate $G_{GAA}(1)$ in the N-type diffusion region 306N. Similarly, as shown in FIG. 6A, a 3D PFET 612P the form of a GAA PFET in this example is formed in the P-type diffusion region 306P by forming a source $S_P$ and drain $D_P$ on opposites sides of the active gate $G_{GAA}(1)$ in the P-type diffusion region 306P.

With continuing reference to FIGS. 6A-6C, like circuit 300 in FIGS. 3A-3C, the first DB 302 is formed in the N-type diffusion region 306N of the circuit 600, because the first DB 302 induces a tensile strain in the N-type diffusion region 306N during fabrication of the circuit 600. Inducing tensile strain in the N-type diffusion region 306N can increase carrier mobility of the N-type semiconductor channels 610N(1), 610N(2) formed in the N-type diffusion region 306N. Thus, for example, the tensile strain induced in the N-type semiconductor channels 610N(1), 610N(2) formed in the N-type diffusion region 306N used to form the semiconductor channels of the GAA NFET 612N can increase the drive strength of the GAA NFET 612N. For example, the tensile strain induced by the first DB 302 in the N-type semiconductor channels 610N(1), 610N(2) in the N-type diffusion region 306N may increase the N-type device drive current between approximately five percent (5%) and twenty percent (20%). However, inducing tensile strain in the P-type diffusion region 306P that induces such tensile strain in the P-type semiconductor channels 610P(1), 610P(2) formed in the P-type diffusion region 306P may degrade carrier mobility in the P-type semiconductor channels 610P(1), 610P(2). This would, for example, have the effect of reducing drive strength of the GAA PFET 612P employing the P-type semiconductor channel 610P(1) in the circuit 600. This may not be desired. Thus, as described with regard to the circuit 300 in FIGS. 3A-3C, the second DB 304 having the second dimension BD2 in the P-type diffusion region 306P of the circuit 600, is preferable over a diffusion break having the first dimension BD1 form in both the N-type diffusion region 306N and the P-type diffusion region 306P. This can avoid inducing and/or reducing tensile stress applied to the P-type diffusion region 306P and the P-type semiconductor channels 610P(1), 610P(2) formed therein so as to lessen or avoid reducing carrier mobility in the P-type semiconductor channels 610P(1), 610P(2) and the GAA PFET 612P.

The exemplary fabrication processes of the circuit 300 in FIGS. 4A and 4B and FIGS. 5A-1-5D-2 can be employed to form the first DB 302 and second DB 304 in the circuit 600 in FIGS. 6A-6C.

Figure 7A:
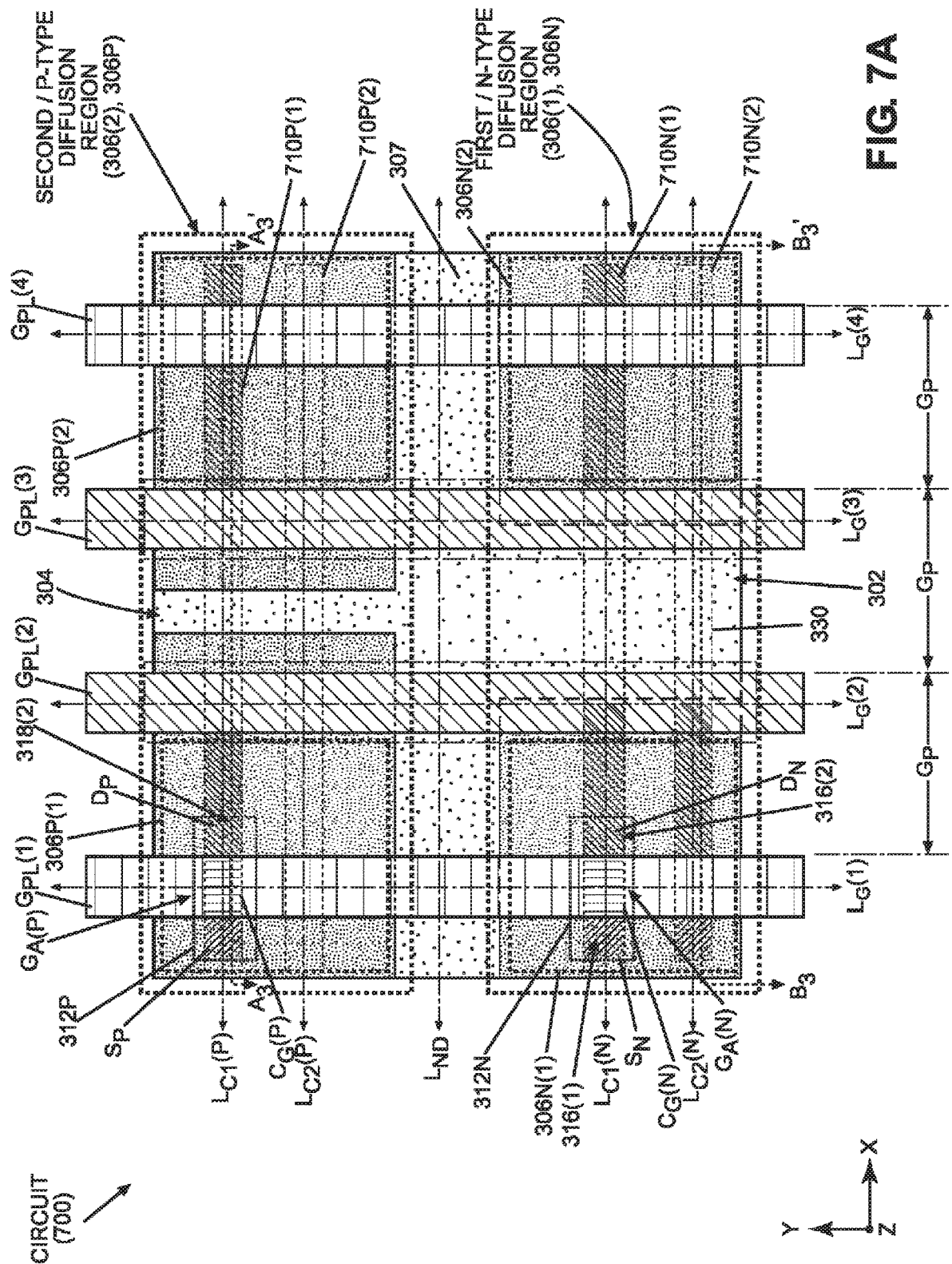
FIG. 7A is a top view of another exemplary circuit employing asymmetric diffusion breaks in different types of diffusion regions to increase carrier mobility in a planar transistor(s) formed in one type of diffusion region(s), while reducing or avoiding the degradation of carrier mobility in a planar transistor(s) formed in the other type of diffusion region.
Figure 7B:
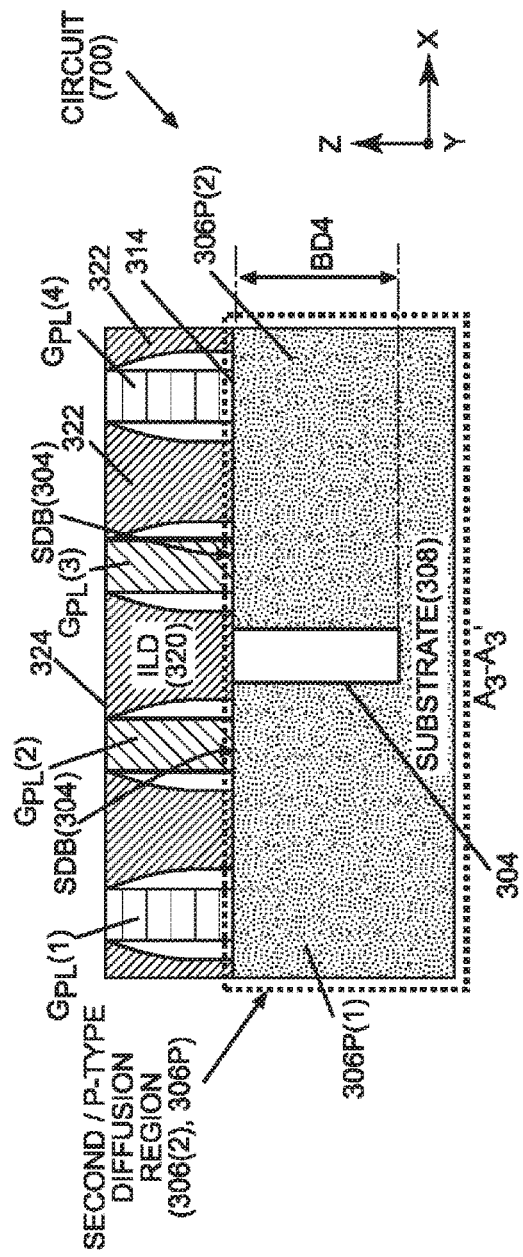
FIGS. 7B and 7C are cross-sectional views taken in respective, different cross-sections of P-type and N-type diffusion regions in the circuit in FIG. 7A to further illustrate first diffusion break having a first dimension in the N-type diffusion region and a second diffusion break having a second dimension in the P-type diffusion region.
Figure 7C:
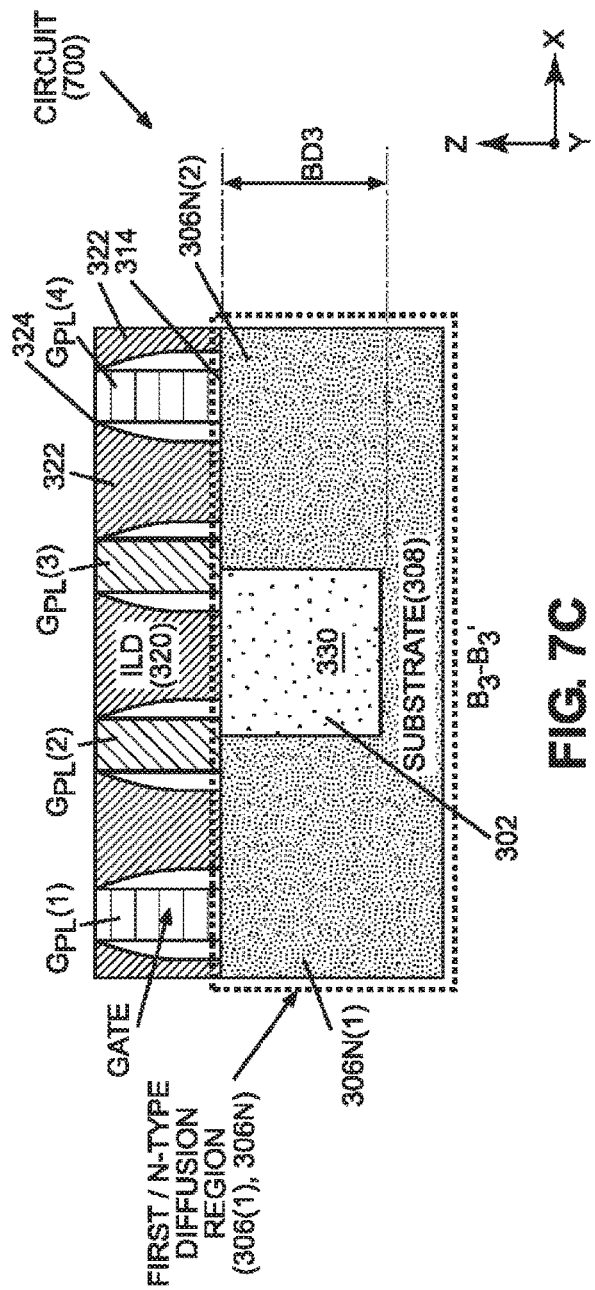

FIGS. 7A-7C illustrate an exemplary circuit 700 that includes a planar NFET(s) 712N and a planar PFET(s) 712P and that employs the first DB 302 and the second DB 304 in respective, different types of first and second diffusion regions 306(1), 306(2) to increase carrier mobility in a FET(s) formed in a circuit 700. FIG. 7A is a top view of the circuit 700. FIGS. 7B and 7C are cross-sectional views taken in respective cross-sections $A_3$-$A_3'$, $B_3$-$B_3'$ of the circuit 700 in FIG. 7A to further illustrate the first DB 302 in the first diffusion region 306(1) and the second DB 304 in the second diffusion region 306(2). Common elements and components between the circuit 300 in FIGS. 3A-3C and the circuit 700 in FIGS. 7A-7C are illustrated with common element labeling and numbers and thus will not be re-described.

As shown in FIG. 7A, N-type and P-type semiconductor channels 710N(1), 710N(2) and 710P(1), 710P(2) in the form of planar channels are formed in the circuit 700 in the substrate 308 and extend along longitudinal axes $L_{C1}(N)$, $L_{C2}(N)$ and $L_{C1}(P)$, $L_{C2}(P)$ in the X-axis direction. Gates $G_{PL}(1)$-$G_{PL}(4)$ in the circuit 700 are formed in the circuit 700 along longitudinal axes $L_G(1)$-$L_G(4)$ in the Y-axis direction, orthogonal to the longitudinal axes $L_{C1}(N)$, $L_{C2}(N)$ and $L_{C1}(P)$, $L_{C2}(P)$ of the N-type and P-type semiconductor channels 710N(1), 710N(2) and 710P(1), 710P(2) in the X-axis direction. The gates $G_{PL}(1)$-$G_{PL}(4)$ extend above the N-type and P-type semiconductor channels 710N(1), 710N(2) and 710P(1), 710P(2). Gates $G_{PL}(1)$ and $G_{PL}(4)$ in the circuit 700 are active gates of a conductive material, such as metal, (referred to herein as "active gates" $G_{PL}(1)$ or $G_{PL}(4)$). Gates $G_{PL}(2)$ and $G_{PL}(3)$ are dummy gates of a dielectric material (referred to herein as "dummy gates" $G_{PL}(2)$ or $G_{PL}(3)$). As shown in FIG. 7A, a planar NFET 712N in this example is formed in the N-type diffusion region 306N by forming a source $S_N$ and drain $D_N$ on opposites sides of the active gate $G_{PL}(1)$ in the N-type diffusion region 306N. Similarly, as shown in FIG. 7A, a planar PFET 712P in this example is formed in the P-type diffusion region 306P by forming a source $S_P$ and drain $D_P$ on opposites sides of the active gate $G_{PL}(1)$ in the P-type diffusion region 306P.

With continuing reference to FIGS. 7A-7C, like the circuit 300 in FIGS. 3A-3C, the first DB 302 is formed in the N-type diffusion region 306N of the circuit 700, because the first DB 302 induces a tensile strain in the N-type diffusion region 306N during fabrication of the circuit 700. Inducing tensile strain in the N-type diffusion region 306N can increase carrier mobility of the N-type semiconductor channels 710N(1), 710N(2) formed in the N-type diffusion region 306N. Thus for example, the tensile strain induced in the N-type semiconductor channels 710N(1), 710(2) formed in the N-type diffusion region 306N used to form the semiconductor channel of the planar NFET 712N can increase the drive strength of the planar NFET 712N. For example, the tensile strain induced by the first DB 302 in the N-type semiconductor channel 710N(1) in the N-type diffusion region 306N may increase the N-type device drive current between approximately five percent (5%) and twenty percent (20%). However, inducing tensile strain in the P-type diffusion region 306P that induces such tensile strain in the P-type semiconductor channels 710P(1), 710P(2) formed in the P-type diffusion region 306P may degrade carrier mobility in the P-type semiconductor channel 710P(1), 710P(2). This would, for example, have the effect of reducing drive strength of the planar PFET 712P employing the P-type semiconductor channel 710P(1) in the circuit 700. This may not be desired. Thus, as described with regard to the circuit 700 in FIGS. 3A-3C, the second DB 304 having the second dimension BD2 in the P-type diffusion region 306P of the circuit 300 is preferable over a diffusion break having the first dimension BD1 formed in both the N-type diffusion region 306N also into the P-type diffusion region 306P. This can avoid inducing and/or reducing tensile stress applied to the P-type diffusion region 306P and the P-type semiconductor channels 710P(1), 710P(2) formed therein so as to lessen or avoid reducing carrier mobility in the P-type semiconductor channel 710P(1), 710P(2) and the planar PFET 712N.

The exemplary fabrication processes of the circuit 300 in FIGS. 4A and 4B and FIGS. 5A-1-5D-2 can be employed to form the first DB 302 and narrower DB 304 in the circuit 700 in FIGS. 7A-7C.

In another exemplary aspect, if a first DB 302 will induce a compressive strain in the diffusion regions of the circuit, a first DB 302 can be formed in the P-type diffusion region(s) of the circuit, and a second DB 302 formed in the N-type diffusion region(s) of the circuit, opposite of the circuit 300 in FIGS. 3A-3C. Inducing compressive strain in the P-type diffusion region(s) can increase carrier mobility of a semiconductor channel of a P-type semiconductor device(s) formed in the P-type diffusion region(s), but reduce carrier mobility in a semiconductor channel of an N-type semiconductor device(s). Thus, in this aspect, a second DB 304 is formed in the N-type diffusion region(s) to avoid inducing or reducing tensile stress to the N-type diffusion region(s) so as to not reduce carrier mobility of an N-type semiconductor device(s) formed in the N-type diffusion region(s) that may result from a first DB 302.

Figure 8A:
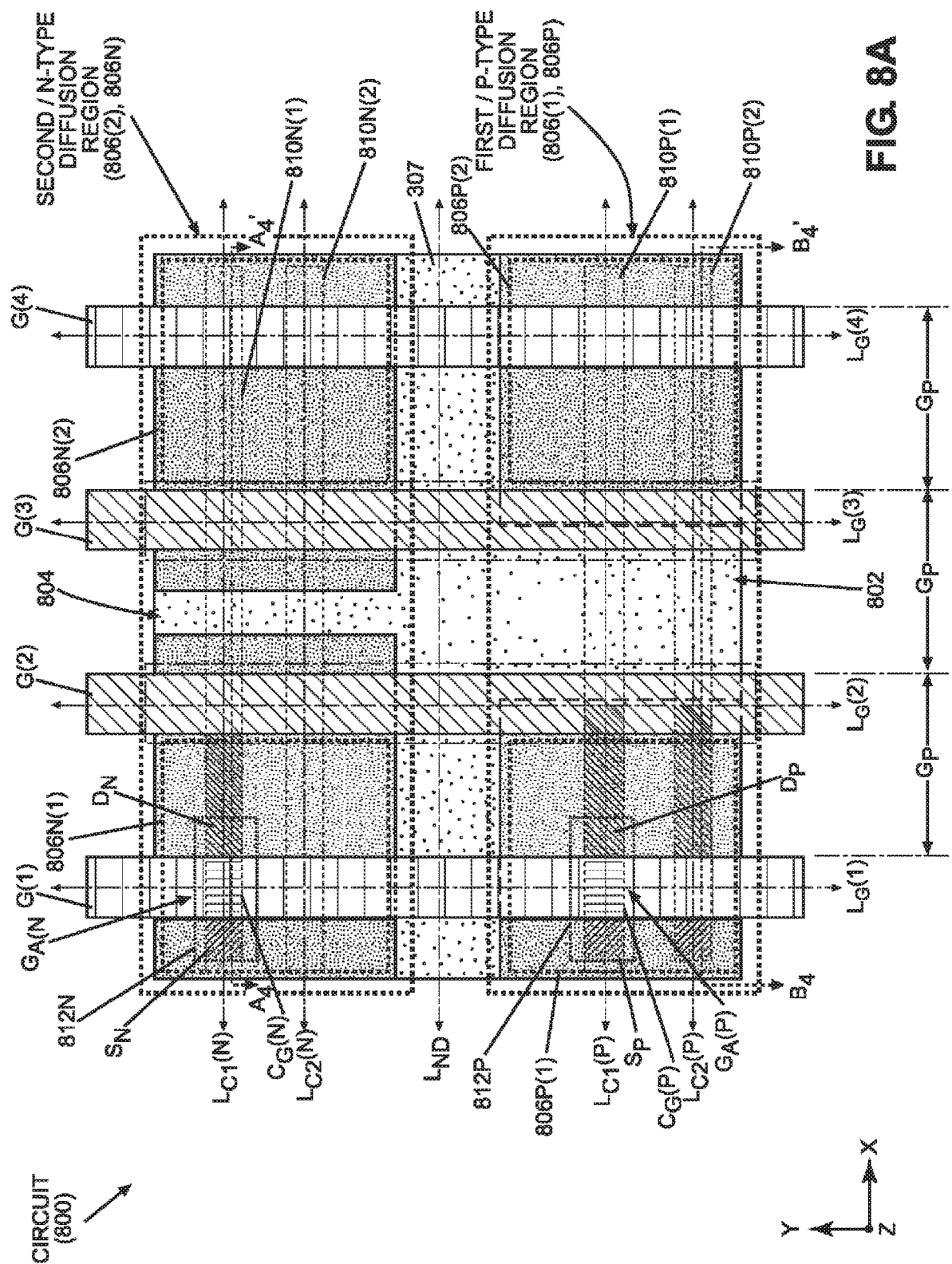
FIG. 8A is a top view of a circuit employing a diffusion break having a first dimension in a P-type diffusion region of the circuit to induce compressive stress in the P-type diffusion region, and a diffusion break having a second dimension in an N-type diffusion region of the circuit to increase carrier mobility in semiconductor device(s) formed in the P-type diffusion region(s), while reducing or avoiding the degradation of carrier mobility in semiconductor device(s) formed in the N-type diffusion region.
Figure 8B:
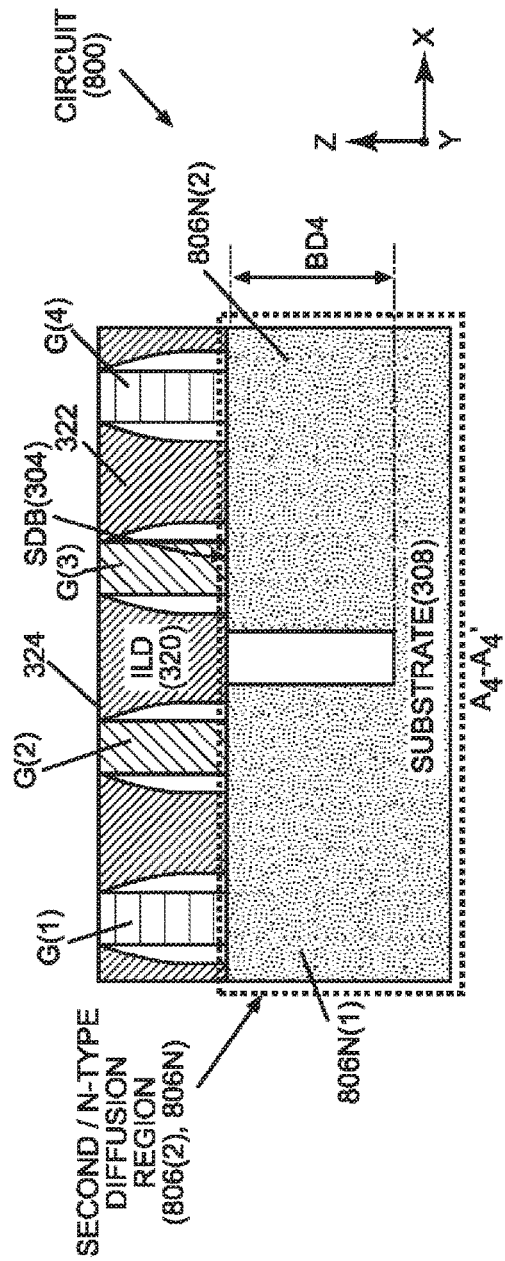
FIGS. 8B and 8C are cross-sectional views taken in respective, different cross-sections of P-type and N-type diffusion regions in the circuit in FIG. 8A to further illustrate the diffusion break having the first dimension in the P-type diffusion region and the diffusion break having the second dimension in the N-type diffusion region.
Figure 8C:
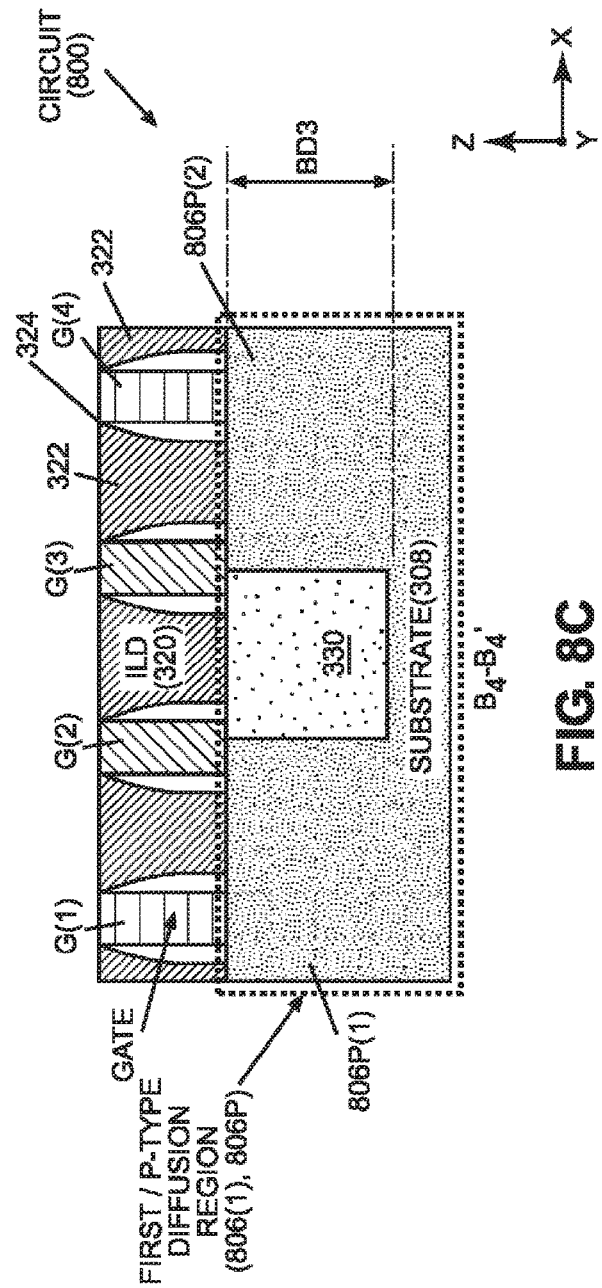

In this regard, FIGS. 8A-8C illustrate an exemplary circuit 800 employing a first DB 802 and a second DB 804 in respective, different types of first and second diffusion regions 806(1), 806(2) to increase carrier mobility in a FET(s) formed in the circuit 800. FIG. 8A is a top view of the circuit 800. FIGS. 8B and 8C are cross-sectional views taken in respective cross-sections $A_4$-$A_4$, $B_4$-$B_4$ of the circuit 800 in FIG. 8A to further illustrate the first DB 802 in the first diffusion region 806(1) and the second DB 804 in the second diffusion region 806(2). Common elements and components between the circuit 800 in FIGS. 8A-8C and the circuit 800 in FIGS. 3A-3C are shown with common element numbers or labeling and thus will not be re-described.

In this example of the circuit 800 in FIGS. 8A-8C, the first diffusion region 806(1) is a P-type diffusion region 806(1) (also labeled "806P"), and the second diffusion region is an N-type diffusion region 806(2) (also labeled "806N"). For example, the N-type diffusion region 806N may be formed by doping a portion of a semiconductor substrate 308 (e.g., Silicon (Si)) with a pentavalent impurity material as a donor material that is able to give up free electrons in the substrate 308. Likewise as an example, the P-type diffusion region 806P may be formed by doping a portion of the semiconductor substrate 308 with an impurity material that is able to leave holes in the substrate 308. In this example, the first DB 802 is formed in the P-type diffusion region 806P, and the second DB 804 is formed in the N-type diffusion region 806N. Also note that the P-type diffusion region 806P is formed in the circuit 800 according to a circuit cell as one diffusion region, but is separated into two P-type diffusion sub-regions 806P(1), 806P(2) by the first DB 802. Likewise, note that the N-type diffusion regions 806N is formed in the circuit 800 according to a circuit cell as one diffusion region, but is separated into two N-type diffusion sub-regions 806N(1), 806N(2) by the second DB 804. Also note that there is the non-diffusion region 307 having a longitudinal axis $L_{ND}$ in the X-axis direction between the P-type diffusion region 806P and the N-type diffusion region 806N in the circuit 800.

As shown in FIG. 8A, a 3D N-type FET (NFET) 812N in the form of a FinFET in this example is formed in the N-type diffusion region 806N by forming a source $S_N$ and drain $D_N$ on opposites sides of the active gate G(1) in the N-type diffusion region 906N. Similarly, as shown in FIG. 8A, a 3D PFET 912P also in the form of a FinFET in this example is formed in the P-type diffusion region 806P by forming a source $S_P$ and drain $D_P$ on opposites sides of the active gate G(1) in the P-type diffusion region 806P.

With continuing reference to FIGS. 8A-8C, the first DB 802 is formed in the P-type diffusion region 806P of the circuit 800 in this example, because the first DB 802 induces a compressive strain in the P-type diffusion region 806P during fabrication of the circuit 800. Inducing compressive strain in the P-type diffusion region 806P can increase carrier mobility of the P-type semiconductor channels 810P(1), 810P(2) formed in the P-type diffusion region 806P. Thus for example, the compressive strain induced in the P-type semiconductor channels 810P(1), 810P(2) used to form the semiconductor channel of the PFET 812P can increase the drive strength of the PFET 812P. For example, the compressive strain induced by the first DB 802 in the P-type semiconductor channels 810P(1), 810P(2) in the P-type diffusion region 806P may increase the P-type device drive current between approximately five percent (5%) and twenty percent (20%). However, inducing compressive strain in the N-type diffusion region 806N that induces such tensile strain in the N-type semiconductor channels 810N(1), 810N(2) formed in the N-type diffusion region 806N may degrade carrier mobility in the N-type semiconductor channels 810N(1), 810N(2). This would, for example, have the effect of reducing drive strength of the NFET 812N employing the N-type semiconductor channels 810N(1) in the circuit 800. This may not be desired. Thus, in this example, the second DB 804 having the second dimension BD2 in the N-type diffusion region 806N of the circuit 800 is preferable over a diffusion break having the first dimension BD1 formed in both the P-type diffusion region 806P into the N-type diffusion region 806N. This can avoid inducing and/or reducing compressive stress applied to the N-type diffusion region 806N and the N-type semiconductor channels 810N(1), 810N(2) formed therein so as to lessen or avoid reducing carrier mobility in the N-type semiconductor channels 810N(1), 810N(2) and the NFET 812N.

In this manner, the first DB 802 can be formed in the circuit 800 in FIGS. 8A-8C to purposefully induce compressive strain in the P-type diffusion region 806P and the P-type semiconductor channels 810P(1), 810P(2) formed therein to increase drive strength of PFETs formed in the P-type diffusion region 806P, such as PFET 812P. However, reducing carrier mobility of the N-type semiconductor channels 810N(1), 810N(2) in the N-type diffusion region 806N may be avoided to avoid decreasing the drive strength of NFETs, such as NFET 812N, formed in the N-type diffusion region 806N. Additional aspects of the circuit 800 in FIGS. 8A-8C are discussed above with regard to the circuit 300 in FIGS. 3A-3C and thus are not re-described. The exemplary fabrication processes of the circuit 300 in FIGS. 4A and 4B and FIGS. 5A-1-5D-2 can be employed to form circuit 800 in FIGS. 8A-8C.

Figure 9A:
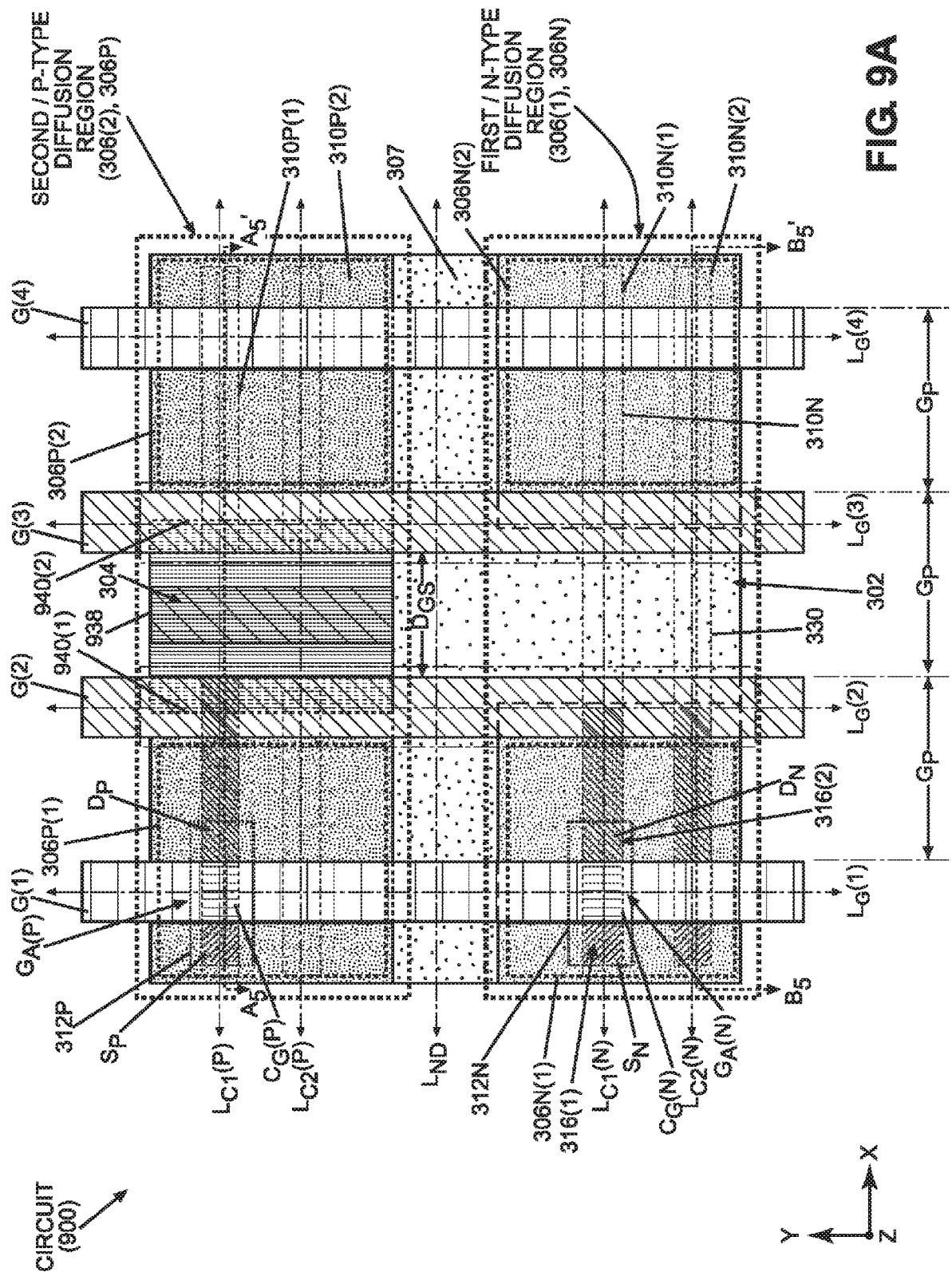
FIG. 9A is a top view of an exemplary circuit employing a diffusion break with a first dimension in an N-type diffusion region and an diffusion break with a second dimension in a P-type diffusion region to increase carrier mobility in a FinFET(s) formed in one type of diffusion region(s), while reducing or avoiding the degradation of carrier mobility in a FinFET(s)) formed in the other type of diffusion region, and an insulator to cover the diffusion break with the second dimension in the P-type diffusion region to avoid electric shorts across the diffusion break due to defects.
Figure 9B:
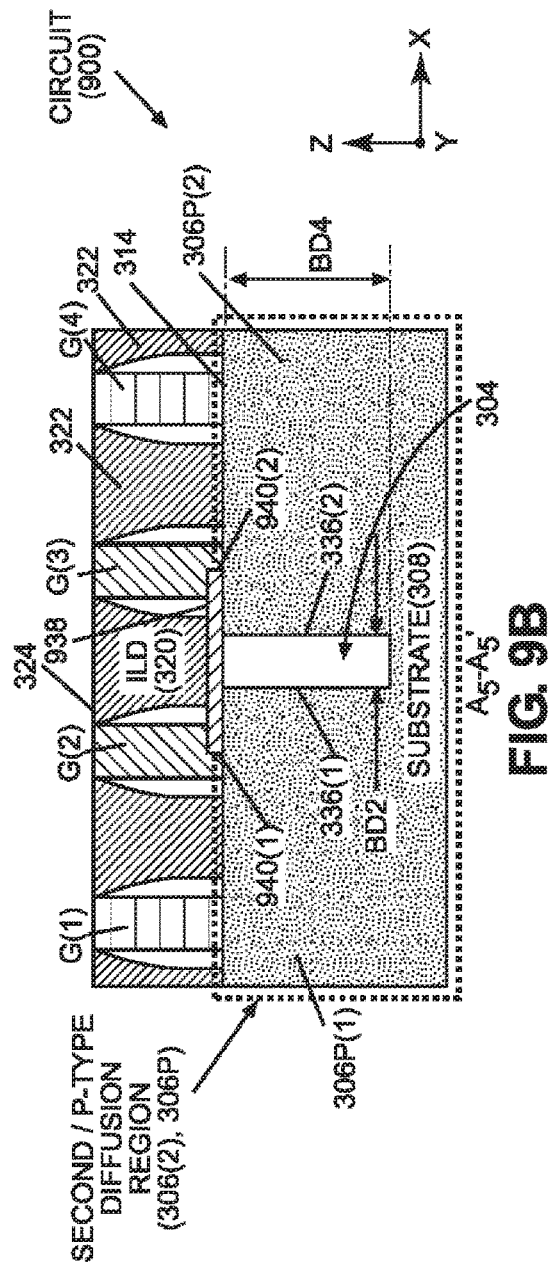
FIGS. 9B and 9C are cross-sectional views taken in respective, different cross-sections of the P-type diffusion region in the circuit in FIG. 9A to further illustrate the diffusion break having the second dimension in the P-type diffusion region and the insulator to cover the diffusion break with the second dimension.
Figure 9C:
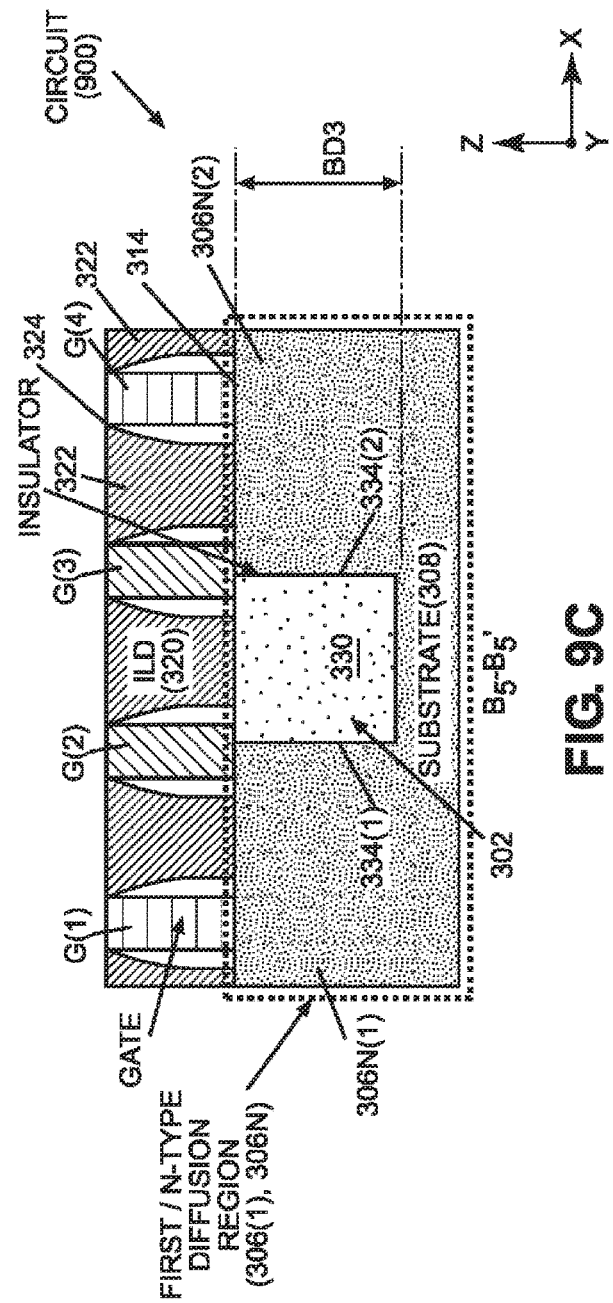

In another example, reliability of the circuit 300 in FIGS. 3A-3C can be increased by adding at least one feature to avoid defects. For example, FIGS. 9A-9C illustrate an exemplary circuit 900 that employs the first DB 302 and the narrower DB 304 in respective, different types of first and second diffusion regions 306(1), 306(2) to increase carrier mobility in a FET(s) formed in a circuit 900. In addition, the circuit 900 also employs an insulator 938 formed over the second DB 304 to reduce the possibility of a short circuit caused by defects. In this regard, FIG. 9A is a top view of the circuit 900. FIGS. 9B and 9C are cross-sectional views taken in respective cross-sections $A_5$-$A_5'$, $B_5$-$B_5'$ of the circuit 900 in FIG. 9A to further illustrate the first DB 302 in the first diffusion region 306(1) and the second DB 304 in the second diffusion region 306(2), with the second DB 304 covered by an insulator 938 from the first edge 336(1) to the second edge 336(2). Common elements and components between the circuit 300 in FIGS. 3A-3C and the circuit 900 in FIGS. 9A-9C are illustrated with common element labeling and numbers and thus will not be re-described. As shown in FIG. 9A, N-type and P-type semiconductor channels 310N(1), 310(2) and 310P(1), 310P(2) are formed in the circuit 900 above the substrate 308 and extend along longitudinal axes $L_{C1}(N)$, $L_{C2}(N)$ and $L_{C1}(P)$, $L_{C2}(P)$ in the X-axis direction. The first DB 302 and second DB 304 are formed in the respective N-type and P-type diffusion regions 306N, 306P to provide electrical isolation to impede the flow of electrons or holes between different sub-regions of a diffusion region on opposite sides of the respective first DB 302 and second DB 304 in the X-axis direction.

Figure 9D:
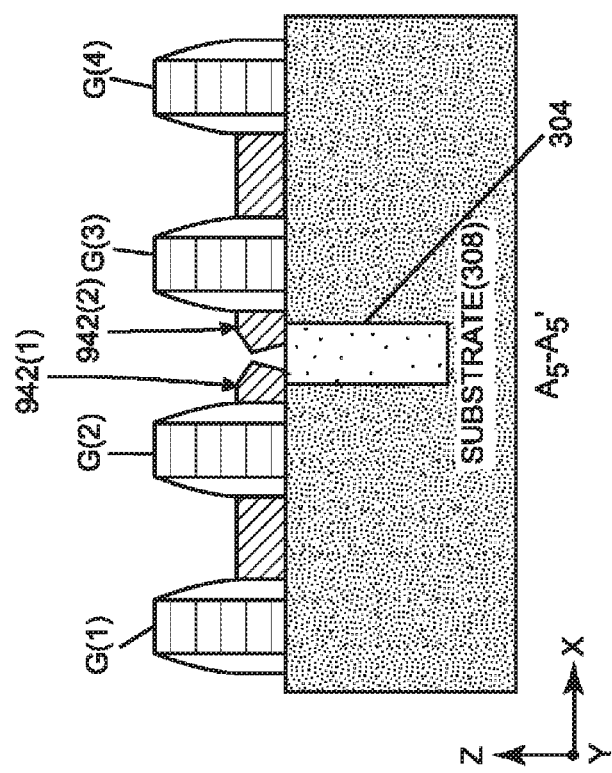
FIG. 9D is a cross-sectional view taken in the P-type diffusion region in the circuit in FIG. 9A to illustrate an example of a defect that may occur in the absence of an insulator to cover the second diffusion break.

As in circuit 300 in FIGS. 3A-3C, gates G(1)-G(4) are formed in the circuit 900 along respective longitudinal axes $L_G(1)$-$L_G(4)$ in the Y-axis direction, orthogonal to the longitudinal axes $L_{C1}(N)$, $L_{C2}(N)$ and $L_{C1}(P)$, $L_{C2}(P)$ of the N-type and P-type semiconductor channels 310N(1), 310N(2) and 310P(1), 310P(2) in the X-axis direction. The gates G(1)-G(4) extend above and around at least a portion of the N-type and P-type semiconductor channels 310N(1), 310N(2) and 310P(1), 310P(2). After gates G(1)-G(4) are formed, the first and second sides 334(1), 334(2) of the first DB 302 are tucked under the dummy gates G(2) and G(3), but the P-type diffusion sub-regions 306P(1) and 306P(2) of the P-type diffusion region 306P are exposed between dummy gates G(2) and G(3) because the dimension BD2 of the second DB 304 is less than a distance $D_{GS}$ between the dummy gates G(2) and G(3). In this regard, during formation of the source regions $S_N$, $S_P$ and the drain regions $D_N$, and $D_P$, defect material 942(1) may be formed (e.g., by epitaxial growth) on the P-type diffusion sub-region 306P(1) of the P-type diffusion region 306P between the first side 336(1) of the second DB 304 and the dummy gate G(2), and defect material 942(2) may be formed on the P-type diffusion sub-region 306P(2) of the P-type diffusion region 306P between the second side 336(2) of the second DB 304 and the dummy gate G(3). A cross-sectional view of the circuit 900 in which the defect materials 942(1) and 942(2) are formed is illustrated in FIG. 9D. Reliability problems may occur due to electrical shorts between the defect material 942(1) of the P-type diffusion sub-region 306P(1) of the P-type diffusion region 306P and the defect material 942(2) of the P-type diffusion sub-region 306P(2) of the P-type diffusion region 306P. As noted above, the first DB 302 provides electrical isolation between the N-type diffusion sub-regions 306N(1) and 306N(2) of the N-type diffusion region 306N and the second DB 304 provides electrical isolation between the P-type diffusion sub-regions 306P(1) and 306P(2) in the P-type diffusion region 306P. An electrical short between the defect materials 942(1) and 942(2) could cause the circuit 900 to function differently than expected or to fail to operate.

Electrical shorts as described above may be avoided by preventing formation of the defect materials 942(1) and 942(2) on the P-type diffusion sub-regions 306P(1) and 306P(2) of the P-type diffusion region 306P. The formation of the defect materials 942(1) and 942(2) can be prevented by forming the insulator 938 on top of the P-type diffusion region 306P to cover the second DB 304, the portion 306P(1) of the P-type diffusion region 306P adjacent to the first side 336(1) of the second DB 304, and the P-type diffusion sub-region 306P(2) of the P-type diffusion region 306P adjacent to the second side 336(2) of the second DB 304. The insulator 938 includes a first edge 940(1) on the first side 336(1) of the second DB 304 and a second edge 940(2) on the second side 336(2) of the second DB 304. The insulator 938 is formed to have a dimension between the first edge 940(1) and the second edge 940(2) such that the first and second edges 940(1) and 940(2) abut or are tucked under the dummy gates G(2) and G(3) after the gates G(1)-G(4) are formed over the P-type diffusion region 306P. In one example, the dimension from the first edge 940(1) to the second edge 940(2) may correspond to the gate pitch $G_P$. An insulator 938 having a dimension between the first edge 940(1) and the second edge 940(2) that is at least as large as the distance $D_{GS}$ between the dummy gates G(2) and G(3), is able to cover all portions of the sub-regions 306P(1) and 306P(2) between dummy gates G(2) and G(3). In this regard, the P-type diffusion sub-region 306P(1) of the P-type diffusion region 306P between the first side 336(1) of the second DB 304 and the dummy gate G(2), and the P-type diffusion sub-region 306P(2) of the P-type diffusion region 306P between the second side 336(2) of the second DB 304 and the dummy gate G(3), are protected by the insulator 938 during formation of the source regions $S_N$, $S_P$ and the drain regions $D_N$, and $D_P$ to prevent formation of the defect materials 942(1) and 942(2). Thus, the insulator 938 provides increased reliability for the circuit 900. In all other aspects, the circuit 900 corresponds to circuit 300 of FIGS. 3A-3C.

Figure 10A:
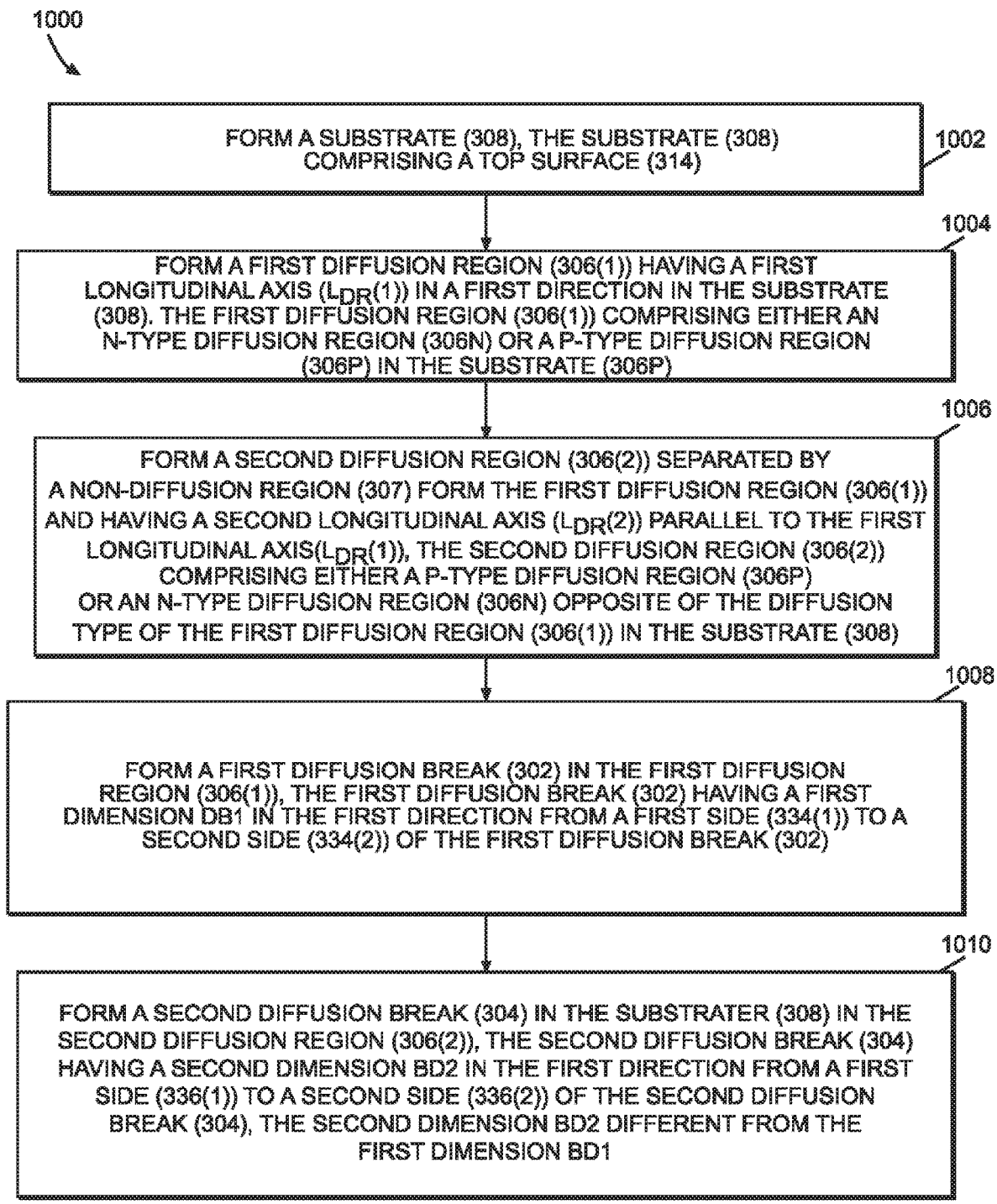
FIGS. 10A and 10B are a flowchart illustrating an exemplary process of fabricating the circuit in FIGS. 9A-9C employing the diffusion break having the first dimension in the N-type diffusion region, the diffusion break having the second dimension in the P-type diffusion region and the insulator to cover the diffusion break with the second dimension.
Figure 10B:
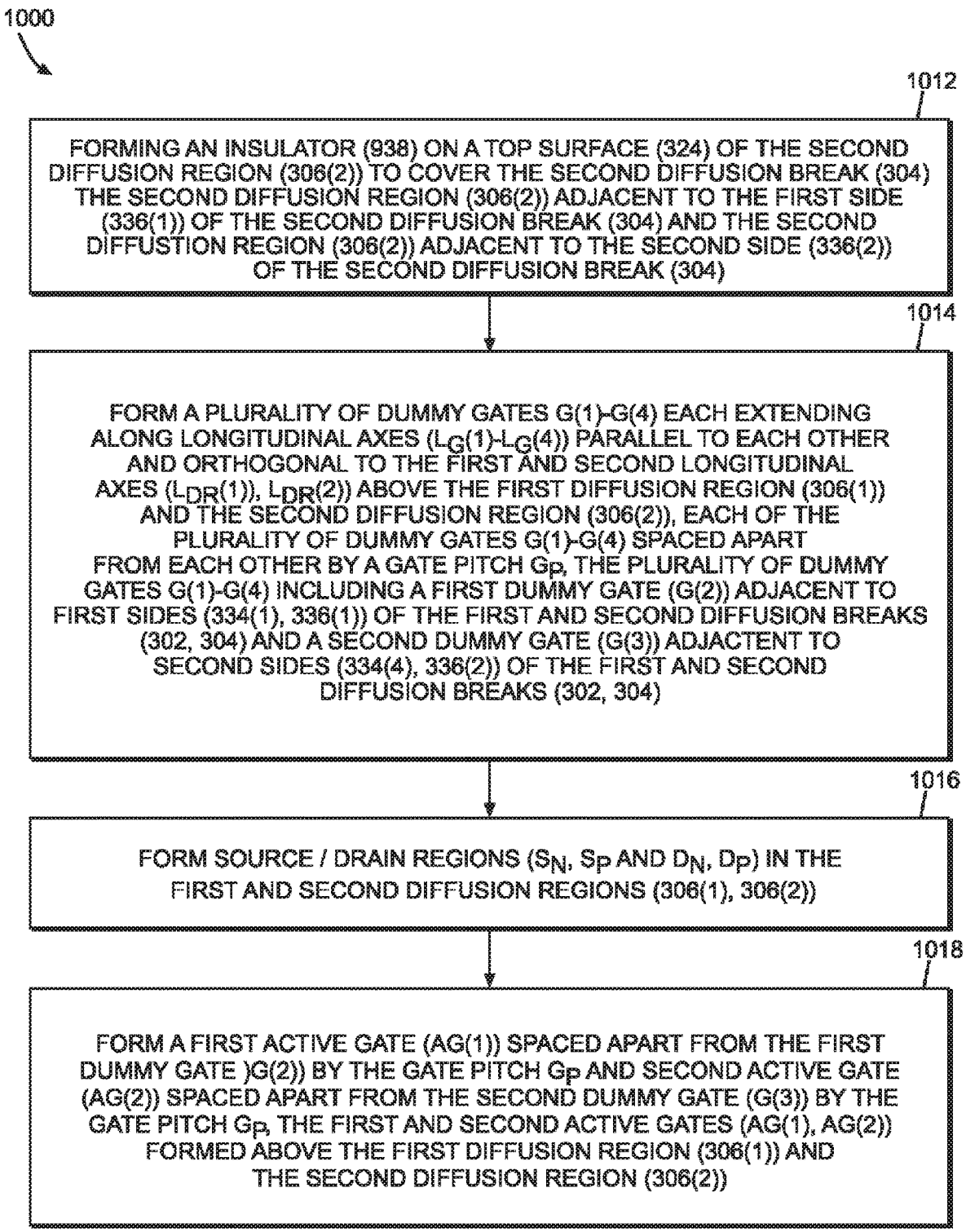

The circuit 900 can be fabricated according to a variety of methods and processes. For example, the circuit 900 can be fabricated according to CMOS fabrication methods. FIGS. 10A and 10B are a flowchart illustrating an exemplary process 1000 of fabricating the circuit 900 in FIGS. 9A-9C employing a first DB 302 in the N-type diffusion region 306N, the second DB 304 in the P-type diffusion region 306P, and the insulator 938 to cover the second DB 304 and P-type diffusion sub-regions 306P(1) and 306P(2) of the P-type diffusion region 306P. FIGS. 11A-1-11E-2 illustrate exemplary fabrication stages of the circuit 900 as it is fabricated according to the exemplary fabrication process 1000. In this regard, the exemplary fabrication process 1000 in FIGS. 10A and 10B and the exemplary fabrication stages of the circuit 900 in FIGS. 11A-1-11E-2 will be discussed in conjunction with each other below.

In this regard, with reference to FIG. 10A, a first exemplary step in the process 1000 of fabricating the circuit 900 in FIGS. 9A-9C is to form the substrate 308 from a semi-conductor material, such as Silicon (Si) for example, the substrate comprising a top surface 314 (block 1002 in FIG. 10A). This is shown by example in the fabrication stage 1100(A) in FIGS. 11A-1-11A-3. FIG. 11A-I is a top view of the exemplary fabrication stage 1100(A). FIGS. 11A-2 and 11A-3 are cross-sectional views taken in the respective $A_6$-$A_6'$ and $C_6$-$C_6'$ cross-sections of the substrate 308 in FIG. 11A-1. As shown in FIGS. 11A-1-11A-3, the first diffusion region 306(1) as the N-type diffusion region 306N is formed in the substrate 308, the first diffusion region 306(1) having a first longitudinal axis $L_{DR}(1)$ in a first direction and comprising either an N-type or P-type diffusion region in the substrate 308 (block 1004 in FIG. 10A).

A next exemplary step in the process 1000 of fabricating the circuit 900 in FIGS. 9A-9C can be to form the second diffusion region 306(2) as the P-type diffusion region 306P in the substrate 308, such that the second diffusion region 306(2) is separated from the first diffusion region 306(1) by a non-diffusion region 307, the second diffusion region 306(2) having a second longitudinal axis $L_{DR}(2)$ parallel to the first longitudinal axis $L_{DR}(2)$, and the second diffusion region 306(2) comprising either a P-type diffusion region 306P or an N-type diffusion region 306N opposite of the diffusion type of the first diffusion region 306(1) in the substrate 308 (block 1006 in FIG. 10A). The N-type semi-conductor channels 310N(1), 310N(2) are formed in the N-type diffusion region 306N and the P-type semiconductor channels 310P(1), 310P(2) are formed in the P-type diffusion region 306P. In the circuit 900, the N-type semiconductor channels 310N(1), 310N(2) may be formed as fins 911N(1), 911N(2) in the N-type diffusion region 306N, and the P-type semiconductor channels 310P(1), 310P(2) may be formed as fins 911P(1), 911P(2) in the P-type diffusion region 306P. The N-type semiconductor channels 310N(1), 310N(2) have longitudinal axes $L_{C1}(N)$, $L_{C2}(N)$ in the first direction in the first diffusion region 306N and the P-type semiconductor channels 310P(1), 310P(2) each have a longitudinal axis $L_{C1}(P)$, $L_{C2}(P)$ in the first direction in the second diffusion region 306P. The N-type and P-type diffusion regions 306N, 306P are separated by the non-diffusion region 307 that is not doped with a P-type or N-type impurity material.

In a next exemplary step in the process 1000 of fabricating the circuit 900 in FIGS. 9A-9C, the first DB 302 can be formed as a first DB structure 302, and the second DB 304 formed as a second DB structure 304. The first DB 302 is formed in the substrate in the first diffusion region 306(1), the first DB 302 having a first DB dimension BD1 in the first direction from a first side 334(1) to a second side 334(2) of the first DB 302 (block 1008 in FIG. 10A). The second DB 304 is formed in the substrate in the P-type diffusion region 306P, the second DB 304 having a second DB dimension BD2 in the first direction from a first side 336(1) to a second side 336(2) of the second DB 304 (block 1010 in FIG. 10A).

A next exemplary step in the process 1000 of fabricating the circuit 900 in FIGS. 9A-9C can be to form an insulator 938 on the second diffusion region 306(2) to cover the second DB 304, the second diffusion region 306(2) adjacent to the first side 336(1) of the second DB 304, and the second diffusion region 306(2) adjacent to the second side 336(2) of the second DB 304 (block 1012 in FIG. 10B). This is shown by example in the fabrication stage 1100(B) in FIGS. 11B-1-11B-3. FIG. 11B-1 is a top view of the exemplary fabrication stage 1100(B). FIGS. 11B-2 and 11B-3 are cross-sectional views taken in the respective $A_1$-$A_1'$ and $C_1$-$C_1'$ cross-sections of the substrate 308 in FIG. 11B-I. As shown in FIG. 11B-2, the edges 940(1) and 940(2) of the insulator 938 extend in the first direction to cover portions of the second diffusion region 306(2) adjacent to the first side 336(1) and the second side 336(2) of the second DB 304. As shown in the cross-section C1-C1' in FIG. 11B-3, the insulator 938 extends onto the fins 911P(1) and 911P(2) which form semiconductor channels in the second diffusion region 306(2).

Figures 2, 11C:
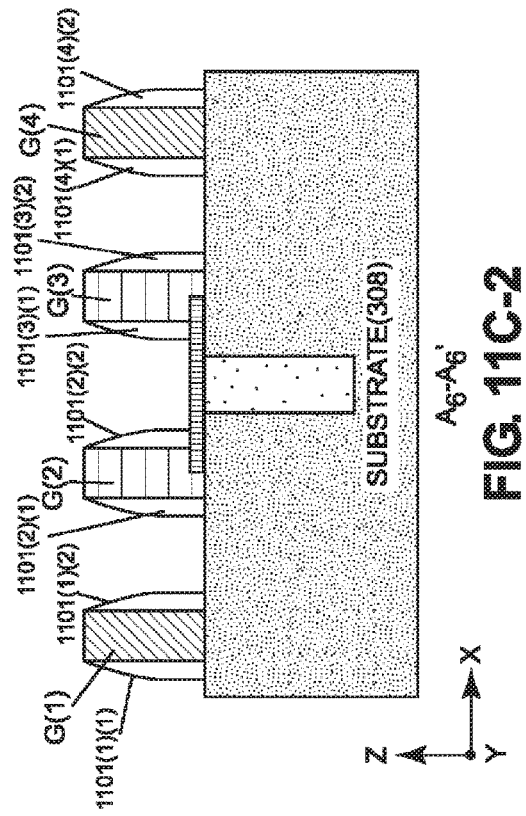
Figures 3, 11C:
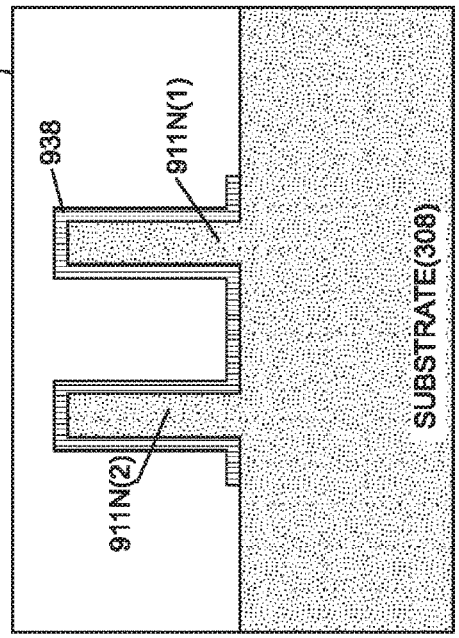
Figures 1, 11C:
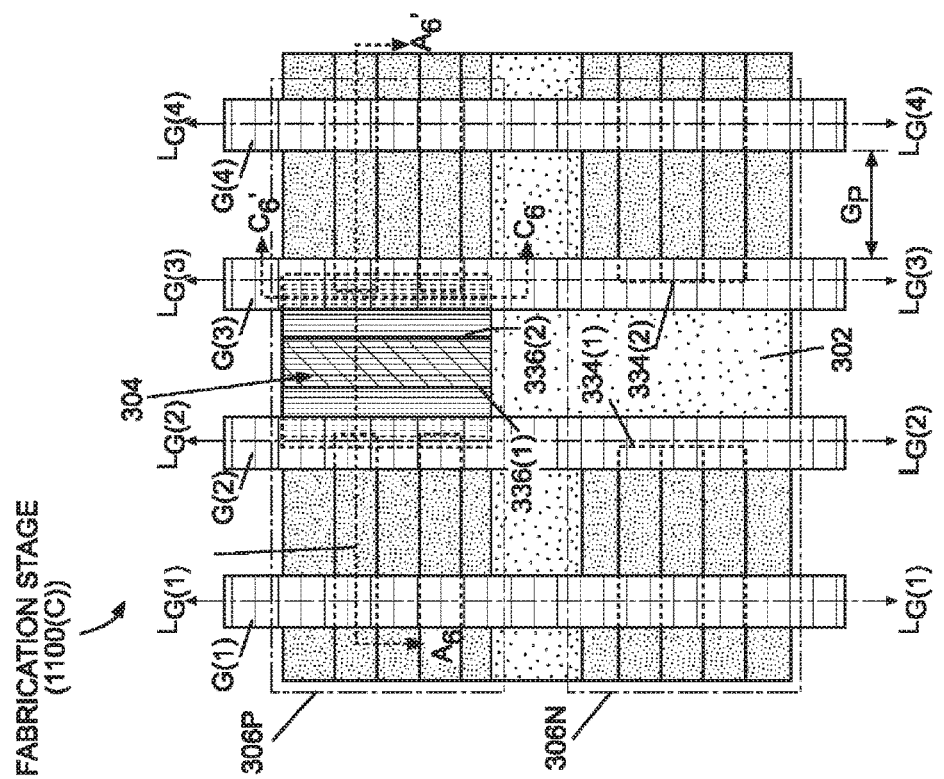

A next exemplary step in the process 1000 of fabricating the circuit 900 in FIGS. 9A-9C can be to form a plurality of dummy gates G(1)-G(4) each extending along respective longitudinal axes $L_G(1)$-$L_G(4)$ parallel to each other and orthogonal to the longitudinal axes $L_{DR}(N)$-$L_{DR}(P)$ of the N-type diffusion region 306N and the P-type diffusion region 306P. Each of the plurality of dummy gates G(1)-G(4) is spaced apart from each other by the gate pitch $G_P$, and the plurality of dummy gates G(1)-G(4) includes a first dummy gate G(2) and a second dummy gate G(3) adjacent to opposite sides 334(1), 334(2) and 336(1), 336(2) of the first DB 302 and second DB 304 (block 1014 in FIG. 10B). As shown in FIGS. 11C-1 and 11C-2, the first dummy gate G(2) covers the first edge 940(1) of the insulator 938 and the second dummy gate G(3) covers the second edge 940(2) of the insulator 938 so that no portion of the second diffusion region 306(2) between the dummy gates G(2) and G(3) is exposed to allow formation of the defect materials 942(1) and 942(2) as shown in FIG. 9D. As shown in the cross-section C1-C1 in FIG. 11C-3, the second dummy gate G(3) is formed above the insulator 938 on the fins 911P(1) and 911P(2). The dummy gates G(1)-G(4) may be formed as Polysilicon gates. This is shown by example in the fabrication stage 1000(C) in FIGS. 11C-1-11C-3. FIG. 11C-1 is a top view of the exemplary fabrication stage 1100(C). FIGS. 11C-2 and 11C-3 are cross-sectional views taken in the respective $A_1$-$C_1'$ and $B_1$-$C_1'$ cross-sections of the substrate 308 in FIG. 11C-1. As shown in FIGS. 11C-2 and 11C-3, spacers 1101(1)(1)-1101(4)(2) are formed on sides of the respective dummy gates G(1)-G(4) to facilitate removal (e.g., by lithography and etching process) of dummy gate material and replacement with a metal material as a part of an RMG process.

Figures 2, 11D:
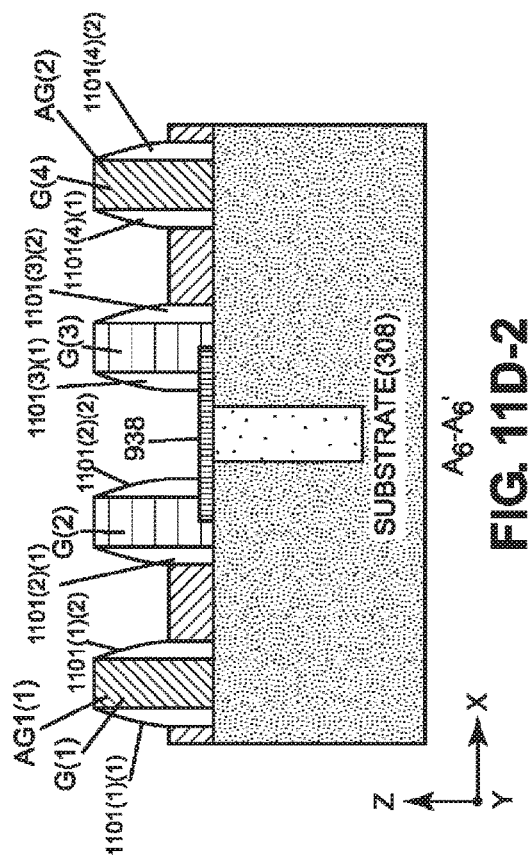
Figures 3, 11D:
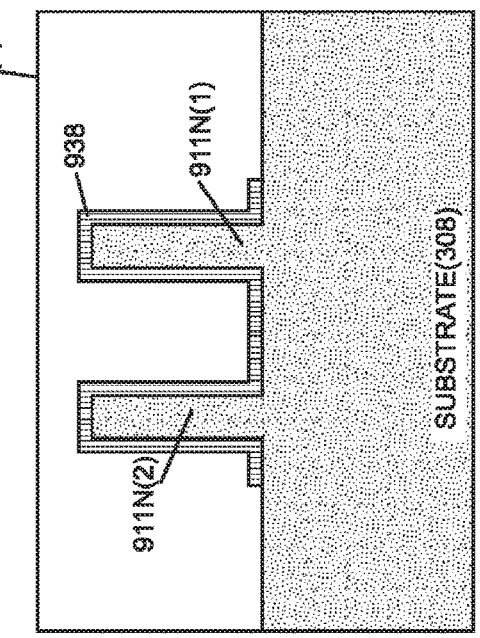
Figures 1, 11D:
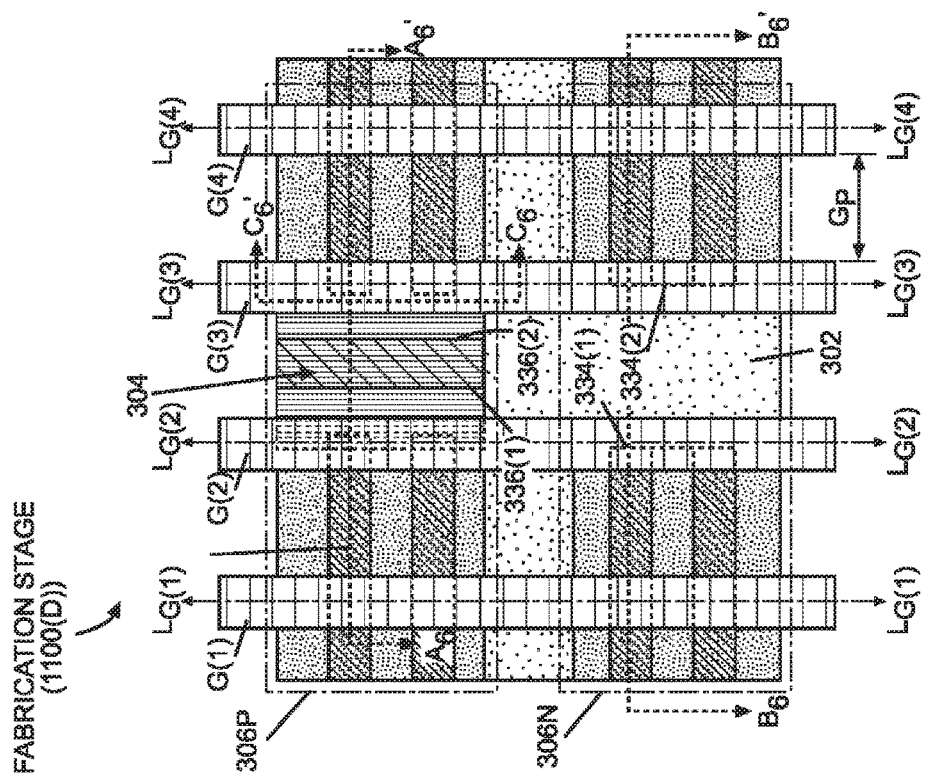

A next exemplary step in the process 1000 of fabricating the circuit 900 in FIGS. 9A-9C includes forming source regions $S_N$, $S_P$ and drain regions $D_N$, $D_P$ in the first and second diffusions regions 306(1) and 306(2) (block 1016 in FIG. 10B). For example, the source regions $S_N$, $S_P$ and the drain regions $D_N$, $D_P$ may be formed by epitaxial growth or ion implantation on portions of the N-type and P-type diffusion regions 306N and 306P. In the circuit 900 in FIG. 9A, the source and drain regions may be grown on the semiconductor channel structures 310N(1), 310N(2) and 310P(1), 310P(2). This is shown by example in the fabrication stage 1100(D) in FIGS. 11D-1-11D-3. FIG. 11D-1 is a top view of the exemplary fabrication stage 1100(D). FIGS. 11D-2 and 11D-3 are cross-sectional views taken in the respective $A_1$-$A_1'$ and $C_1$-$C_1'$ cross-sections of the substrate 308 in FIG. 11D-1.

In a next exemplary step in the process 1000 of fabricating the circuit 900 in FIGS. 9A-9C, as shown in FIGS. 11D-2 and 11D-3, a first active gate AG(1) is formed spaced apart from the first dummy gate G(2) by the gate pitch $G_P$ and above the first diffusion region 306(1) and the second diffusion region 306(2), and a second active gate AG(2) is formed spaced apart from the second dummy gate G(2) by the gate pitch $G_P$ and above the first diffusion region 306(1) and the second diffusion region 306(2) (block 1018 in FIG. 10B). The first and second active gates AG(1) and AG(2) are formed by replacing the dummy gate material in dummy gates G(1) and G(4) with a conductive material, such as a metal material. This is shown by example in the fabrication stage 1100(D) in FIGS. 11D-1-11D-3. The description of the active gates AG(1), AG(2) and dummy gates G(2), G(3) have been previously described for the circuit 300 in FIGS. 3A and 3B, and thus are not re-described here.

In the process 1000 of fabricating the circuit 900 in FIGS. 9A-9C, the ILD 320, which may be a dielectric material 322, can be deposited above the gates G(1)-G(4) and the N-type and P-type diffusion regions 306N, 306P to provide isolation as previously discussed for the circuit 300 in FIGS. 3A-3C. A top surface 324 of the ILD 320 can be planarized, such as through a chemical mechanical planarization (CMP) process. This is shown by example in the fabrication stage 1100(E) in FIGS. 11E-1 and 11E-2, which are cross-sectional views taken in the respective cross-sections $A_1$-$A_1'$ and $C_1$-$C_1'$ of the fabrication stage 1100(E), which correspond to the example in fabrication stage 1100(D) with the addition of ILD 320 formed thereon, as discussed above.

In another exemplary aspect, a circuit is provided. The circuit includes the substrate 308 comprising the top surface 314 as shown in the exemplary circuits 300, 600, 700, 800, and 900 in FIGS. 3A-3C, 6A-6C, 7A-7C, 8A-8C, and 9A-9C. The circuit includes a means for providing a first diffusion in the substrate 308, the means for providing the first diffusion comprising either a means for providing a P-type diffusion in the substrate 308 or a means for providing an N-type diffusion in the substrate 308. An example of the means for providing the first diffusion in the substrate 308 can be either the P-type diffusion region 306P or N-type diffusion region 306N in FIGS. 3A-3C, 6A-6C, 7A-7C, and 9A-9C, or the P-type diffusion region 806P or N-type diffusion region 806N in FIGS. 8A-8C. The circuit 300 also includes that the means for providing the first diffusion comprises at least one first means for providing a semiconducting channel. An example of the first means for providing the semiconducting channel can include the N-type and P-type semiconductor channels 310N(1), 310N(2) and 310P(1), 310P(2) in the circuit 300 in FIGS. 3A-3C, the N-type and P-type semiconductor channels 610N(1), 610N(2) and 610P(1), 610P(2) in the circuit 600 in FIGS. 6A-6C, the N-type and P-type semiconductor channels 710N(1), 710N(2) and 710P(1), 710P(2) in the circuit 700 in FIGS. 7A-7C, the N-type and P-type semiconductor channels 810N(1), 810N(2) and 810P(1), 810P(2) in the circuit 800 in FIGS. 8A-8C, or the N-type and P-type semiconductor channels 310N(1), 310N(2) and 310P(1), 310P(2) in the circuit 900 in FIGS. 9A-9C.

The circuit includes a means for providing a second diffusion in the substrate 308, the means for providing the second diffusion comprising either a means for providing a P-type diffusion in the substrate 308 or a means for providing an N-type diffusion in the substrate 308. An example of the means for providing the second diffusion in the substrate 308 can be either the N-type diffusion region 306N or the P-type diffusion region 306P in the circuits 300, 600, 700 in FIGS. 3A-3C, 6A-6C, 7A-7C, and 9A-9C or the N-type diffusion region 806N or P-type diffusion region 806P in the circuit 800 in FIGS. 8A-8C. The circuit also includes that the means for providing the second diffusion comprises at least one second means for providing a semiconducting channel. An example of the second means for providing the semiconducting channel can include the N-type and P-type semiconductor channels 310N(1), 310N(2) and 310P(1), 310P(2) in the circuit 300 in FIGS. 3A-3C and FIGS. 9A-9C, the N-type and P-type semiconductor channels 610N(1), 610N(2) and 610P(1), 610P(2) in the circuit 600 in FIGS. 6A-6C, the N-type and P-type semiconductor channels 710N(1), 710N(2) and 710P(1), 710P(2) in the circuit 700 in FIGS. 7A-7C, or the N-type and P-type semiconductor channels 810N(1), 810N(2) and 810P(1), 810P(2) in the circuit 800 in FIGS. 8A-8C. The circuit also includes a means for controlling conduction in at least one of the at least one first means for providing the semiconducting channel and the at least one second means for providing the semiconducting channel. An example of the means for controlling conduction in at least one of the at least one first means for providing the semiconducting channel and the at least one second means for providing the semiconducting channel can include the gates G(1), G(4) in the circuits 300, 600, 700, 800 in FIGS. 3A-3C, 6A-6C, 7A-7C, 8A-8C, and 9A-9C. The circuit can also include a means for providing a first diffusion break in the first diffusion region, an example of which includes the first DB 302 in the circuits 300, 600, 700, and 900 in FIGS. 3A-3C, 6A-6C, 7A-7C, and 9A-9C, and the first DB 802 in the circuit 800 in FIGS. 8A-8C. The means for providing the first diffusion break may be provided as a first means for providing shallow trench isolation (STI) between a first portion of the means for providing the first diffusion in the substrate and a second portion of the means for providing the first diffusion in the substrate, examples of which include the first DB 302 in the circuits 300, 600, 700, 800 and 900 in FIGS. 3A-3C, 6A-6C, 7A-7C, 8A-8C, and 9A-9C. The means for providing the first diffusion break has a first dimension BD1 in the first direction from a first side to a second side of the first means for providing the first diffusion break.

The circuit can also include a means for providing a second diffusion break in the second diffusion region, an example of which includes the second DB 304 in the circuits 300, 600, 700, and 900 in FIGS. 3A-3C, 6A-6C, 7A-7C, and 9A-9C, and the second DB 804 in the circuit 800 in FIGS. 8A-8C. The means for providing the second diffusion break may be provided as a second means for providing STI between a first portion of the means for providing the second diffusion in the substrate and a second portion of the means for providing the second diffusion in the substrate, examples of which include the second DB 304 in the circuits 300, 600, 700, 800 and 900 in FIGS. 3A-3C, 6A-6C, 7A-7C, 8A-8C, and 9A-9C. The means for providing the second diffusion break has a second dimension BD2 in the first direction from a first side to a second side of the means for providing the second diffusion break, and the second dimension BD2 of the means for providing the second diffusion break is different from the first dimension BD1 of the means for providing the first diffusion break.

Circuits employing a first DB 302 asymmetric to a second DB 304 in different types of diffusion regions to increase carrier mobility in a semiconductor device(s) formed in one type of diffusion region(s), while reducing or avoiding the degradation of carrier mobility in a semiconductor device(s) formed in the other type of diffusion region, including but not limited to the circuit 300, in FIGS. 3A-3C, circuit 600 in FIGS. 6A-6C, circuit 700 in FIGS. 7A-7C, circuit 800 in FIGS. 8A-8C, and circuit 900 in FIGS. 9A-9C, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 12:
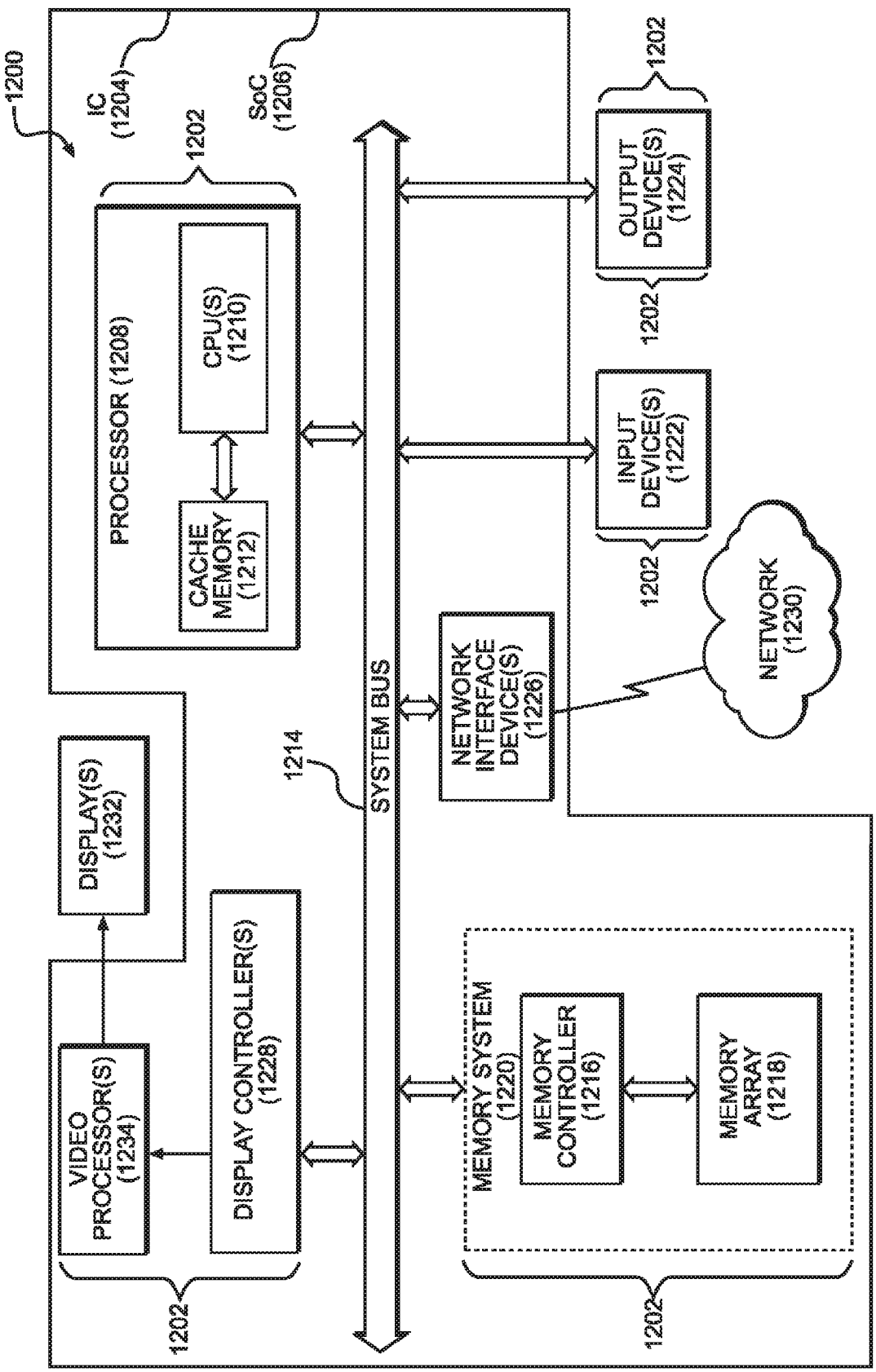
FIG. 12 is a block diagram of an exemplary processor-based system that can include a circuit employing a diffusion break having a first dimension and a diffusion break having a second dimension in different types of diffusion regions to increase carrier mobility in a semiconductor device(s) formed in one type of diffusion region(s), while reducing or avoiding the degradation of carrier mobility in a semiconductor device(s) formed in the other type of diffusion region, including but not limited to the circuits in FIGS. 3A-3C, 6A-6C, 7A-7C, 8A-8C, and 9A-9C.

In this regard, FIG. 12 illustrates an example of a processor-based system 1200 that can include circuits 1202 employing a first DB 302 asymmetric to a second DB 304 in different types of diffusion regions to increase carrier mobility in a semiconductor device(s) formed in one type of diffusion region(s), while reducing or avoiding the degradation of carrier mobility in a semiconductor device(s) formed in the other type of diffusion region, including but not limited to the circuit 300, in FIGS. 3A-3C, circuit 600 in FIGS. 6A-6C, circuit 700 in FIGS. 7A-7C, circuit 800 in FIGS. 8A-8C, and circuit 900 in FIGS. 9A-9C, and according to any aspects disclosed herein. In this example, the processor-based system 1200 may be formed as an IC 1204 in a system-on-a-chip (SoC) 1206. The processor-based system 1200 includes a processor 1208 that includes one or more central processor units (CPUs) 1210, which may also be referred to as CPU or processor cores. The processor 1208 may have cache memory 1212 coupled to the processor(s) 1208 for rapid access to temporarily stored data. As an example, the cache memory 1212 could include circuits 1202 employing a first DB 302 asymmetric to a second DB 304 in different types of diffusion regions to increase carrier mobility in a semiconductor device(s) formed in one type of diffusion region(s), while reducing or avoiding the degradation of carrier mobility in a semiconductor device(s) formed in the other type of diffusion region, including but not limited to the circuit 300, in FIGS. 3A-3C, circuit 600 in FIGS. 6A-6C, circuit 700 in FIGS. 7A-7C, circuit 800 in FIGS. 8A-8C, and circuit 900 in FIGS. 9A-9C, and according to any aspects disclosed herein. The processor 1208 is coupled to a system bus 1214 and can intercouple master and slave devices included in the processor-based system 1200. As is well known, the processor 1208 communicates with these other devices by exchanging address, control, and data information over the system bus 1214. For example, the processor 1208 can communicate bus transaction requests to a memory controller 1216 as an example of a slave device. Although not illustrated in FIG. 12, multiple system buses 1214 could be provided, wherein each system bus 1214 constitutes a different fabric.

Other master and slave devices can be connected to the system bus 1214. As illustrated in FIG. 12, these devices can include a memory system 1220 that includes the memory controller 1216 and a memory array(s) 1218, one or more input devices 1222, one or more output devices 1224, one or more network interface devices 1226, and one or more display controllers 1228, as examples. Each of the memory system 1220, the one or more input devices 1222, the one or more output devices 1224, the one or more network interface devices 1226, and the one or more display controllers 1228 can include circuits 1202 employing a first DB asymmetric to a second DB in different types of diffusion regions to increase carrier mobility in a semiconductor device(s) formed in one type of diffusion region(s), while reducing or avoiding the degradation of carrier mobility in a semiconductor device(s) formed in the other type of diffusion region, including but not limited to the circuit 300, in FIGS. 3A-3C, circuit 600 in FIGS. 6A-6C, circuit 700 in FIGS. 7A-7C, circuit 800 in FIGS. 8A-8C, and circuit 900 in FIGS. 9A-9C, and according to any aspects disclosed herein. The input device(s) 1222 can include any type of input device, including, but not limited to, input keys, switches, voice processors, etc. The output device(s) 1224 can include any type of output device, including, but not limited to, audio, video, other visual indicators, etc. The network interface device(s) 1226 can be any device configured to allow exchange of data to and from a network 1230. The network 1230 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1226 can be configured to support any type of communications protocol desired.

The processor 1208 may also be configured to access the display controller(s) 1228 over the system bus 1214 to control information sent to one or more displays 1232. The display controller(s) 1228 sends information to the display(s) 1232 to be displayed via one or more video processors 1234, which process the information to be displayed into a format suitable for the display(s) 1232. The display(s) 1232 can include any type of display, including, but not limited to, a cathode ray tube (CRT), a liquid crystal display (LCD), a plasma display, a light emitting diode (LED) display, etc. The display controller(s) 1228, display(s) 1232, and/or the video processor(s) 1234 can include circuits 1202 employing a first DB asymmetric to a second DB in different types of diffusion regions to increase carrier mobility in a semiconductor device(s) formed in one type of diffusion region(s), while reducing or avoiding the degradation of carrier mobility in a semiconductor device(s) formed in the other type of diffusion region, including but not limited to the circuit 300, in FIGS. 3A-3C, circuit 600 in FIGS. 6A-6C, circuit 700 in FIGS. 7A-7C, and circuit 800 in FIGS. 8A-8C, and according to any aspects disclosed herein.

Figure 13:
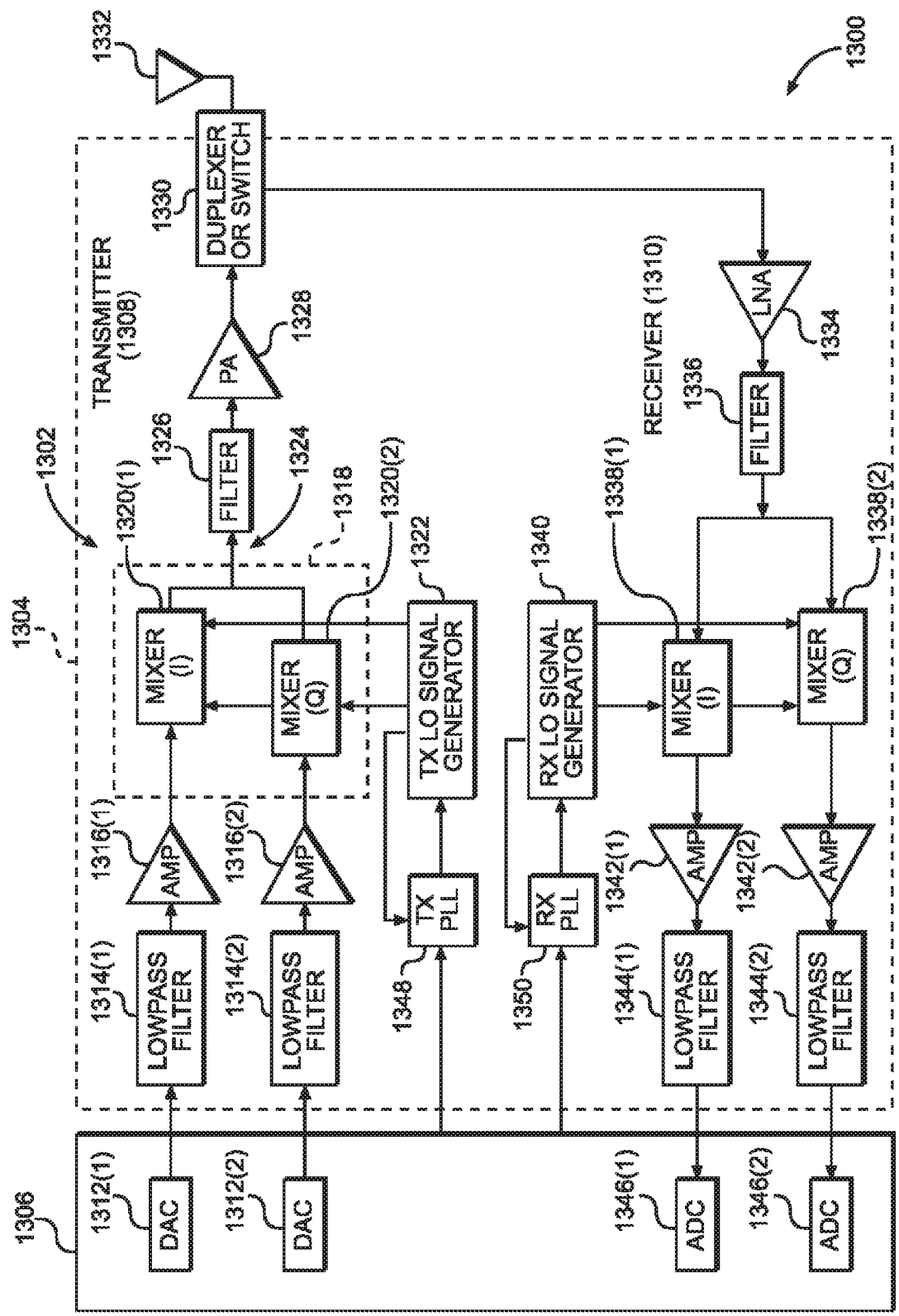
FIG. 13 is a block diagram of an exemplary wireless communications device that includes radio frequency (RF) components formed from an integrated circuit (IC), wherein any of the components therein can include a circuit employing a diffusion break having a first dimension and a diffusion break having a second dimension in different types of diffusion regions to increase carrier mobility in a semiconductor device(s) formed in one type of diffusion region(s), while reducing or avoiding the degradation of carrier mobility in a semiconductor device(s) formed in the other type of diffusion region, including but not limited to the circuits in FIGS. 3A-3C, 6A-6C, 7A-7C, 8A-8C, and 9A-9C.

FIG. 13 illustrates an exemplary wireless communications device 1300 that includes radio frequency (RF) components formed from an IC 1302, wherein any of the components therein can include circuits 1303 employing a first DB asymmetric to a second DB in different types of diffusion regions to increase carrier mobility in a semiconductor device(s) formed in one type of diffusion region(s), while reducing or avoiding the degradation of carrier mobility in a semiconductor device(s) formed in the other type of diffusion region, including but not limited to the circuit 300, in FIGS. 3A-3C, circuit 600 in FIGS. 6A-6C, circuit 700 in FIGS. 7A-7C, circuit 800 in FIGS. 8A-8C, and circuit 900 in FIGS. 9A-9C, and according to any aspects disclosed herein. The wireless communications device 1300 may include or be provided in any of the above referenced devices, as examples. As shown in FIG. 13, the wireless communications device 1300 includes a transceiver 1304 and a data processor 1306. The data processor 1306 may include a memory to store data and program codes. The transceiver 1304 includes a transmitter 1308 and a receiver 1310 that support bi-directional communications. In general, the wireless communications device 1300 may include any number of transmitters 1308 and/or receivers 1310 for any number of communication systems and frequency bands. All or a portion of the transceiver 1304 may be implemented on one or more analog ICs, RF ICs (RFICs), mixed-signal ICs, etc.

The transmitter 1308 or the receiver 1310 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1310. In the direct-conversion architecture, a signal is frequency-converted between RF and baseband in one stage. The super-heterodyne and direct-conversion architectures may use different circuit blocks and/or have different requirements. In the wireless communications device 1300 in FIG. 13, the transmitter 1308 and the receiver 1310 are implemented with the direct-conversion architecture.

In the transmit path, the data processor 1306 processes data to be transmitted and provides I and Q analog output signals to the transmitter 1308. In the exemplary wireless communications device 1300, the data processor 1306 includes digital-to-analog converters (DACs) 1312(1), 1312(2) for converting digital signals generated by the data processor 1306 into the I and Q analog output signals, e.g., I and Q output currents, for further processing.

Within the transmitter 1308, lowpass filters 1314(1), 1314(2) filter the I and Q analog output signals, respectively, to remove undesired signals caused by the prior digital-to-analog conversion. Amplifiers (AMP) 1316(1), 1316(2) amplify the signals from the lowpass filters 1314(1), 1314(2), respectively, and provide I and Q baseband signals. An upconverter 1318 upconverts the I and Q baseband signals with I and Q transmit (TX) local oscillator (LO) signals through mixers 1320(1), 1320(2) from a TX LO signal generator 1322 to provide an upconverted signal 1324. A filter 1326 filters the upconverted signal 1324 to remove undesired signals caused by the frequency upconversion as well as noise in a receive frequency band. A power amplifier (PA) 1328 amplifies the upconverted signal 1324 from the filter 1326 to obtain the desired output power level and provides a transmit RF signal. The transmit RF signal is routed through a duplexer or switch 1330 and transmitted via an antenna 1332.

In the receive path, the antenna 1332 receives signals transmitted by base stations and provides a received RF signal, which is routed through the duplexer or switch 1330 and provided to a low noise amplifier (LNA) 1334. The duplexer or switch 1330 is designed to operate with a specific receive (RX)-to-TX duplexer frequency separation, such that RX signals are isolated from TX signals. The received RF signal is amplified by the LNA 1334 and filtered by a filter 1336 to obtain a desired RF input signal. Down-conversion mixers 1338(1), 1338(2) mix the output of the filter 1336 with I and Q RX LO signals (i.e., LO_I and LO_Q) from an RX LO signal generator 1340 to generate I and Q baseband signals. The I and Q baseband signals are amplified by amplifiers (AMP) 1342(1), 1342(2) and further filtered by lowpass filters 1344(1), 1344(2) to obtain I and Q analog input signals, which are provided to the data processor 1306. In this example, the data processor 1306 includes ADCs 1346(1), 1346(2) for converting the analog input signals into digital signals to be further processed by the data processor 1306.

In the wireless communications device 1300 of FIG. 13, the TX LO signal generator 1322 generates the I and Q TX LO signals used for frequency upconversion, while the RX LO signal generator 1340 generates the I and Q RX LO signals used for frequency downconversion. Each LO signal is a periodic signal with a particular fundamental frequency. A TX phase-locked loop (PLL) circuit 1348 receives timing information from the data processor 1306 and generates a control signal used to adjust the frequency and/or phase of the TX LO signals from the TX LO signal generator 1322. Similarly, an RX PLL circuit 1350 receives timing information from the data processor 1306 and generates a control signal used to adjust the frequency and/or phase of the RX LO signals from the RX LO signal generator 1340.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. A circuit, comprising:
   a substrate comprising a top surface;
   a first diffusion region comprising either an N-type diffusion region or a P-type diffusion region disposed in the substrate, the first diffusion region comprising at least one first semiconductor channel each having a first longitudinal axis in a first direction;
   a second diffusion region comprising either a P-type diffusion region or an N-type diffusion region opposite of the diffusion type of the first diffusion region, the second diffusion region disposed in the substrate and comprising at least one second semiconductor channel each having a second longitudinal axis parallel to the first longitudinal axis;
   a first dummy gate extending along a third longitudinal axis in a second direction orthogonal to the first longitudinal axis, the first dummy gate disposed above the first diffusion region and the second diffusion region;
   a second dummy gate extending along a fourth longitudinal axis parallel to the third longitudinal axis, the second dummy gate disposed above the first diffusion region and the second diffusion region, the second dummy gate adjacent to the first dummy gate by a gate pitch;
   a first diffusion break in the first diffusion region between the first dummy gate and the second dummy gate, the first diffusion break having a first dimension in the first direction from a first side to a second side of the first diffusion break; and
   a second diffusion break in the second diffusion region between the first dummy gate and the second dummy gate, the second diffusion break having a second dimension in the first direction from a first side to a second side of the second diffusion break, the second dimension different in magnitude from the first dimension;
   wherein:
      the first diffusion break comprises a shallow trench isolation (STI) structure configured to exert a first stress in the first direction on at least a portion of the at least one first semiconductor channel in the first diffusion region;
      the second diffusion break comprises an STI structure configured to exert a second stress in the first direction on at least a portion of the at least one second semiconductor channel in the second diffusion region; and
      the first stress has a greater magnitude than the second stress.

2. The circuit of claim 1, wherein:
the first dimension of the first diffusion break is in the first direction of the first longitudinal axis, and the second dimension of the second diffusion break is in the first direction of the second longitudinal axis.

3. The circuit of claim 1, wherein:
the first dimension of the first diffusion break is a width dimension of the first diffusion break, and the second dimension of the second diffusion break is a width dimension of the second diffusion break.

4. The circuit of claim 1, wherein:
the first dimension of the first diffusion break is greater in magnitude than the second dimension of the second diffusion break.

5. The circuit of claim 4, wherein:
a magnitude of the second dimension of the second diffusion break is in a range from 50% to 85% of a magnitude of the first dimension of the first diffusion break.

6. The circuit of claim 1, wherein:
a magnitude of the first dimension of the first diffusion break is in a range of 40 nanometers (nm) to 100 nm, and a magnitude of the second dimension of the second diffusion break is in a range of 20 nm to 85 nm.

7. The circuit of claim 1, wherein:
a magnitude of the first dimension of the first diffusion break and a magnitude of the second dimension of the second diffusion break each depend on the gate pitch.

8. The circuit of claim 7, wherein:
the magnitude of the first dimension of the first diffusion break is in a range of 90% to 110% of the gate pitch and the magnitude of the second dimension of the second diffusion break is less than or equal to 50% of the gate pitch.

9. The circuit of claim 7, wherein:
the magnitude of the second dimension of the second diffusion break is in the range of 50% to 85% of the gate pitch.

10. The circuit of claim 1, wherein:
the first side of the first diffusion break is parallel to the third longitudinal axis and under the first dummy gate, and the second side of the first diffusion break is parallel to the fourth longitudinal axis and under the second dummy gate; and
the first and second sides of the second diffusion break are parallel to the third and fourth longitudinal axes, respectively, and between the first and second dummy gates.

11. The circuit of claim 1, wherein:
the first diffusion region comprises a first N-type diffusion region;
the at least one first semiconductor channel comprises at least one first N-type semiconductor channel structure;
the second diffusion region comprises a first P-type diffusion region; and
the at least one second semiconductor channel comprises at least one second P-type semiconductor channel structure.

12. The circuit of claim 1, wherein:
the first diffusion region comprises a first P-type diffusion region;
the at least one first semiconductor channel comprises at least one first P-type semiconductor channel structure;
the second diffusion region comprises a first N-type diffusion region; and
the at least one second semiconductor channel comprises at least one second N-type semiconductor channel structure.

13. The circuit of claim 1, further comprising:
an insulator disposed on a top surface of the second diffusion break to cover the second diffusion break and at least a portion of the second diffusion region on each of the first side and the second side of the second diffusion break.

14. The circuit of claim 13, wherein:
the insulator comprises a first edge under and parallel to the first dummy gate and a second edge under and parallel to the second dummy gate; and
the first and second sides of the second diffusion break are under the first dummy gate and the second dummy gate, respectively.

15. The circuit of claim 14, wherein:
the at least one second semiconductor channel further comprises side surfaces; and
the insulator is disposed on the side surfaces of the at least one second semiconductor channel.

16. The circuit of claim 1, further comprising:
a first Field-Effect Transistor (FET) in the first diffusion region, the first FET comprising:
a first gate;
a first semiconductor channel among the at least one first semiconductor channel;
a first source in a first end portion of the first semiconductor channel; and
a first drain in a second end portion of the first semiconductor channel; and
a second FET in the second diffusion region, the second FET comprising:
a second gate;
a second semiconductor channel among the at least one second semiconductor channel;
a second source in a first end portion of the second semiconductor channel; and
a second drain in a second end portion of the second semiconductor channel.

17. The circuit of claim 16, wherein:
the first FET comprises a first FinFET, wherein:
the first semiconductor channel extends above the top surface of the substrate; and
the first gate is disposed around at least a portion of the first semiconductor channel; and
the second FET comprises a second FinFET, wherein:
the second semiconductor channel extends above the top surface of the substrate; and
the second gate is disposed around at least a portion of the second semiconductor channel.

18. The circuit of claim 16, wherein:
the first FET comprises a first gate-all-around (GAA) FET, wherein:
the first semiconductor channel extends above the top surface of the substrate; and
the first gate is disposed completely around the first semiconductor channel; and
the second FET comprises a second GAA FET, wherein:
the second semiconductor channel extends above the top surface of the substrate; and
the second gate is disposed completely around the second semiconductor channel.

19. The circuit of claim 16, wherein:
the first FET comprises a first planar FET, wherein:
the first semiconductor channel is disposed in the substrate below the top surface of the substrate; and the first gate is disposed above the top surface of the substrate above the first semiconductor channel; and the second FET comprises a second planar FET, wherein:
the second semiconductor channel is disposed in the substrate below the top surface of the substrate; and
the second gate is disposed above the top surface of the substrate above the second semiconductor channel.

20. The circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server, a computer; a portable computer; a mobile computing device; a wearable computing device; a desktop computer; a personal digital assistant (PDA); a monitor; a computer monitor a television; a tuner; a radio; a satellite radio; a music player a digital music player a portable music player a digital video player; a video player; a digital video disc (DVD) player a portable digital video player an automobile; a vehicle component; avionics systems; a drone; and a multicopter.

21. A circuit, comprising:
a substrate comprising a top surface;
a means for providing a first diffusion in the substrate, the means for providing the first diffusion comprising either a means for providing a P-type diffusion in the substrate or a means for providing an N-type diffusion in the substrate;
the means for providing the first diffusion comprising at least one first means for providing a semiconducting channel;
a means for providing a second diffusion in the substrate, the means for providing the second diffusion comprising either a means for providing a P-type diffusion in the substrate or a means for providing an N-type diffusion in the substrate;
the means for providing the second diffusion comprising at least one second means for providing a semiconducting channel;
a means for controlling conduction in at least one of the at least one first means for providing a semiconducting channel, and the at least one second means for providing a semiconducting channel;
a means for providing a first diffusion break in the means for providing the first diffusion wherein:
the means for providing the first diffusion break is provided between a first portion of the means for providing the first diffusion in the substrate and a second portion of the means for providing the first diffusion in the substrate;
the means for providing the first diffusion break having a first dimension in a first direction from a first side to a second side of the means for providing the first diffusion break; and
a means for providing a second diffusion break in the means for providing the second diffusion wherein:
the means for providing the second diffusion break is provided between a first portion of the means for providing the second diffusion in the substrate and a second portion of the means for providing the second diffusion in the substrate; and
the means for providing the second diffusion break having a second dimension in the first direction from a first side to a second side of the second means for providing the diffusion break, the second dimension different from the first dimension;

wherein:
the means for providing the first diffusion break comprises a means for providing a first shallow trench isolation (STI) structure configured to exert a first stress in the first direction on at least a portion of the at least one first means for providing a semiconducting channel in the means for providing the first diffusion;
the means for providing the second diffusion break comprises a means for providing a second STI structure configured to exert a second stress in the first direction on at least a portion of the at least one second means for providing a semiconducting channel in the means for providing the second diffusion; and
the first stress has a greater magnitude than the second stress.

22. A method of fabricating a circuit, comprising:
forming a substrate, the substrate comprising a top surface;
forming a first diffusion region having a first longitudinal axis in a first direction in the substrate, the first diffusion region comprising either an N-type diffusion region or a P-type diffusion region in the substrate;
forming a second diffusion region separated by a non-diffusion region from the first diffusion region and having a second longitudinal axis parallel to the first longitudinal axis, the second diffusion region comprising either a P-type diffusion region or an N-type diffusion region opposite of the diffusion type of the first diffusion region in the substrate;
forming a first diffusion break in the substrate in the first diffusion region, the first diffusion break having a first dimension in the first direction from a first side to a second side of the first diffusion break;
forming a second diffusion break in the substrate in the second diffusion region, the second diffusion break having a second dimension in the first direction from a first side to a second side of the second diffusion break, the second dimension different from the first dimension;
forming a plurality of dummy gates each extending along longitudinal axes parallel to each other and orthogonal to the first and second longitudinal axes above the first diffusion region and the second diffusion region, each of the plurality of dummy gates spaced apart from each other by a gate pitch, the plurality of dummy gates including a first dummy gate adjacent to the first sides of the first and second diffusion breaks and a second dummy gate adjacent to the second sides of the first and second diffusion breaks;
forming source/drain regions in the first and second diffusion regions; and
forming a first active gate spaced apart from the first dummy gate by the gate pitch and a second active gate spaced apart from the second dummy gate by the gate pitch, the first and second active gates formed above the first diffusion region and the second diffusion region;
wherein:
forming the first diffusion break comprises forming a first shallow trench isolation (STI) structure configured to exert a first stress in the first direction on at least a portion of at least one first semiconductor channel in the first diffusion region; and
forming the second diffusion break comprises forming a second STI structure configured to exert a second stress, having a smaller magnitude than the first stress, in the first direction on at least a portion of at least one second semiconductor channel in the second diffusion region.

23. The method of claim 22, wherein:
forming the first diffusion break in the substrate comprises forming a first insulating material in a first trench in the first diffusion region; and
forming the second diffusion break in the substrate comprises forming the first insulating material in a second trench in the second diffusion region.

24. The method of claim 22, further comprising forming an insulator on a top surface of the second diffusion break to cover the second diffusion break from the first side to the second side of the second diffusion break, wherein the first dummy gate covers a first edge of the insulator and the second dummy gate covers a second edge of the insulator.

25. The method of claim 22, wherein:
the second dimension of the second diffusion break has a magnitude in a range of 50% to 85% of a magnitude of the first dimension of the first diffusion break.

26. The method of claim 22, wherein:
a magnitude of the first dimension of the first diffusion break is in a range of 40 nanometers (nm) to 100 nm, and a magnitude of the second dimension of the second diffusion break is in a range of 20 nm to 85 nm.

27. The method of claim 22, wherein:
a magnitude of the first dimension of the first diffusion break and a magnitude of the second dimension of the second diffusion break each depend on the gate pitch.

28. The method of claim 22, wherein:
the magnitude of the first dimension of the first diffusion break is in a range of 90% to 110% of the gate pitch and
the magnitude of the second dimension of the second diffusion break is less than or equal to 50% of the gate pitch.

29. The method of claim 27, wherein:
the magnitude of the second dimension of the second diffusion break is in a range from 50% to 85% of the gate pitch.

* * * * *